United States Patent
Hirose et al.

(10) Patent No.: US 9,053,927 B2
(45) Date of Patent: *Jun. 9, 2015

(54) METHOD OF MANUFACTURING SEMICONDUCTOR DEVICE AND METHOD OF PROCESSING SUBSTRATE

(71) Applicant: Hitachi Kokusai Electric Inc., Tokyo (JP)

(72) Inventors: Yoshiro Hirose, Toyama (JP); Atsushi Sano, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/708,976

(22) Filed: Dec. 8, 2012

(65) Prior Publication Data

US 2013/0149874 A1 Jun. 13, 2013

(30) Foreign Application Priority Data

Dec. 9, 2011 (JP) .................................. 2011-270724
Oct. 23, 2012 (JP) .................................. 2012-233851

(51) Int. Cl.
| | | |
|---|---|---|
| *H01L 21/31* | (2006.01) | |
| *H01L 21/02* | (2006.01) | |
| *C23C 16/30* | (2006.01) | |
| *C23C 16/455* | (2006.01) | |

(52) U.S. Cl.
CPC .... *H01L 21/02271* (2013.01); *H01L 21/02126* (2013.01); *H01L 21/0214* (2013.01); *H01L 21/0217* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/02211* (2013.01); *H01L 21/0228* (2013.01); *C23C 16/30* (2013.01); *C23C 16/45531* (2013.01); *C23C 16/45546* (2013.01)

(58) Field of Classification Search
None
See application file for complete search history.

(56) References Cited

U.S. PATENT DOCUMENTS

| | | |
|---|---|---|
| 7,638,170 B2 | 12/2009 | Li |
| 2004/0186375 A1 | 9/2004 | Vavrek et al. |
| 2010/0105192 A1 | 4/2010 | Akae et al. |

(Continued)

FOREIGN PATENT DOCUMENTS

| | | |
|---|---|---|
| JP | 2004-283587 | 10/2004 |
| JP | 2006-24668 | 1/2006 |
| JP | 2010-153776 | 7/2010 |

(Continued)

*Primary Examiner* — Asok K Sarkar
(74) *Attorney, Agent, or Firm* — Edell, Shapiro & Finnan LLC

(57) ABSTRACT

A method of manufacturing a semiconductor device is provided. The method includes: forming a thin film containing a predetermined element on a substrate by repeating a cycle, the cycle including: forming a first layer containing the predetermined element, nitrogen and carbon by alternately performing supplying a source gas containing the predetermined element and a halogen element to the substrate and supplying a first reactive gas containing three elements including the carbon, the nitrogen and hydrogen and having a composition wherein a number of carbon atoms is greater than that of nitrogen atoms to the substrate a predetermined number of times; forming a second layer by supplying a second reactive gas different from the source gas and the first reactive gas to the substrate to modify the first layer; and modifying a surface of the second layer by supplying a hydrogen-containing gas to the substrate.

20 Claims, 27 Drawing Sheets

(56) References Cited

U.S. PATENT DOCUMENTS

2012/0009802 A1* 1/2012 LaVoie et al. ............. 438/783
2013/0196516 A1* 8/2013 Lavoie et al. ............. 438/776

FOREIGN PATENT DOCUMENTS

WO    2011/123792  A2    10/2011
WO    2011/125395  A1    10/2011

* cited by examiner

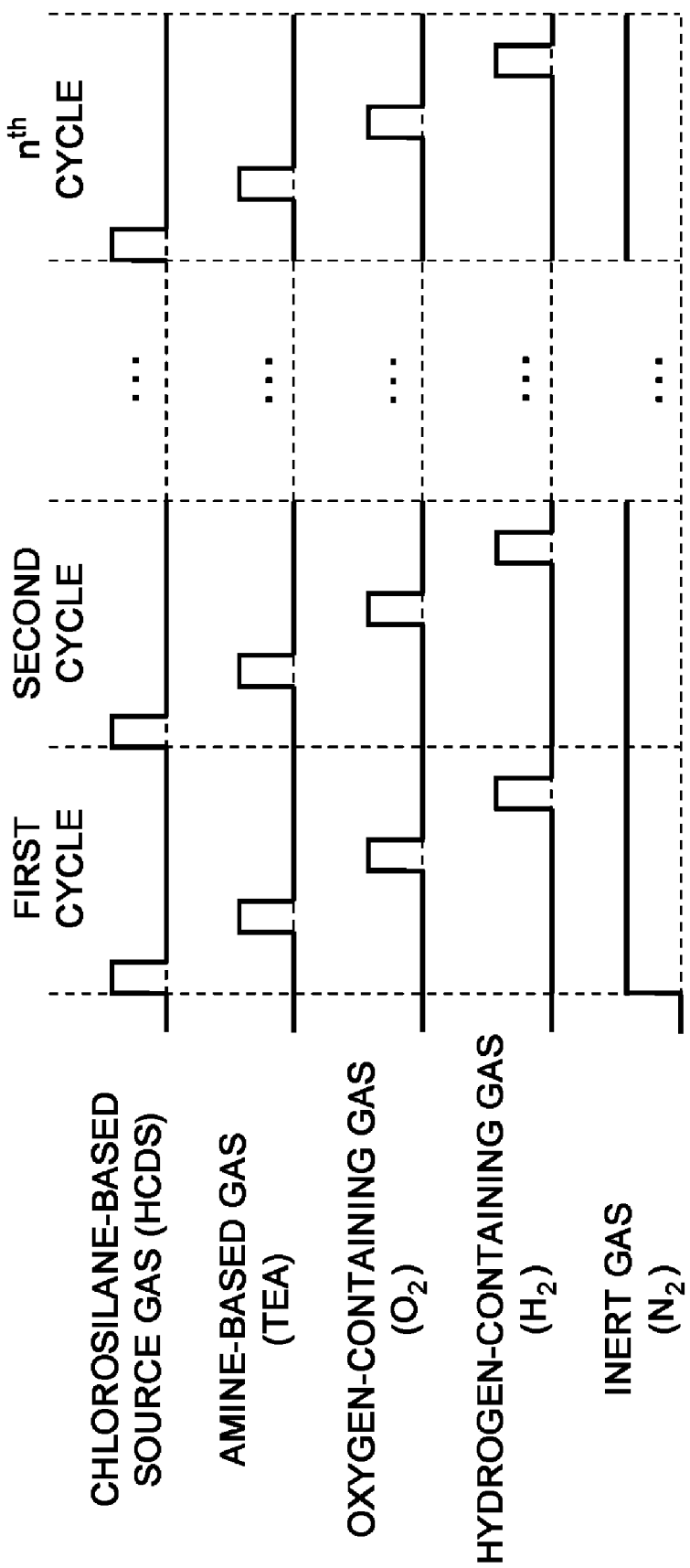

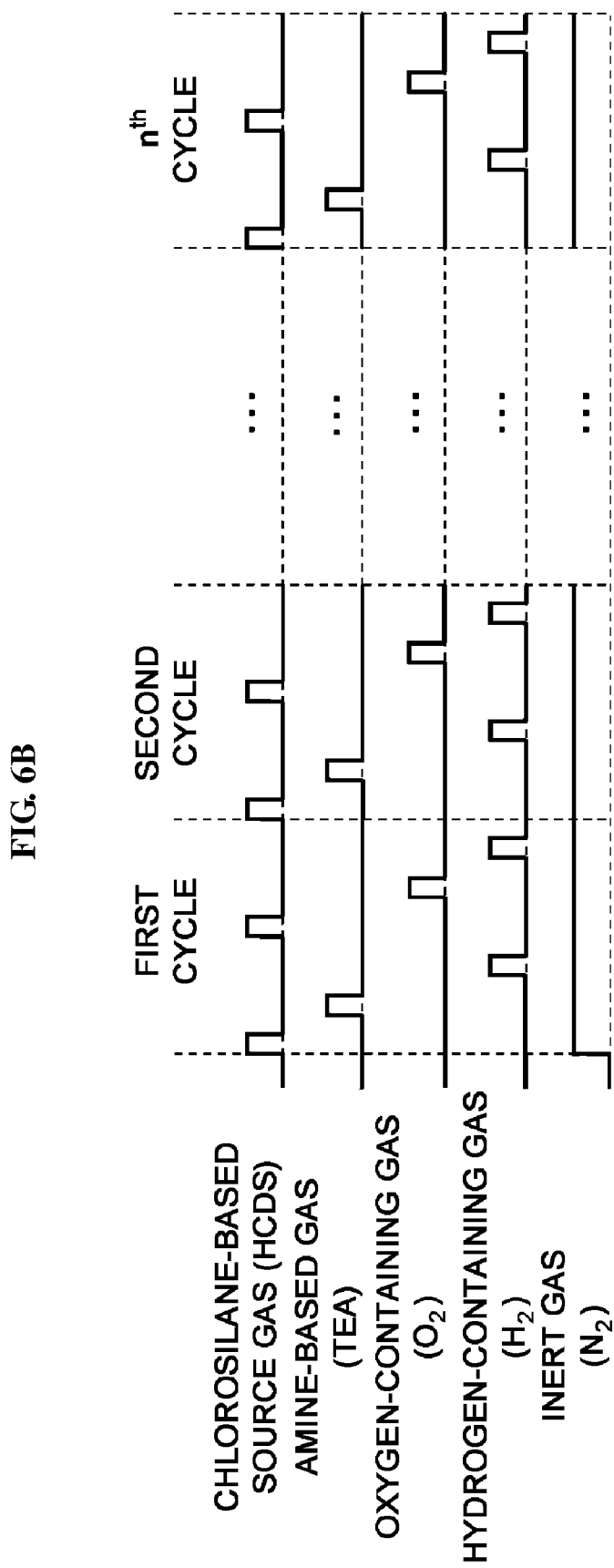

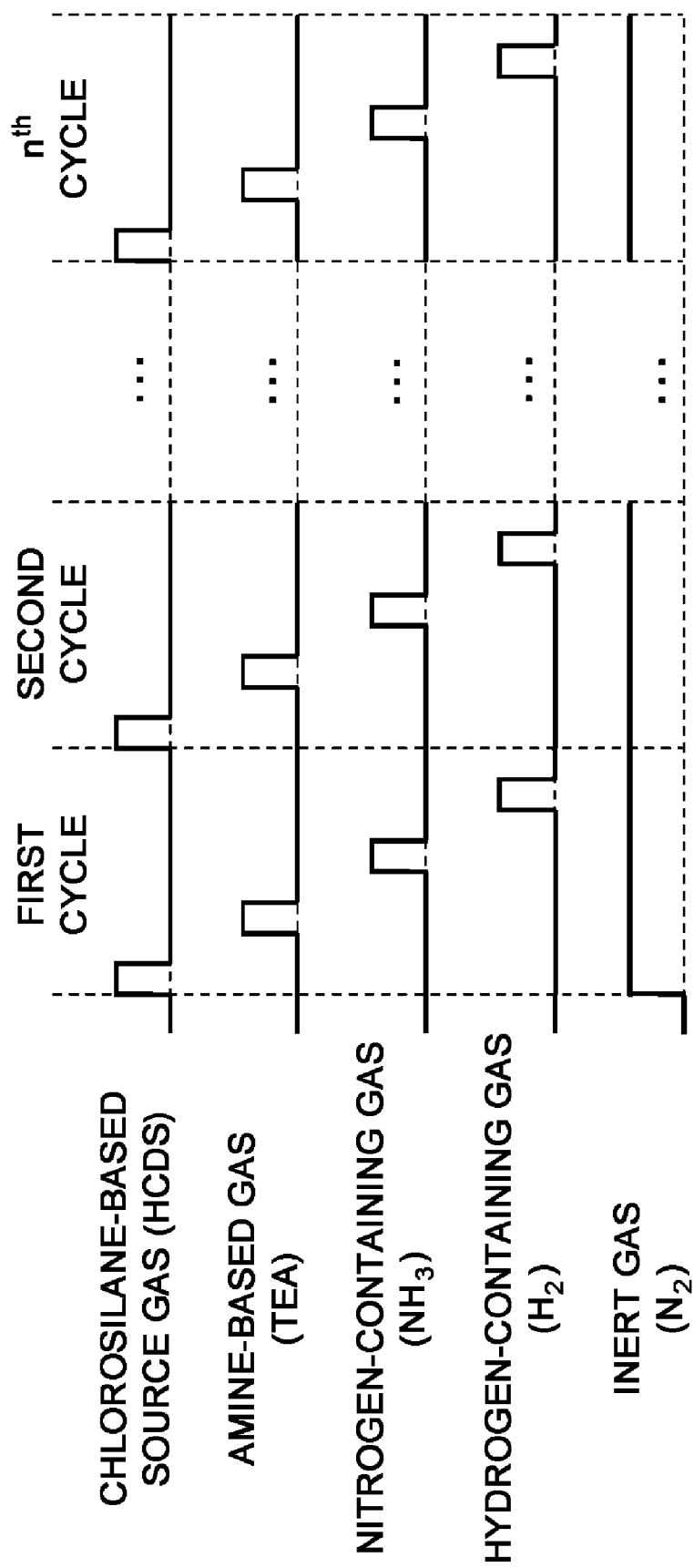

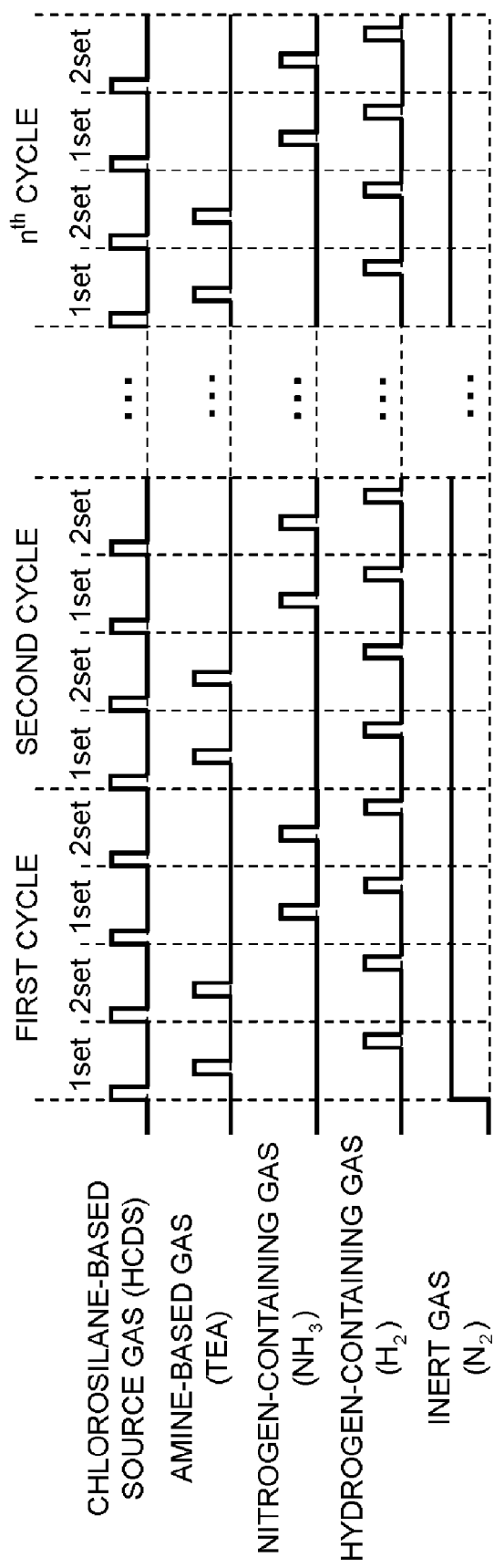

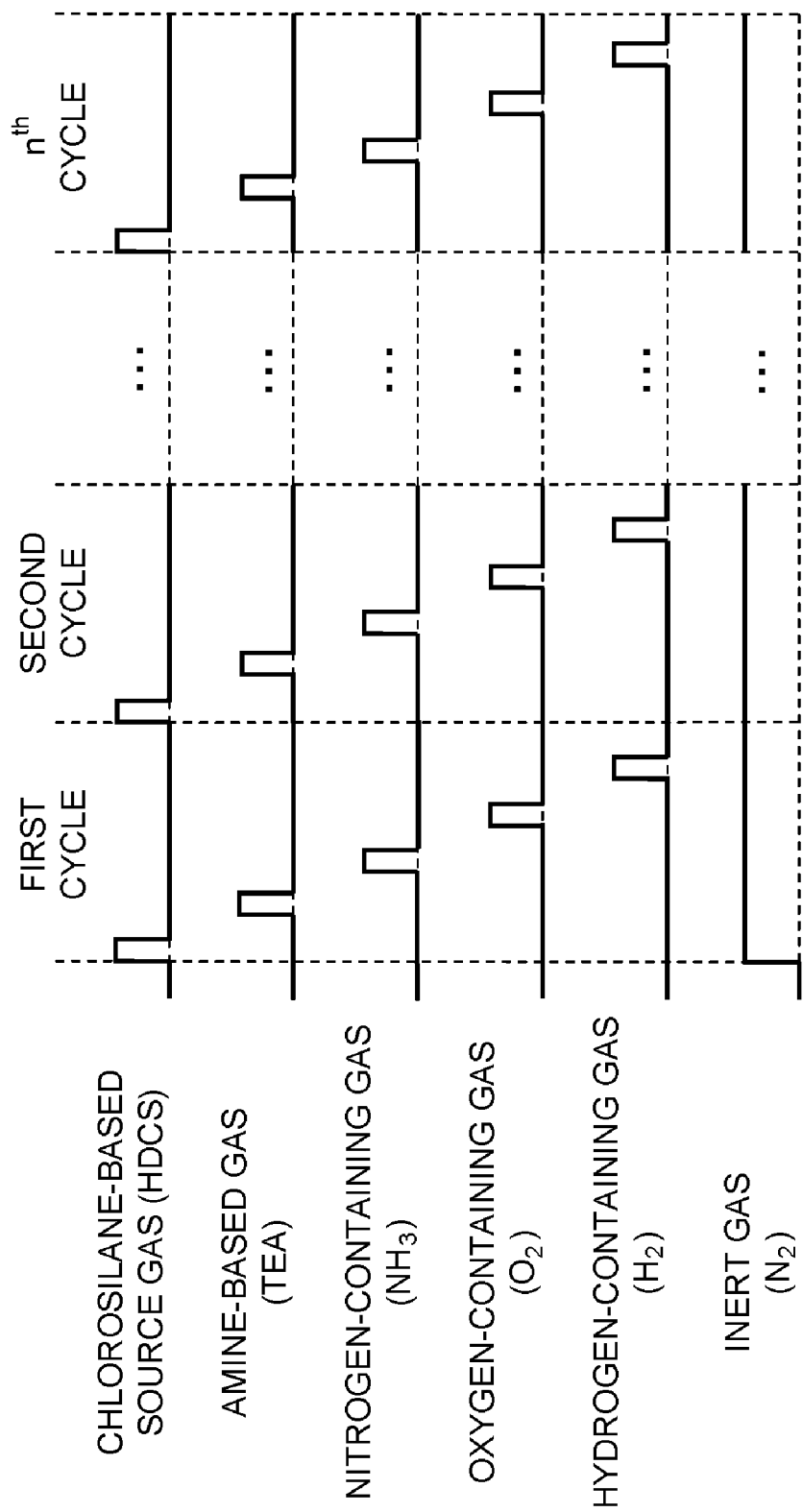

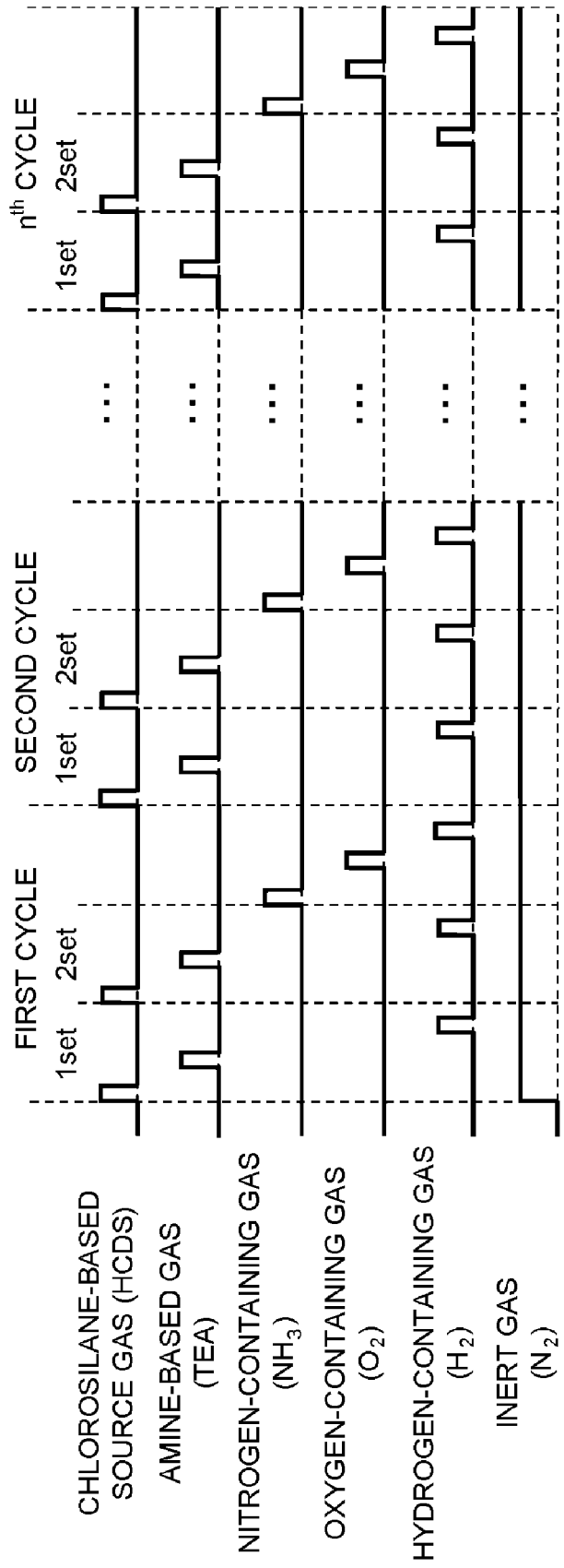

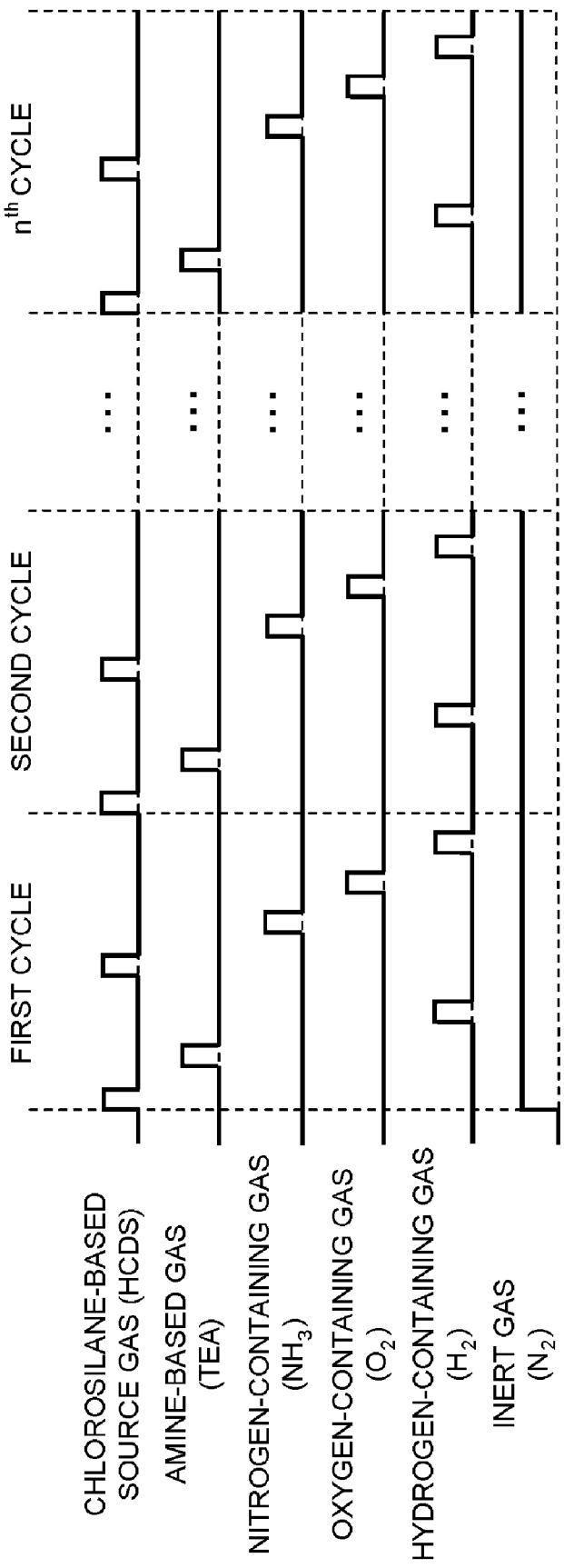

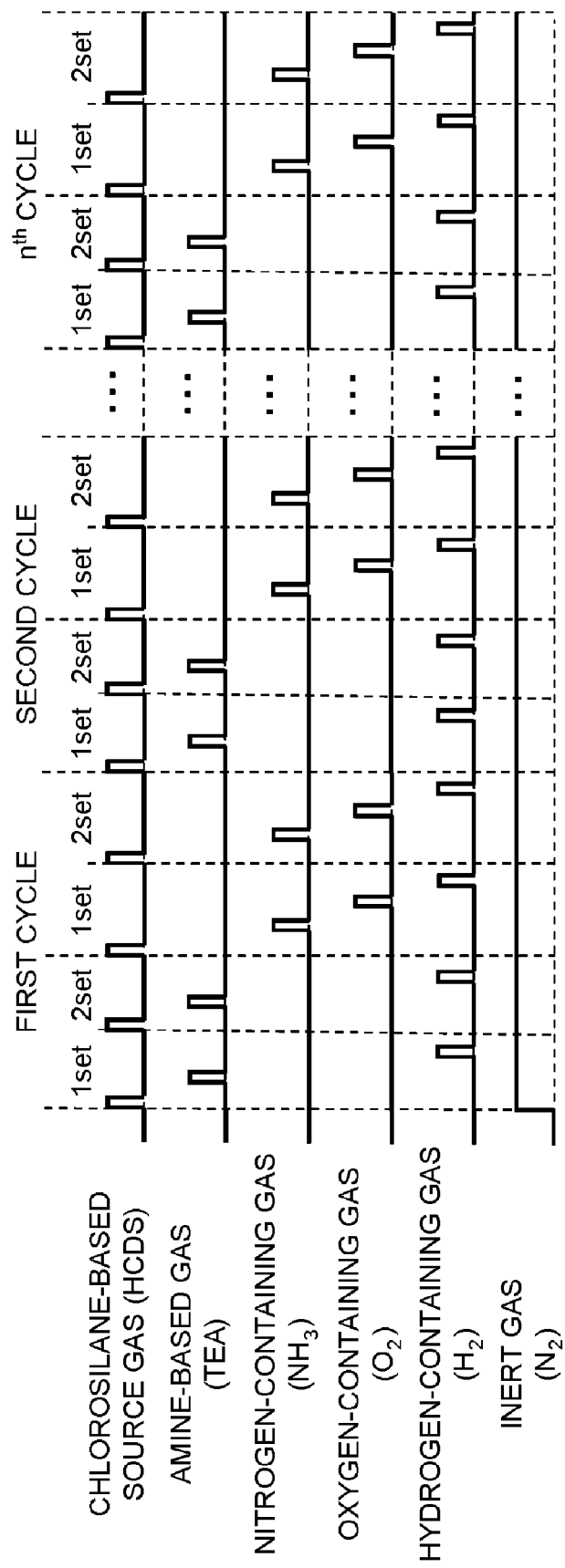

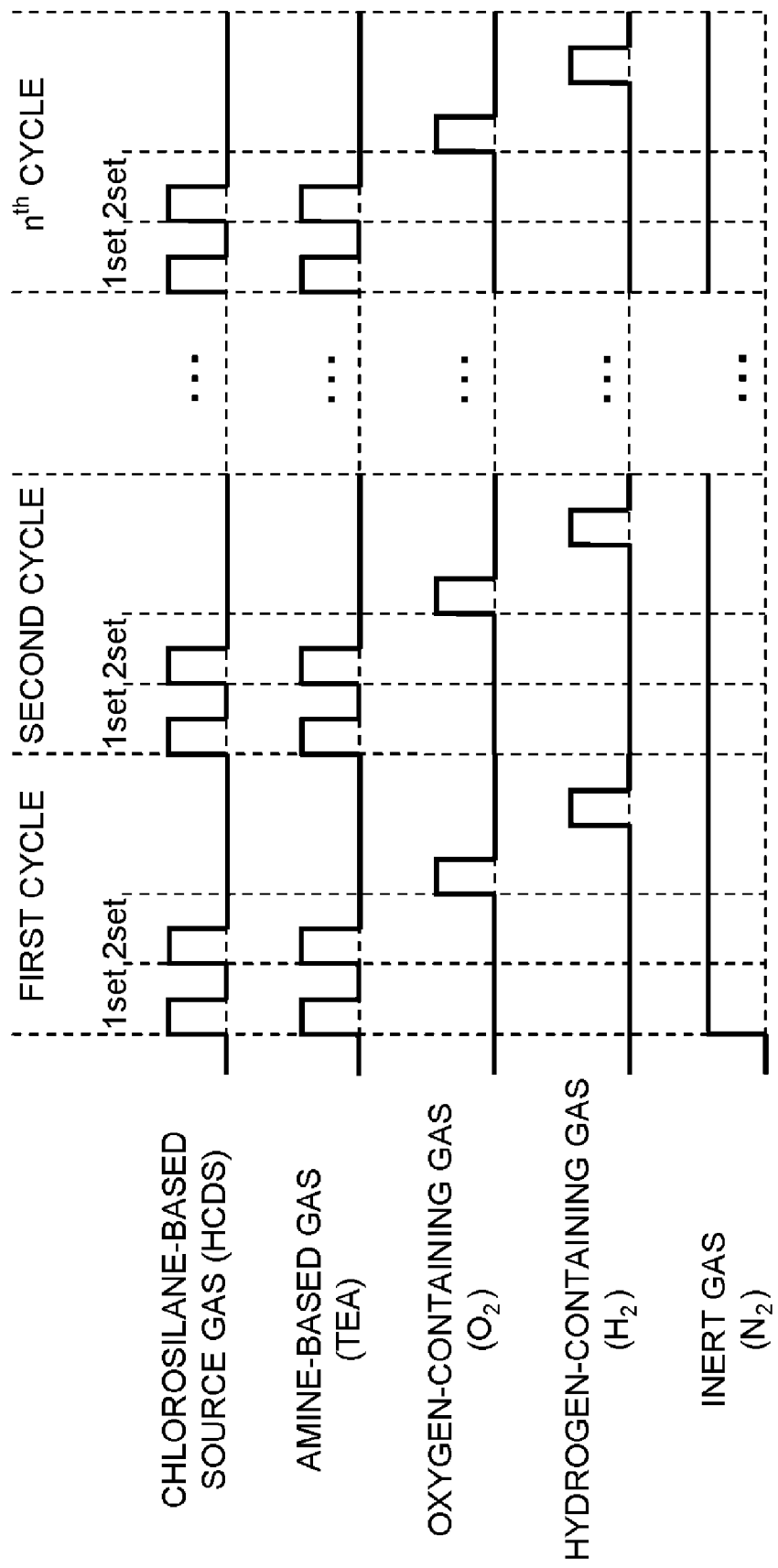

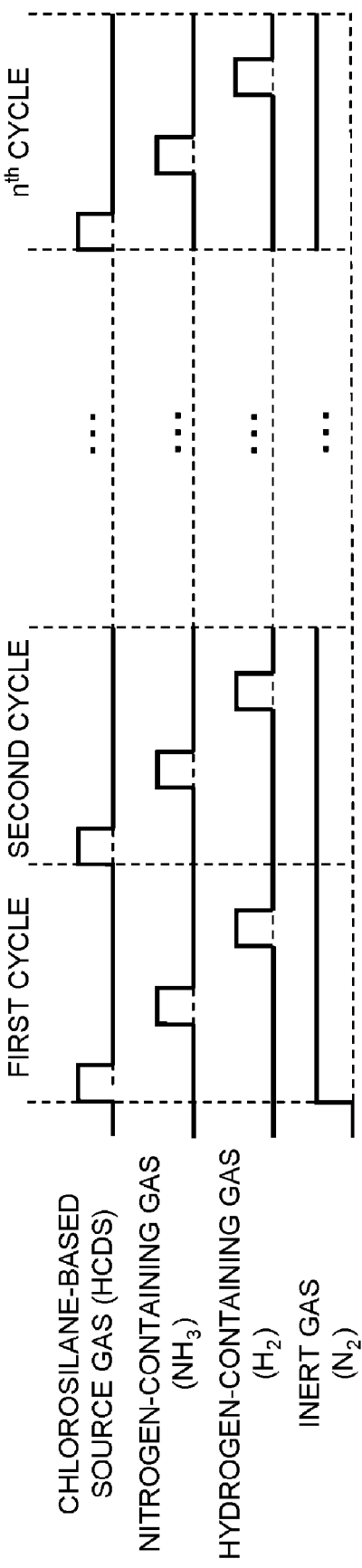

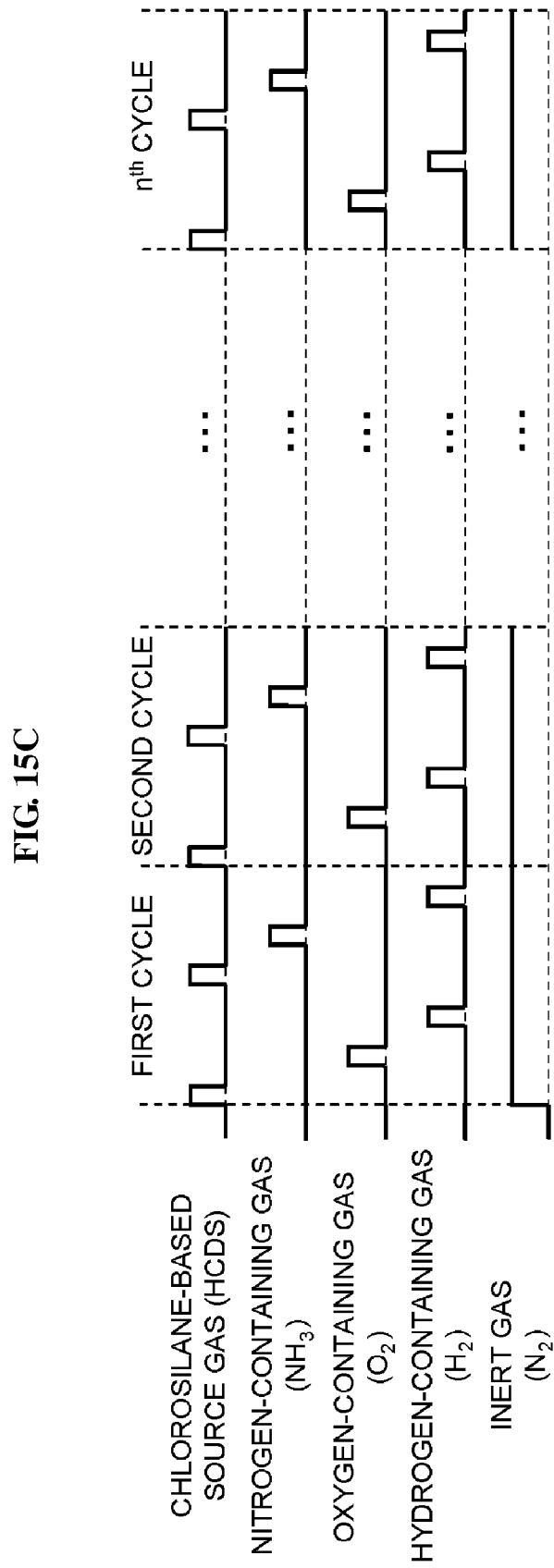

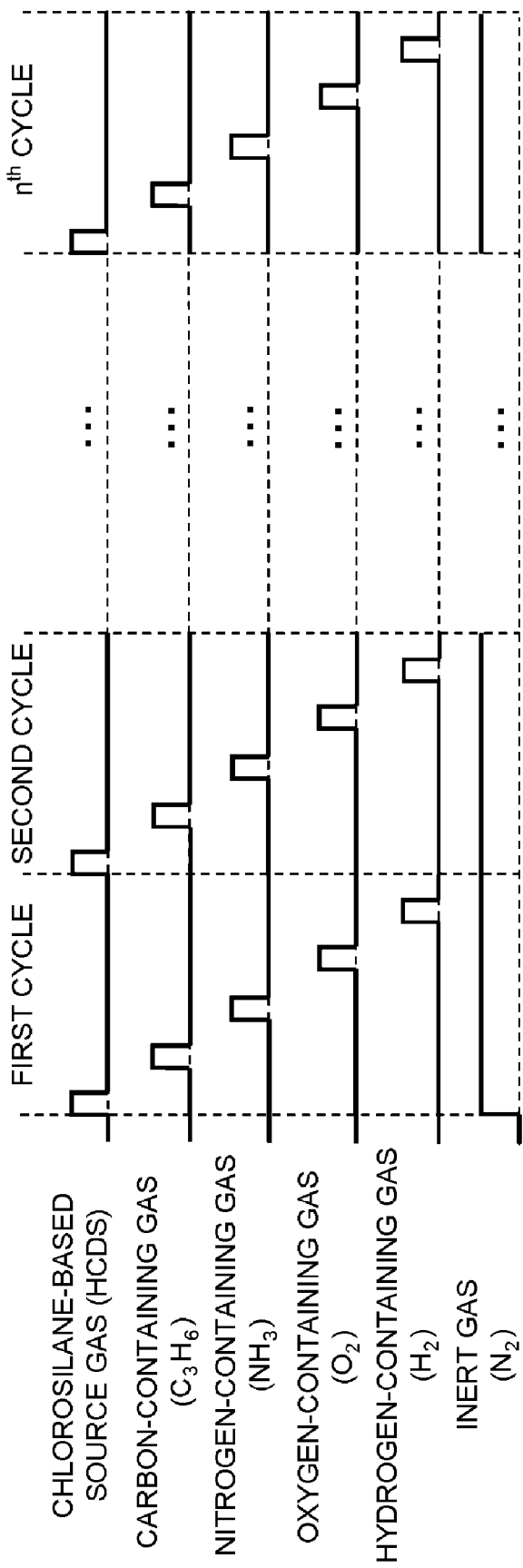

US 9,053,927 B2

METHOD OF MANUFACTURING SEMICONDUCTOR DEVICE AND METHOD OF PROCESSING SUBSTRATE

CROSS REFERENCE TO RELATED APPLICATIONS

This application claims foreign priority under 35 U.S.C. §119(a)-(d) to Japanese Patent Application No. 2011-270724 filed on Dec. 9, 2011, and Japanese Patent Application No. 2012-233851 filed on Oct. 23, 2012, the entire contents of each of which are hereby incorporated by reference.

FIELD OF THE INVENTION

The present invention relates to a method of manufacturing a semiconductor device that includes a process of forming a thin film on a substrate, a method of processing a substrate, a substrate processing apparatus, and a non-transitory computer-readable recording medium.

BACKGROUND

In manufacturing processes of a semiconductor device, there is a process of forming a silicon-based insulating film such as a silicon oxide film ($SiO_2$) and a silicon nitride film ($Si_3N_4$), that is, an insulating film that contains silicon as a predetermined element, on a substrate such as a silicon wafer. The silicon oxide film has excellent insulating properties, low dielectric properties or the like, and thus is widely used as an insulating film and an interlayer film. Furthermore, the silicon nitride film has excellent insulating properties, anticorrosion properties, dielectric properties, film stress control properties or the like, and thus is widely used as an insulating film, a mask film, an electric charge storage film, a stress control film or the like. Furthermore, a technique of adding carbon (C) to the insulting films is also known, and thereby etching tolerance of the insulating film can be improved.

SUMMARY

However, although etching tolerance of an insulating film by addition of carbon to the insulating film can be improved, in some cases, a dielectric constant increases and leak tolerance deteriorates. That is, each insulating film has good points and bad points, and in the related art, there has been no thin film that includes characteristics of a low dielectric constant, high etching tolerance, and high leak tolerance.

Thus, the present invention is directed to provide a method of manufacturing a semiconductor device capable of forming a thin film that includes a low dielectric constant, high etching tolerance, and high leak tolerance, a method of processing a substrate, a substrate processing apparatus and a non-transitory computer-readable recording medium.

According to one aspect of the present invention, there is provided a method of manufacturing a semiconductor device, including:
forming a thin film containing a predetermined element on a substrate by repeating a cycle, the cycle including:
forming a first layer containing the predetermined element, nitrogen and carbon by alternately performing supplying a source gas containing the predetermined element and a halogen element to the substrate and supplying a first reactive gas containing three elements including the carbon, the nitrogen and hydrogen and having a composition wherein a number of carbon atoms is greater than that of nitrogen atoms to the substrate a predetermined number of times;
forming a second layer by supplying a second reactive gas different from the source gas and the first reactive gas to the substrate to modify the first layer; and
modifying a surface of the second layer by supplying a hydrogen-containing gas to the substrate.

According to another aspect of the present invention, there is provided a method of processing a substrate, including:
forming a thin film containing a predetermined element on a substrate by repeating a cycle, the cycle including:
forming a first layer containing the predetermined element, nitrogen and carbon by alternately performing supplying a source gas containing the predetermined element and a halogen element to the substrate and supplying a first reactive gas containing three elements including the carbon, the nitrogen and hydrogen and having a composition wherein a number of carbon atoms is greater than that of nitrogen atoms to the substrate a predetermined number of times;
forming a second layer by supplying a second reactive gas different from the source gas and the first reactive gas to the substrate to modify the first layer; and
modifying a surface of the second layer by supplying a hydrogen-containing gas to the substrate.

According to still another aspect of the present invention, there is provided a substrate processing apparatus including:
a process chamber configured to accommodate a substrate;
a source gas supply system configured to supply a source gas containing a predetermined element and a halogen element into the process chamber;
a first reactive gas supply system configured to supply a first reactive gas containing three elements including carbon, nitrogen and hydrogen and having a composition wherein a number of carbon atoms is greater than that of nitrogen atoms into the process chamber;
a second reactive gas supply system configured to supply a second reactive gas different from the source gas and the first reactive gas into the process chamber;
a hydrogen-containing gas supply system configured to supply a hydrogen-containing gas into the process chamber; and
a control unit configured to control the source gas supply system, the first reactive gas supply system, the second reactive gas supply system and the hydrogen-containing gas supply system so as to form a thin film containing the predetermined element on the substrate, by repeating a cycle, the cycle including: forming a first layer containing the predetermined element, the nitrogen and the carbon by alternately performing supplying the source gas to the substrate in the process chamber and supplying the first reactive gas to the substrate in the process chamber a predetermined number of times; forming a second layer by supplying the second reactive gas to the substrate in the process chamber to modify the first layer; and modifying a surface of the second layer by supplying the hydrogen-containing gas to the substrate in the process chamber.

According to yet another aspect of the present invention, there is provided a non-transitory computer-readable recording medium storing a program that causes a computer to perform a process of forming a thin film containing a predetermined element on a substrate in a process chamber by repeating a cycle, the cycle including:
a process of forming a first layer containing the predetermined element, nitrogen and carbon by alternately performing supplying a source gas containing the predetermined element and a halogen element to the substrate in the process chamber and supplying a first reactive gas containing three elements including the carbon, the nitrogen and hydrogen and having a composition wherein a number of carbon atoms is greater than that of nitrogen atoms to the substrate in the process chamber a predetermined number of times;

a process of forming a second layer by supplying a second reactive gas different from the source gas and the first reactive gas to the substrate in the process chamber to modify the first layer; and a process of modifying a surface of the second layer by supplying a hydrogen-containing gas to the substrate in the process chamber.

According to the present invention, a method of manufacturing a semiconductor device capable of forming a thin film including characteristics of a low dielectric constant, high etching tolerance, and high leak tolerance, a method of processing a substrate, a substrate processing apparatus and a non-transitory computer-readable recording medium can be provided.

BRIEF DESCRIPTION OF THE DRAWINGS

FIG. 5 is a diagram illustrating timing of the gas supply in a film formation sequence of the first embodiment of the present invention.

FIGS. 6A to 6C are diagrams illustrating modified examples of the timing of the gas supply in the film formation sequence of the first embodiment of the present invention, FIG. 6A illustrating a first modified example, FIG. 6B illustrating a second modified example, and FIG. 6C illustrating a third modified example.

FIG. 8 is a diagram illustrating timing of the gas supply in a film formation sequence of the second embodiment of the present invention.

FIGS. 9A to 9C are configuration diagrams illustrating modified examples of the timing of the gas supply in the film formation sequence of a second embodiment of the present invention, FIG. 9A illustrating a first modified example, FIG. 9B illustrating a second modified example, and FIG. 9C illustrating a third modified example.

FIG. 11 is a diagram illustrating timing of the gas supply in a film formation sequence of the third embodiment of the present embodiment.

FIGS. 12A to 12C are configuration diagrams illustrating modified examples of the timing of the gas supply in the film formation sequence of the third embodiment of the present invention, FIG. 12A illustrating a first modified example, FIG. 12B illustrating a second modified example, and FIG. 12C illustrating a third modified example.

FIGS. 13A to 13C are configuration diagrams illustrating modified examples of the timing of the gas supply in the film formation sequence of the third second embodiment of the present invention, FIG. 13A illustrating a fourth modified example, FIG. 13B illustrating a fifth modified example, and FIG. 13C illustrating a sixth modified example.

FIGS. 14A and 14B are diagrams illustrating timing of the gas supply in a film formation sequence of another embodiment of the present invention.

FIGS. 15A to 15D are diagrams illustrating timing of the gas supply in a film formation sequence of still another embodiment of the present invention.

DETAILED DESCRIPTION

First Embodiment of the Present Invention

Hereinafter, a first embodiment of the present invention will be described with reference to the accompanying drawings.

(1) Configuration of Substrate Processing Apparatus

Figure 1:
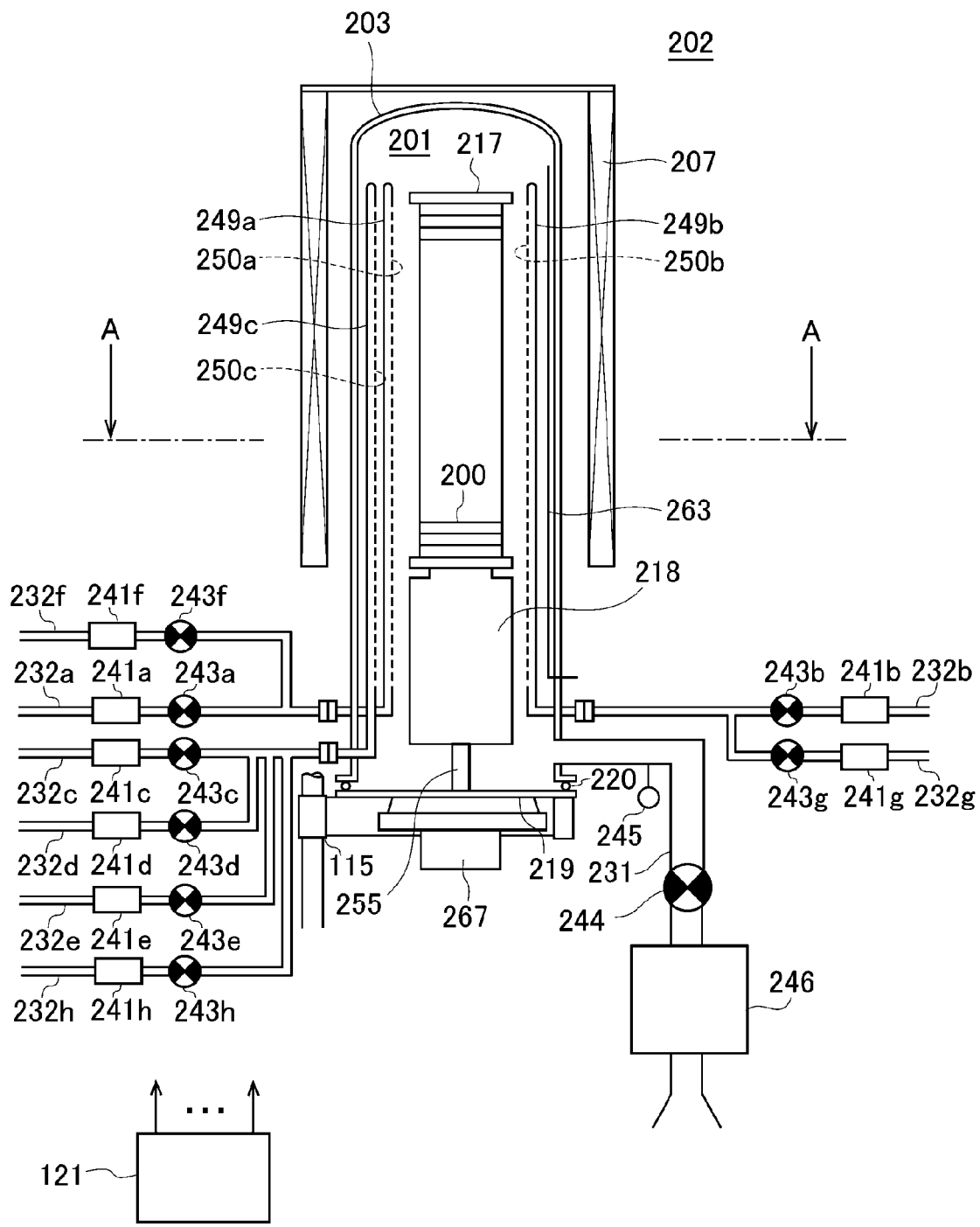
FIG. 1 is a schematic configuration diagram of a vertical processing furnace of a substrate processing apparatus that may be preferably used in one embodiment of the present invention, and illustrates a vertical cross-sectional view of a portion of the processing furnace.
Figure 2:
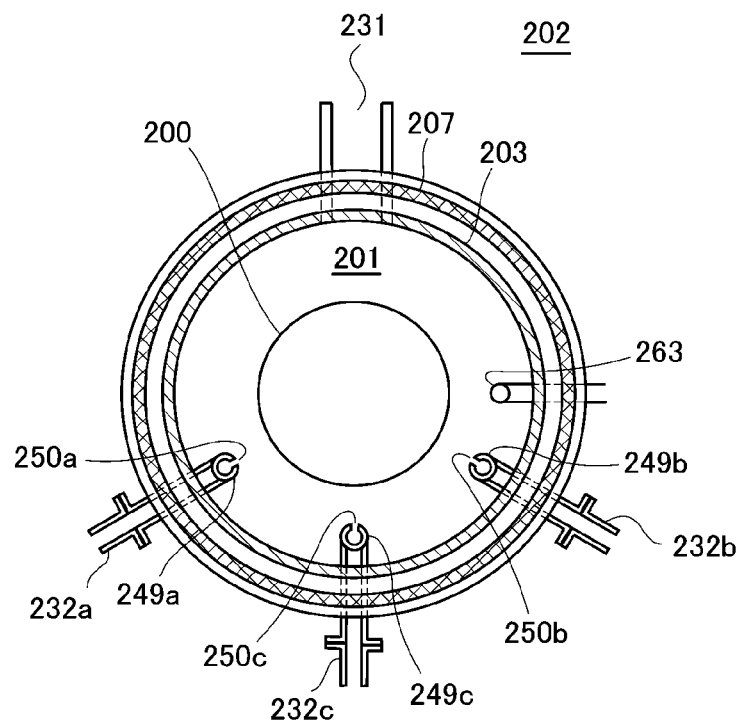
FIG. 2 is a schematic configuration diagram of a vertical processing furnace of a substrate processing apparatus that may be preferably used in an embodiment of the present invention, and illustrates a portion of the processing furnace in a cross-sectional view taken along line A-A in FIG. 1.

FIG. 1 is a schematic configuration diagram of a vertical processing furnace of a substrate processing apparatus which is preferably used in a preferred embodiment of the present invention, showing a vertical cross-sectional view of a portion of the processing furnace 202. FIG. 2 is a schematic configuration diagram of the vertical processing furnace which is preferably used in a preferred embodiment of the present invention, showing a cross-sectional view of a portion of the processing furnace 202 taken along line A-A of FIG. 1.

As illustrated in FIG. 1, the processing furnace 202 includes a heater 207 serving as a heating unit (a heating mechanism). The heater 207 has a cylindrical shape. The heater 207 is vertically fixed by being supported by a heater base (not illustrated) serving as a retaining plate. Furthermore, the heater 207 also serves as activation mechanism (an excitation portion) that activates (excites) gas using heat as will be described later.

A reaction tube 203 constituting a reaction container (a processing container) to be concentric with the heater 207 is provided inside the heater 207. The reaction tube 203 is, for example, made of a heat-resistant material such as quartz ($SiO_2$) or silicon carbide (SiC), and is formed in a cylindrical shape with a closed upper and an opened lower end. A process chamber 201 is formed in a cylinder hollow portion of the reaction tube 203, and is configured to allow a wafer 200 vertically arranged in a horizontal posture in multiple stages using a boat 217 to be described later to be accommodated as a substrate.

A first nozzle 249a, a second nozzle 249b, and a third nozzle 249c are provided in the process chamber 201 so as to pass through the lower portion of the reaction tube 203. A first gas supply pipe 232a, a second gas supply pipe 232b, and a third gas supply pipe 232c are connected to the first nozzle 249a, the second nozzle 249b, and the third nozzle 249c, respectively. Furthermore, a fourth gas supply pipe 232d and a fifth gas supply pipe 232e are each connected to the third gas supply pipe 232c. In this manner, in the reaction tube 203, three nozzles 249a, 249b and 249c and five gas supply pipes 232a, 232b, 232c, 232d and 232e are provided, and there is provided a configuration capable of supplying plural types, herein, fives types, of gases into the process chamber 201.

Furthermore, a metallic manifold configured to support the reaction tube 203 is provided at a lower portion of the reaction tube 203, and the respective nozzles may be provided to pass through a sidewall of the metallic manifold. In this case, a gas exhaust pipe 231 to be described later may be further provided in the metallic manifold. Furthermore, even in this case, the gas exhaust pipe 231 may be provided at a lower portion of the reaction tube 203 rather than in the metallic manifold.

In this manner, a furnace port portion of the processing furnace may be made of a metal and the nozzles or the like may be provided in the metallic furnace port portion.

A mass flow controller (MFC) 241a serving as a flow rate controller (a flow rate control unit), and a valve 243a serving as an opening/closing valve are provided at the first gas supply pipe 232a sequentially from an upstream direction thereof. Furthermore, a first inert gas supply pipe 232f is connected to the first gas supply pipe 232a at a downstream side of the valve 243a. A mass flow controller (MFC) 241f serving as a flow rate controller (a flow rate control unit), and a valve 243f serving as an opening/closing valve are provided at the first inert gas supply pipe 232f sequentially from an upstream direction thereof. Furthermore, the first nozzle 249a mentioned above is connected to a leading end portion of the first gas supply pipe 232a. The first nozzle 249a is provided in an arc-shaped space between an inner wall of the reaction tube 203 and the wafers 200 to rise upward from the lower portion to the upper portion of the inner wall of the reaction tube 203 in a stacking direction of the wafers 200. That is, the first nozzle 249a is provided to follow a wafer arrangement area in an area that horizontally surrounds a lateral wafer arrangement area of the wafer arrangement area in which the wafers 200 are arranged. The first nozzle 249a is formed as an L-shaped long nozzle, and a horizontal portion thereof is provided to pass through a lower sidewall of the reaction tube 203, and a vertical portion thereof is provided to rise at least from one end side to the other end side of the wafer arrangement area. Gas supply holes 250a configured to supply the gas are provided at a side surface of the first nozzle 249a. The gas supply holes 250a are opened toward the center of the reaction tube 203 and are able to supply the gas toward the wafers 200. The gas supply holes 250a are provided in plural number from the lower portion to the upper portion of the reaction tube 203, and the gas supply holes 250a each have the same opening area, and are also provided at the same opening pitch.

A first gas supply system mainly includes the first gas supply pipe 232a, the mass flow controller 241a, and the valve 243a. Furthermore, the first gas supply system may include the first nozzle 249a. Furthermore, a first inert gas supply system mainly includes the first inert gas supply pipe 232f, the mass flow controller 241f and the valve 243f. The first inert gas supply system also serves as a purge gas supply system.

A mass flow controller (MFC) 241b serving as a flow rate controller (a flow rate control unit) and a valve 243b serving as an opening/closing valve are provided at the second gas supply pipe 232b sequentially from an upstream direction thereof. Furthermore, a second inert gas supply pipe 232g is connected to the second gas supply pipe 232b at a downstream side of the valve 243b. A mass flow controller 241g serving as a flow rate controller (a flow rate control unit) and a valve 243g serving as an opening/closing valve are provided at the second inert gas supply pipe 232g sequentially from an upstream direction thereof. Also, the above-described second nozzle 249b is connected to a leading end portion of the second gas supply pipe 232b. The second nozzle 249b is provided in an arc-shaped space between the inner wall of the reaction tube 203 and the wafer 200 so as to rise upward from a lower portion to an upper portion of the inner wall of the reaction tube 203 in a stacking direction of the wafers 200. That is, the second nozzle 249b is provided to follow a wafer arrangement area in an area that horizontally surrounds a lateral wafer arrangement area of the wafer arrangement area in which the wafers 200 are arranged. The second nozzle 249b is formed as an L-shaped long nozzle, a horizontal portion thereof is provided to pass through a lower sidewall of the reaction tube 203, and a vertical portion thereof is provided to rise at least from one end side to the other end side of the wafer arrangement area. Gas supply holes 250b configured to supply the gas are provided at a side surface of the second nozzle 249b. The gas supply holes 250b are opened toward the center of the reaction tube 203 and are able to supply the gas toward the wafers 200. The gas supply holes 250b are provided in plural numbers from the lower portion to the upper portion of the reaction tube 203, and the gas supply holes 250b each have the same opening area, and are also provided at the same opening pitch.

A second gas supply system mainly includes the second gas supply pipe 232b, the mass flow controller 241b, and the valve 243b. Furthermore, the second gas supply system may include the second nozzle 249b. Furthermore, a second inert gas supply system mainly includes the second inert gas supply pipe 232g, the mass flow controller 241g and the valve 243g. The second inert gas supply system also serves as a purge gas supply system.

A mass flow controller (MFC) 241c serving as a flow rate controller (a flow rate control unit) and a valve 243c serving as an opening/closing valve are provided at the third gas supply pipe 232c sequentially from an upstream direction thereof. Furthermore, a fourth gas supply pipe 232d and a fifth gas supply pipe 232e are connected to the third gas supply pipe 232c at a downstream side of the valve 243c. A mass flow controller 241d serving as a flow rate controller (a flow rate control unit) and a valve 243d serving as an opening/closing valve are provided at the fourth gas supply pipe 232d sequentially from an upstream direction thereof. A mass flow controller 241e serving as a flow rate controller (a flow rate control unit) and a valve 243e serving as an opening/closing valve are provided at the fifth gas supply pipe 232e sequentially from an upstream direction thereof. Furthermore, a third inert gas supply pipe 232h is connected to the third gas supply pipe 232c at the downstream side of the connection location between the four gas supply pipe 232d and the fifth gas supply pipe 232e. A mass flow controller 241h serving as a flow rate controller (a flow rate control unit) and a valve 243h serving as an opening/closing valve are provided at the third inert gas supply pipe 232h sequentially from an upstream direction thereof. Furthermore, the above-described third nozzle 249c is connected to a leading end portion of the third gas supply pipe 232c. The third nozzle 249c is provided in an arc-shaped space between the inner wall of the reaction tube 203 and the wafer 200 so as to rise upward from a lower portion to an upper portion of the inner wall of the reaction tube 203 in a stacking direction of the wafers 200. That is, the third nozzle 249c is provided to follow a wafer arrangement area in an area that horizontally surrounds a lateral wafer arrangement area of the wafer arrangement area in which the wafers 200 are arranged. The third nozzle 249c is formed as an L-shaped long nozzle, and a horizontal portion thereof is provided to pass through a lower sidewall of the reaction tube 203, and a vertical portion thereof is provided to rise at least from one end side to the other end side of the wafer arrangement area. Gas supply holes 250c configured to supply the gas are provided at a side surface of the third nozzle 249c. The gas supply holes 250c are opened toward the center of the reaction tube 203 and are able to supply the gas toward the wafers 200. The gas supply holes 250c are provided in plural numbers from the lower portion to the upper portion of the reaction tube 203, and the gas supply holes 250c each have the same opening area, and are also provided at the same opening pitch.

A third gas supply system mainly includes the third gas supply pipe 232c, the mass flow controller 241c, and the valve 243c. Furthermore, the third gas supply system may include the third nozzle 249c. Furthermore, a fourth gas supply system mainly includes the fourth gas supply pipe 232d, the mass flow controller 241d and the valve 243d. Furthermore, at the downstream side of the connection portion between the third gas supply pipe 232c and the fourth gas supply pipe 232d, the fourth gas supply system may include the third nozzle 249c. Furthermore, a fifth gas supply system mainly includes the fifth gas supply pipe 232e, the mass flow controller 241e and the valve 243e. Furthermore, at the downstream side of the connection portion between the third gas supply pipe 232c and the fifth gas supply pipe 232e, the fifth gas supply system may include the third nozzle 249c. Furthermore, a third inert gas supply system mainly includes the third inert gas supply pipe 232h, the mass flow controller 241h and the valve 243h. The third inert gas supply system also serves as a purge gas supply system.

In this manner, the method of supplying the gas in the present embodiment includes transporting the gas via the nozzles 249a, 249b and 249c placed in an arc-shaped longitudinal space that is defined by the inner wall of the reaction tube 203 and the end portions of the plurality of wafers 200, emitting the gas into the reaction tube 203 in the vicinity of the wafers 200 first though the gas supply ports 250a, 250b and 250c opened to the nozzles 249a, 249b and 249c, respectively, and setting the main flow in the reaction tube 203 to a direction parallel to the surface of the wafer 200, that is, a horizontal direction. With such a configuration, there are effects that the gas can be uniformly supplied to the respective wafers 200 and the uniform film thickness of the thin film can be formed on the respective wafers 200. Furthermore, the gas flowed on the surface of the wafer 200, that is, the residual gas after the reaction, flows toward the exhaust port, that is, in the direction of a gas exhaust pipe 231 to be described below, but the flowing direction of the residual gas is suitably specified by the position of the exhaust port, and is not limited to the vertical direction.

As the source gas containing a predetermined element and a halogen element, for example, a chlorosilane-based source gas serving as a source gas containing, for example, at least silicon (Si) and chlorine (Cl), is supplied through the first gas supply pipe 232a into the process chamber 201 via the mass flow controller 241a, the valve 243a and the first nozzle 249a. Herein, the chlorosilane-based source gas refers to a chlorosilane-based source in a gas state, for example, a gas obtained by vaporizing the chlorosilane-based source in a liquid state under normal temperature and normal pressure, and a chlorosilane-based source in a gas state under normal temperature and normal pressure. Furthermore, the chlorosilane-based source refers to a silane-based source having the chloro group as the halogen group, and refers to a silane-based source that contains at least silicon (Si) and chlorine (Cl). That is, the chlorosilane-based source mentioned herein can also be referred to as a kind of halogenide. Furthermore, the term "source" in the present specification may mean "a liquid source in a liquid state," "a source gas in a gas state" or both of these. Thus, in the present specification, "chlorosilane-based source" may mean "chlorosilane-based source in a liquid state," "chlorosilane-based source in a gas state" or both of these. As the chlorosilane-based source gas, for example, it is possible to use hexachlorodisilane ($Si_2Cl_6$, abbreviation: HCDS) gas in which the number of ligands (Cl) containing a halogen group is six in one molecule, that is, in the compositional formula of HCDS. Furthermore, when using the liquid source in the liquid state under the normal temperature and normal pressure as in HCDS, the liquid source is vaporized using a vaporization system such as a vaporizer or a bubbler and is supplied as the source gas (HCDS gas).

As the first reactive gas containing carbon (C) and nitrogen (N), for example, a gas containing amine, that is, an amine-based gas, is supplied through the second gas supply pipe 232b into the process chamber 201 via the mass flow controller 241b, the valve 243b and the second nozzle 249b. Herein, the amine-based source gas refers to a gas containing an amine group such as amine in a gas state, for example, a gas obtained by vaporizing amine in a liquid state under the normal temperature and normal pressure, or an amine in a gas state under the normal temperature and normal pressure. The amine-based gas includes an amine such as ethylamine, methylamine, propylamine, isopropylamine, butylamine, or isobutylamine. Herein, an amine is a generic name for a compound in which a hydrogen atom of ammonia ($NH_3$) is substituted with a hydrocarbon group such as an alkyl group. That is, an amine includes a hydrocarbon group such as an alkyl group as a ligand containing the carbon atom. Since the amine-based gas contains three elements including carbon (C), nitrogen (N), and hydrogen (H), and does not contain silicon (Si), the amine-based gas can also be referred to as a silicon-free gas. Furthermore, since the amine-based gas does not contain silicon or a metal, the amine-based gas can also be referred to as a silicon-free and metal-free gas. Furthermore, the amine-based gas is also a nitrogen-containing gas, a carbon-containing gas or a hydrogen-containing gas. The amine-based gas can also called a substance containing only three elements including carbon (C), nitrogen (N), and hydrogen (H). Furthermore, in the present specification, the term "amine" may mean "an amine-based gas in a liquid state," "an amine-based gas in a gas state" or both of these. As the amine-based gas, for example, it is possible to use triethylamine [$(C_2H_5)_3N$ abbreviation: TEA] having a composition wherein the number of ligands (ethyl groups) containing a carbon atom is three in one molecule, that is, in the compositional formula of TEA, and the number of the carbon atoms is greater than that of the nitrogen atoms in one molecule. Furthermore, when using the amine in the liquid state under the normal temperature and normal pressure as in TEA, the amine in the liquid state is vaporized using a vaporization system such as a vaporizer or a bubbler and is supplied as the first reactive gas (TEA gas).

The first reactive gas has a composition wherein the number of carbon atoms is greater than that of nitrogen atoms. That is, the number of carbon atoms is greater than that of nitrogen atoms in the compositional formula of the material constituting the first reactive gas. That is, the number of carbon atoms is greater than that of nitrogen atoms in one molecule of the material constituting the first reaction gas.

Further, the first reaction gas contains a plurality of ligands containing carbon atoms. That is, a plurality of ligands containing carbon atoms are contained in the compositional formula of the material constituting the first reactive gas.

As a second reactive gas different from the source gas and the first reactive gas, for example, a gas containing oxygen (O) (an oxygen-containing gas), that is, an oxidation gas, is supplied through the third gas supply pipe 232c into the process chamber 201 via the mass flow controller 241c, the valve 243c and the third nozzle 249c. As the oxygen-containing gas (the oxidation gas), for example, oxygen ($O_2$) gas can be used.

As the source gas and the second reactive gas different from the first reactive gas, for example, a gas containing nitrogen (N) (nitrogen-containing gas), that is, a nitriding gas, is supplied through the fourth gas supply pipe 232d into the process chamber 201 via the mass flow controller 241d, the valve 243d, the third gas supply pipe 232c, and the third nozzle 249d. As the nitrogen-containing gas (the nitriding gas), for example, ammonia ($NH_3$) gas can be used.

A gas containing hydrogen, that is, as a reducing gas, for example, hydrogen ($H_2$) gas, is supplied through the fifth gas supply pipe 232e into the process chamber 201 via the mass flow controller 241e, the valve 243e, the third gas supply pipe 232c, and the third nozzle 249c.

As an inert gas, for example, nitrogen ($N_2$) gas is supplied through the inert gas supply pipes 232f, 232g, and 232h into the process chamber 201 via the mass flow controllers 241f, 241g, and 241h, the valves 243f, 243g and 243h, gas supply pipes 232a, 232b and 232c, and the nozzles 249a, 249b and 249c, respectively.

Furthermore, for example, when causing the gas as mentioned above to flow through the respective gas supply pipes, a source gas supply system configured to supply the source gas containing a predetermined element and a halogen group by the first gas supply system, that is, a chlorosilane-based source gas supply system, is constituted. Furthermore, the chlorosilane-based source gas supply system is also simply referred to as a chlorosilane-based source supply system. Furthermore, the second gas supply system constitutes the first reactive gas supply system, that is, an amine-based gas supply system. Furthermore, the amine-based gas supply system is also simply referred to as an amine supply system. Furthermore, the third gas supply system constitutes the second reactive gas supply system, that is, an oxygen-containing gas supply system serving as an oxidation gas supply system. Furthermore, the fourth gas supply system constitutes the second reactive gas supply system, that is, a nitrogen-containing gas supply system serving as a nitriding gas supply system. Furthermore, the fifth gas supply system constitutes a hydrogen-containing gas supply system serving as a reducing gas supply system.

The reaction tube 203 is provided with a gas exhaust pipe 231 configured to exhaust an atmosphere in the process chamber 201. As illustrated in FIG. 2, when viewed from a transverse cross section, the gas exhaust pipe 231 is placed at a side facing a side in which the gas supply port 250a of the first nozzle 249a, the gas supply port 250b of the second nozzle 249b and the gas supply port 250c of the third nozzle 249c of the reaction tube 203 are provided, that is, at a side opposite to the gas supply ports 250a, 250b, and 250c with the water 200 interposed therebetween. Furthermore, as illustrated in FIG. 1, when viewed from the longitudinal cross-section, the gas exhaust pipe 231 is placed at a lower portion of a location at which the gas supply ports 250a, 250b, and 250c are provided. With this configuration, the gas supplied through the gas supply ports 250a, 250b, and 250c to the vicinity of the wafer 200 in the process chamber 201 flows in a horizontal direction, that is, a direction parallel to the surface of the wafer 200, then flows downward and is exhausted through the gas exhaust pipe 231. As mentioned above, the main flow of the gas in the process chamber 201 is a flow directed in the horizontal direction.

A vacuum pump 246 serving as a vacuum exhaust device is connected to the gas exhaust pipe 231 via a pressure sensor 245 serving as a pressure detector (a pressure detecting portion) configured to detect an inner pressure of the process chamber 201 and an automatic pressure controller (APC) valve 244 serving as a pressure regulator (a pressure regulating portion). Furthermore, the APC valve 244 is a valve which is configured to be able to perform start and stop of the vacuum exhaust in the process chamber 201 by opening and closing the valve while the vacuum pump 246 is being operated, and to regulate an inner pressure of the process chamber 201 by adjusting an opening degree of the valve while the vacuum pump 246 is being operated. An exhaust system mainly includes the gas exhaust pipe 231, the APC valve 244, and the pressure sensor 245. Furthermore, the exhaust system may include the vacuum pump 246. The exhaust system is configured so as to enable the vacuum exhaust so that an inner pressure of the process chamber 201 reaches a predetermined pressure (a degree of vacuum), by adjusting the degree of opening of the valve of the APC valve 244 based on pressure information detected by the pressure sensor 245 while operating the vacuum pump 246.

As a furnace port lid capable of hermetically closing a lower end opening of the reaction tube 203, a seal cap 219 is provided at a lower portion of the reaction tube 203. The seal cap 219 is configured to come in contact with a lower end of the reaction tube 203 in a vertical direction from a lower portion thereof. For example, the seal cap 219 is made of a metal such as stainless steel, and is formed in a disk shape. The O-ring 220 serving as a seal member coming in contact with the lower end of the reaction tube 203 is provided on an upper surface of the seal cap 219. A rotary mechanism 267 configured to rotate the boat 217 as a substrate retainer as will be described below is provided at a side of the seal cap 219 which is opposite to the process chamber 201. A rotating shaft 255 of the rotary mechanism 267 is connected to the boat 217 through the seal cap 219. The rotary mechanism 267 is configured to rotate the wafer 200 by rotating the boat 217. The seal cap 219 is configured to be vertically raised or lowered by a boat elevator 115 serving as an elevation mechanism that is vertically provided outside the reaction tube 203. The boat elevator 115 is configured to be able to carry the boat 217 inside and outside the process chamber 201 by raising and lowering the seal cap 219. That is, the boat elevator 115 is constituted as a transport device (transport mechanism) that transports the boat 217, that is, the wafer 200, to the inside and outside of the process chamber 201.

For example, the boat 217, as a substrate retainer, is made of a heat-resistant material such as quartz or silicon carbide, and is configured so as to support a plurality of wafers 200 in multiple stages in a state in which the wafers 200 are concentrically arranged in a horizontal posture. Furthermore, a heat insulating member 218 made of, for example, a heat-resistant material such as quartz or silicon carbide, is provided at a lower portion of the boat 217, and is configured to impede transfer of heat from the heater 207 to the seal cap 219 side. Furthermore, the heat insulating member 218 may be constituted by a plurality of heat insulating plates made of a heat-resistant material such as quartz or silicon carbide, and a heat insulating plate holder that supports the heat insulting plates in a horizontal posture and in multiple stages.

A temperature sensor 263 serving as a temperature detector is provided inside the reaction tube 203, and is configured so that a temperature in the process chamber 201 has a desired temperature distribution by adjusting a state of electricity communication into the heater 207 based on temperature information detected by the temperature sensor 263. The temperature sensor 263 is formed in an L shape like the nozzles 249a, 249b and 249c, and is provided along the inner wall of the reaction tube 203.

Figure 3:
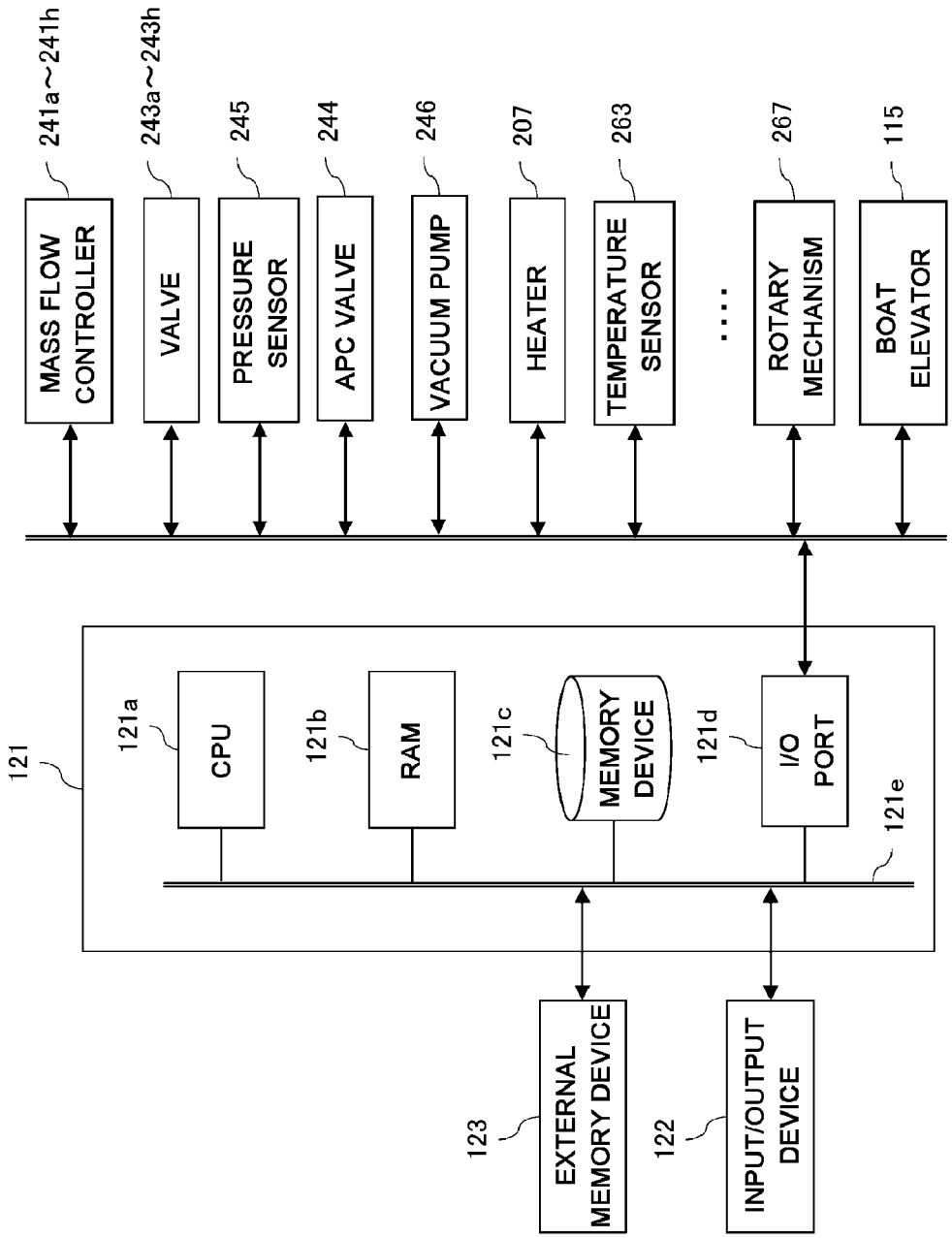
FIG. 3 is a schematic configuration diagram of a controller of a substrate processing apparatus that is preferably used in an embodiment of the present invention.

As illustrated in FIG. 3, the controller 121 serving as a control unit (control means) is also configured as a computer which includes a central processing unit (CPU) 121a, a random access memory (RAM) 121b, a memory device 121c, and an I/O port 121d. The RAM 121b, the memory device 121c and the I/O port 121d are configured to be able to exchange data with the CPU 121a via an internal bus 121e. For example, an input/output device 122 formed as a touch panel or the like is connected to the controller 121.

For example, the memory device 121c includes a flash memory, a hard disk drive (HDD) and the like. A control program configured to control operation of the substrate processing apparatus, a process recipe describing the sequence, conditions or the like for processing a substrate as will be described below or the like are stored in the memory device 121c so that the control program and the process recipe can be read from the memory device 121c. Also, the process recipe is combined so that predetermined results are obtained by executing the respective sequences at the controller 121 in a substrate processing process to be described below, and thus functions as a program. Hereinafter, both of the process recipe and the control program are simply referred to as a program. Also, when the term "program" is used in this specification, the program may include only a single process recipe, may include only a single control program, or may include both of the process recipe and the control program. Also, the RAM 121b is configured as a memory area (a work area) to temporarily retain a program, data or the like that is read by the CPU 121a.

The I/O port 121d is connected to the mass flow controllers 241a, 241b, 241c, 241d, 241e, 241f, 241g and 241h, the valves 243a, 243b, 243c, 243d, 243e, 243f, 243g and 243h, the pressure sensor 245, the APC valve 244, the vacuum pump 246, the heater 207, the temperature sensor 263, the rotary mechanism 267, the boat elevator 115 or the like, as described above.

The CPU 121a is configured to read the process recipe from the memory device 121c according to input or the like of operation commands from the input/output device 122 while reading and executing the control program from the memory device 121c. Then, in order to comply with the read contents of the process recipe, the CPU 121a is configured to control an operation of adjusting flow rates of various gases using the mass flow controllers 241a, 241b, 241c, 241d, 241e, 241f, 241g and 241h, an opening/closing operation of the valves 243a, 243b, 243c, 243d, 243e, 243f, 243g and 243h, an opening/closing operation of the APC valve 244 and a pressure regulating operation using the valve 244 based on the pressure sensor 245, a temperature adjusting operation of the heater 207 based on the temperature sensor 263, a start and stop operation of the vacuum pump 246, an operation of rotating the boat 217 and adjusting a rotational velocity of the boat 217 using the rotary mechanism 267, an operation of raising/lowering the boat 217 using the boat elevator 115 or the like.

Furthermore, the controller 121 is not limited to a case of being configured as a dedicated computer, but may be configured as a general-purpose computer. For example, the controller 121 according to this embodiment may be configured by preparing an external memory device 123 in which the above-described program is stored (for example, a magnetic disk such as a magnetic tape, a flexible disk or a hard disk, an optical disc such as a CD or DVD, a magneto-optical disc such as an MO, and a semiconductor memory such as a USB memory or a memory card), and installing a program on a general-purpose computer using such an external memory device 123. In addition, means for supplying a program to a computer are not limited to a case in which the program is supplied to the computer via the external memory device 123. For example, the program may be supplied using a communication means such as the Internet or a dedicated line without using the external memory device 123. Also, the memory device 121c and the external memory device 123 are configured as a computer-readable recording medium. Hereinafter, these devices are simply referred to as a non-transitory computer-readable recording medium. Also, when the term "recording medium" is used in this specification, the recording medium may include only a single memory device 121c, may include only a single external memory device 123, or includes both of the memory device 121c and the external memory device 123.

(2) Substrate Processing Process

Next, as one process of the method of manufacturing a semiconductor device (device) using the processing furnace 202 of the substrate processing apparatus as described above, an example of a process of forming a thin film on the wafer 200 will be described. Furthermore, in the following description, operations of each part constituting the substrate processing apparatus are controlled by the controller 121.

In the embodiment, a thin film of a predetermined composition and a predetermined film thickness containing a predetermined element on the wafer 200 is formed by repeating a cycle, the cycle including: forming a first layer containing the predetermined element, nitrogen and carbon by alternately performing supplying a source gas containing the predetermined element and a halogen element to the wafer 200 in the process chamber 201 and supplying a first reactive gas containing three elements including carbon, nitrogen and hydrogen and having a composition wherein the number of carbon atoms is greater than that of nitrogen atoms in one molecule to the wafer 200 in the process chamber 201a predetermined number of times (once or more); forming a second layer by supplying a second reactive gas different from the source gas and the first reactive gas to the wafer 200 in the process chamber 201 to modify the first layer; and modifying the surface of the second layer by supplying a hydrogen-containing gas to the wafer 200 in the process chamber 201.

Furthermore, in the present embodiment, for the purpose of setting a composition ratio of the formed thin film to a stoichiometric composition or a predetermined composition ratio different from the stoichiometric composition, the supply conditions of the plurality of types of gas containing the plurality of elements are controlled. For example, the supply conditions are controlled for the purpose of setting at least one element among the plurality of elements forming the formed thin film to exceed a stoichiometric composition compared to other elements. Hereinafter, an example of performing the film formation while controlling the ratio of the plurality of elements forming the thin film, that is, the composition ratio of the thin film, will be described.

Figure 4:
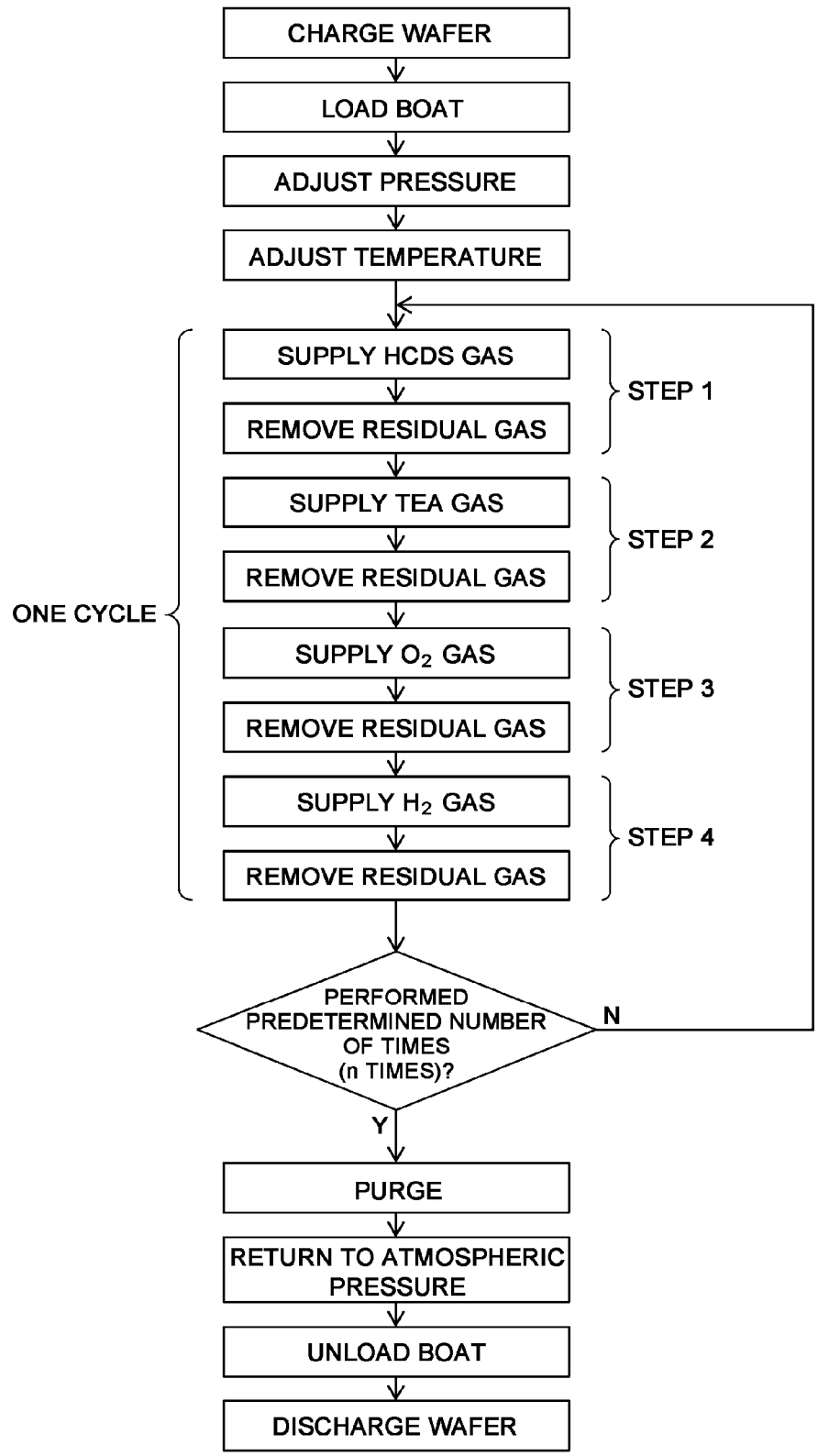
FIG. 4 is a diagram illustrating a film formation flow in a first embodiment of the present invention.

Hereinafter, a film formation sequence of the present embodiment will be specifically described using FIGS. 4 and 5. FIG. 4 is a diagram illustrating a film formation flow of the present embodiment. FIG. 5 is a diagram illustrating timing of the gas supply in the film formations sequence of the present embodiment.

Furthermore, herein, an example will be described in which a silicon oxycarbonitride film (a SiOCN film) or a silicon oxycarbide film (a SiOC film) serving as a silicon-based insulating film of a predetermined composition and a predetermined film thickness is formed on the wafer 200 by repeating a cycle, the cycle including: forming a first layer containing silicon, nitrogen and carbon by alternately performing supplying an HCDS gas serving as a chlorosilane-based source gas as a source gas to the wafer 200 in the process chamber 201, and supplying a TEA gas serving as an amine-based gas containing a plurality (three) of ligands (ethyl group) containing a carbon atom in one molecule, as a first reactive gas containing the three elements including carbon, nitrogen and hydrogen and having a composition wherein the number of carbon atoms is greater than that of nitrogen atoms in one molecule to the wafer 200 in the process chamber 201 once; forming a silicon oxycarbonitride film (a SiOCN film) or a silicon oxycarbide film (a SiOC film) as second layer by supplying O₂ gas serving as an oxygen-containing gas (an oxidizing gas) as a second reactive gas different from the source gas and the first reactive gas to the wafer 200 in the process chamber 201 to modify the first layer; and modifying the surface of the second layer by supplying H₂ gas as a hydrogen-containing gas (a reducing gas) to the wafer 200 in the process chamber 201.

Furthermore, in the specification, the term "wafer" may mean "the wafer itself," or "a stacked layer (assembly) such as a predetermined layer and film formed on the wafer and the surface thereof" (that is, a predetermined layer, the film or the like formed on the surface may be referred to as a wafer). Furthermore, in the present specification, the term "surface of the wafer" may mean "a surface (exposed surface) of the wafer itself" or "a surface such as that of a predetermined layer and a film formed on the wafer, that is, the outermost surface of the wafer as the stacked body."

Thus, in the specification, when it is described that "a predetermined gas is supplied to the wafer," this may mean that "the predetermined gas is directly supplied to the surface (the exposed surface) of the wafer itself" or that "predetermined gas is supplied to the outermost surface of the wafer as the stacked body with respect to the layer and the film formed in the wafer." Furthermore, in the present specification, when it is described that "a predetermined layer (or film) is formed on the wafer," this may meant that "a predetermined layer (or film) is directly formed on the surface (the exposed surface) of the wafer itself" or that "a predetermined layer (or film) is formed on the layer and the film or the like formed on the wafer, that is, on the outermost surface of the wafer as the stacked layer."

Furthermore, in the specification, the term "substrate" is used synonymously with the term "wafer," and the terms "wafer" and "substrate" may be used interchangeably in the description.

Wafer Charging and Boat Loading

When the plurality of wafers 200 are charged to the boat 217 (wafer charging), as illustrated in FIG. 1, the boat 217 supporting the plurality of wafers 200 is raised by the boat elevator 115 and is carried into the process chamber 201 (boat loading). In this state, the seal cap 219 seals the lower end of the reaction tube 203 via an O-ring 220.

Pressure Adjustment and Temperature Adjustment

An interior of the process chamber 201 is vacuum-exhausted by means of the vacuum pump 246 so that the interior of the process chamber 201 reaches a desired pressure (degree of vacuum). At this time, the inner pressure of the process chamber 201 is measured by the pressure sensor 245, and the APC valve 244 is feedback-controlled based on the measured pressure (pressure regulation). Furthermore, the vacuum pump 246 always keeps the operation state at least until the treatment of the wafer 200 is finished. Furthermore, the interior of the process chamber 201 is heated by the heater 207 to reach a desired temperature. At this time, a state of electricity communication into the heater 207 is feedback-controlled based on temperature information detected by the temperature sensor 263 so that the interior of the process chamber 201 has a desired temperature distribution (temperature adjustment). Furthermore, heating of the interior of the process chamber 201 using the heater 207 is continuously performed at least until the treatment of the wafer 200 is finished. Next, the boat 217 and the wafers 200 start to rotate by means of the rotary mechanism 267. Furthermore, the rotation of the boat 217 and the wafer 200 using the rotary mechanism 267 is continuously performed at least until the treatment of the wafer 200 is finished.

Silicon Oxycarbonitride Film and Silicon Oxycarbide Film Forming Process

Thereinafter, the following three steps, that is steps 1 to 3 is sequentially performed.

Step 1

HCDS Gas Supply

The valve 243a of the first gas supply pipe 232a is opened to allow the HCDS gas to flow through the first gas supply pipe 232a. A flow rate of the HCDS gas flowing through the first gas supply pipe 232a is adjusted by means of the mass flow controller 241a. The NH₃ gas whose flow rate is adjusted is supplied into the process chamber 201 through the gas supply holes 250a of the first nozzle 249a, and is exhausted through the gas exhaust pipe 231. At this time, the HCDS gas is supplied into the wafer 200. At this time, the valve 243f is simultaneously opened to allow N₂ gas serving as the inert gas to flow in the first inert gas supply pipe 232f. The flow rate of N₂ gas flowing through the first inert gas supply pipe 232f is adjusted using the mass flow controller 241f. The N₂ gas whose flow rate is adjusted is supplied into the process chamber 201 together with the HCDS gas, and is exhausted through the gas exhaust pipe 231.

Furthermore, at this time, in order to prevent the HCDS gas from entering the second nozzle 249b and the third nozzle 249c, the valves 243g and 243h are opened to allow the N₂ gas to flow through the second inert gas supply pipe 232g and the third inert gas supply pipe 232h. The N₂ gas is supplied into the process chamber 201 via the second gas supply pipe 232b, the third gas supply pipe 232c, the second nozzle 249b and the third nozzle 249c, and is exhausted through the gas exhaust pipe 231.

At this time, the APC valve 244 is properly adjusted so that an inner pressure of the process chamber 201 reaches a pressure in a range of, for example, 1 to 13,300 Pa, and preferably, 20 to 1,330 Pa. For example, a supply flow rate of the HCDS gas controlled by the mass flow controller 241a is set to a flow rate within a range of 1 to 1,000 sccm. For example, a supply flow rate of the N₂ gas controlled by each of the mass flow controllers 241f, 241g, and 241h is set to a flow rate within a range of 100 to 10,000 sccm. For example, a time required to supply the HCDS gas to the wafer 200, that is, a gas supply time (emission time), is set to a time range of 1 to 120 seconds, and preferably, 1 to 60 seconds. In this case, a temperature of the heater 207 is set so that, for example, a temperature of the wafer 200 reaches a temperature of 250 to 700° C., preferably, 300 to 650° C., and more preferably, 350 to 600° C. Also, when the temperature of the wafer 200 is less than 250° C., in some cases, the HCDS is hardly adsorbed on the wafer 200, and thus the practical film formation rate cannot be obtained. When the temperature of the wafer 200 is equal to or higher than 250° C., this problem can be solved. Furthermore, when the temperature of the wafer 200 is equal to or higher than 300° C. and 350° C., it is possible to more sufficiently adsorb the HCDS on the wafer 200, and thus the more sufficient film formation rate can be obtained. Furthermore, when the temperature of the wafer 200 exceeds 700° C., the CVD reaction becomes stronger, (a vapor phase reaction is dominant), and thus uniformity of the film thickness is easily degraded, and the control of the film thickness is difficult. When the temperature of the wafer 200 is equal to or less than 700° C., degradation of uniformity of the film thickness can be suppressed, and thus the film thickness can be controlled. Particularly, when the temperature of the wafer 200 is equal to or less than 650° C., particularly, 600° C., the surface reaction is predominant, uniformity of the film thickness can easily be secured, and the film thickness is easily controlled. Thus, the temperature of the wafer 200 may be within the range of 250 to 700° C., preferably, 300 to 650° C., and more preferably, 350 to 600° C.

By supplying the HCDS gas to the wafer 200 under the conditions mentioned above, on the wafer 200 (a base film), as an initial layer containing a predetermined element (silicon) and a halogen element (chlorine), for example, a silicon-containing layer containing chlorine (Cl) of a thickness from less than one atomic layer to several atomic layers is formed. The silicon-containing layer containing Cl may be an adsorption layer of the HCDS gas, a silicon layer (Si layer) containing Cl, or both.

Here, the silicon layer containing Cl is a generic name including a discontinuous layer in addition to a continuous layer formed of silicon (Si) and containing Cl, or a silicon thin film containing Cl formed by overlapping them. In addition, a continuous layer formed of Si and containing Cl may be referred to as the silicon thin film containing Cl. Further, Si constituting the silicon layer containing Cl contains Si, in which bonding to Cl is completely broken, in addition to Si, in which bonding to Cl is not completely broken.

Furthermore, the adsorption layer of the HCDS gas also includes a discontinuous chemical adsorption layer of the HCDS gas molecules, in addition to the continuous chemical adsorption layer of the HCDS gas molecules. That is, the adsorption layer of the HCDS gas includes a chemical adsorption layer of a thickness of one molecular layer consisting of HCDS molecules or less than one molecular layer consisting of HCDS molecules. Furthermore, the HCDS molecules forming the adsorption layer of the HCDS gas also include $Si_xCl_y$ molecules whose bonding with Cl is partially broken in addition to $Si_2Cl_6$ molecules. That is, the adsorption layer of the HCDS includes the continuous chemical adsorption layer and the discontinuous chemical adsorption layer of $Si_2Cl_6$ molecules and/or $Si_xCl_y$ molecules.

Furthermore, the layer that is less than one atomic layer in thickness refers to an atomic layer that is discontinuously formed, and the layer that is one atomic layer in thickness refers to an atomic layer that is continuously formed. Furthermore, the layer that is less than one molecular layer in thickness refers to a molecular layer that is discontinuously formed, and the layer that is one molecular layer in thickness refers to a molecular layer that is continuously formed.

Under conditions in which the HCDS gas is self-decomposed (thermally decomposed), that is, under conditions in which a thermal decomposition reaction of the HCDS occurs, a silicon layer containing Cl is formed due to the deposition of Si on the wafer 200. Under conditions in which the HCDS gas is not self-decomposed (thermally decomposed), that is, under conditions in which thermal decomposition reaction of the HCDS does not occur, an adsorption layer of the HCDS gas is formed due to the adsorption of the HCDS gas onto the wafer 200. Furthermore, in order to further enhance the film formation rate, a case of forming the silicon layer containing Cl on the wafer 200 is more preferable than a case of forming the adsorption layer of the HCDS gas on the wafer 200.

When the thickness of the silicon-containing layer containing Cl formed on the wafer 200 exceeds several atomic layers, the modifying action in Step 2 and Step 3 to be described later does not reach the whole silicon-containing layer containing Cl. Furthermore, a minimum value of the thickness of the silicon-containing layer containing Cl capable of being formed on the wafer 200 is less than one atomic layer. Thus, the thickness of the silicon-containing layer containing Cl is preferably from less than one atomic layer to several atomic layers. Furthermore, when setting the thickness of the silicon-containing layer containing Cl to be equal to or less than one atomic layer, that is, one atomic layer or less than one atomic layer, the effect of the modifying reaction in Step 2 and Step 3 as will be described later can be relatively enhanced, and it is possible to reduce the time required for the modifying reaction of Step 2 and Step 3. As a result, the processing time for a cycle can be reduced, and the whole processing time can also be reduced. That is, it is also possible to increase the film formation rate. Furthermore, when setting the thickness of the silicon-containing layer containing Cl to be equal to or less than one atomic layer, it is also possible to more effectively control uniformity of the film thickness.

Residual Gas Removal

After the silicon-containing layer containing Cl is formed as the initial layer, the valve 243a of the first gas supply pipe 232a is closed to stop the supply of the HCDS gas. At this time, the APC valve 244 of the gas exhaust pipe 231 is kept open to vacuum-exhaust an interior of the process chamber 201 using the vacuum pump 246 so that an unreacted gas remaining in the process chamber 201 or the HCDS gas that has contributed to formation of the initial layer is eliminated from the process chamber 201. Furthermore, at this time, the valves 243f, 243g and 243h may also be kept open to maintain the supply of the $N_2$ gas as the inert gas into the process chamber 201. The $N_2$ gas acts as a purge gas. Therefore, it is possible to improve an effect of eliminating an unreacted gas remaining in the process chamber 201 or the HCDS gas that has contributed to formation of the initial layer from the process chamber 201.

Furthermore, at this time, the gas remaining in the process chamber 201 may not be completely eliminated, and the interior of the process chamber 201 may not be completely purged. If a very small amount of gas remains in the process chamber 201, no adverse effect occurs in Step 2 performed thereafter. At this time, there is also no need to set a flow rate of the $N_2$ gas supplied into the process chamber 201 to a great flow rate. For example, it is possible to perform purging to such a level that no adverse affect occurs in Step 2 by supplying the same amount of the volume of the reaction tube 203 or the process chamber 201. In this manner, it is possible to shorten the purge time to improve throughput by not completely purging the interior of the process chamber 201. Furthermore, it is also possible to suppress the consumption of the $N_2$ gas to a minimum level.

As the chlorosilane-based source gas, in addition to a hexachlorodisilane ($Si_2Cl_6$ abbreviation: HCDS) gas, inorganic source gases such as tetrachlorosilane, that is, silicon tetrachloride gas ($SiCl_4$ abbreviation: STC) gas, trichlorosilane ($SiHCl_3$ abbreviation: TCS) gas, dichlorosilane ($SiH_2Cl_2$ abbreviation: DCS) gas, and monochlorosilane ($SiH_3Cl$ abbreviation: MCS) gas, may be used. In addition to the $N_2$ gas, a rare gas such as Ar gas, He gas, Ne gas, or Xe gas may be used as the inert gas.

Step 2

TEA Gas Supply

After Step 1 is finished and the residual gas in the process chamber 201 is removed, the valve 243b of the second gas supply pipe 232b is opened to allow TEA gas to flow through the second gas supply pipe 232b. A flow rate of the TEA gas flowing through the second gas supply pipe 232b is adjusted by means of the mass flow controller 241b. The TEA gas whose flow rate is adjusted is supplied into the process chamber 201 through the gas supply holes 250b of the second nozzle 249b. The TEA gas supplied into the process chamber 201 is activated (excited) by heat and is exhausted through the gas exhaust pipe 231. At this time, the TEA gas activated by heat is supplied to the wafer 200. At this time, the valve 243g is simultaneously opened to allow N₂ gas serving as the inert gas to flow through the second inert gas supply pipe 232g. A flow rate of the N₂ gas flowing through the second inert gas supply pipe 232g is adjusted by means of the mass flow controller 241g. The N₂ gas whose flow rate is adjusted is supplied into the process chamber 201 together with the TEA gas, and is exhausted through the gas exhaust pipe 231.

Furthermore, at this time, in order to prevent the TEA gas from entering the first nozzle 249a and the third nozzle 249c, the valves 243f and 243h are opened to allow the N₂ gas to flow through the first inert gas supply pipe 232f and the third inert gas supply pipe 232h. The N₂ gas is supplied into the process chamber 201 via the first gas supply pipe 232a and the first nozzle 249a or via the third gas supply pipe 232c and the third nozzle 249c, and is exhausted through the gas exhaust pipe 231.

At this time, the APC valve 244 is properly adjusted so that an inner pressure of the process chamber 201 reaches a pressure in a range of, for example, 1 to 13,300 Pa, and preferably, 399 to 3,990 Pa. It is possible to thermally activate the TEA gas by non-plasma by setting the inner pressure of the process chamber 201 to the relatively high pressure zone in this manner. Furthermore, soft reaction can be generated by activating and supplying the TEA gas by heat, and thus modification as will be described later can be softly performed. For example, a supply flow rate of the TEA gas controlled by the mass flow controller 241b is set to a flow rate of 100 to 2,000 sccm. For example, a supply flow rate of the N₂ gas controlled by the mass flow controllers 241g, 241f and 241h is set to a flow rate of 100 to 10,000 sccm. At this time, a partial pressure of the TEA gas in the process chamber 201 is set to the pressure in the range of 0.01 to 12,667 Pa. For example, a time required to supply the TEA gas activated by heat to the wafer 200, that is, the gas supply time (the emission time), is set to a time in a range of 1 to 120 seconds, and preferably 1 to 60 seconds. In this case, a temperature of the heater 207 is set so that a temperature of the wafer 200 reaches a temperature of 250 to 700° C., preferably, 300 to 650° C., and more preferably, 350 to 600° C. as in the above-mentioned Step 1.

By supplying the TEA gas to the wafer 200 under the conditions mentioned above, it is possible to allow the silicon-containing layer containing Cl as the initial layer formed on the wafer 200 in Step 1 to react with the TEA gas. That is, it is possible to react the halogen element (Cl) contained in the silicon-containing layer as the initial layer with the ligand (the ethyl group) contained in the TEA gas. Thereby, it is possible to pull out (separate) at least a part of the Cl atoms, i.e., atoms of halogen element contained in the initial layer from the initial layer, and to separate at least a part of the plurality of ethyl groups contained in the TEA gas from the TEA gas. Moreover, it is possible to combine N in the TEA gas, from which at least a part of the ethyl groups are separated, with Si contained in the initial layer. That is, it is possible for the N in the TEA gas that has had dangling bonds as a result of the separation of at least a part of the ethyl groups from the N in the TEA gas to combine with Si that is contained in the initial layer and has had dangling bonds or Si that already had dangling bonds to form Si—N bonds. Furthermore, it is also possible for C contained in the ethyl group serving as the ligand of the TEA gas or C originated from the ethyl group to combine with Si contained in the initial layer to form Si—C bonds. As a result, Cl is detached from the initial layer, N is newly incorporated in the initial layer, and C is newly incorporated in the initial layer.

It is possible to allow the silicon-containing layer containing Cl as the initial layer to suitably react with the TEA gas by supplying the TEA gas under the conditions mentioned above, and it is possible to generate the series of reactions mentioned above.

Cl is detached from the initial layer by the series of reactions, the N and the C are newly incorporated into the initial layer, and thus the silicon-containing layer containing Cl as the initial layer is changed (modified) to a first layer containing silicon (Si), nitrogen (N) and carbon (C), that is, a silicon carbonitride layer (SiCN layer). The first layer is a layer that contains Si, N and C having the thickness from less than one atomic layer to several atomic layers. Furthermore, the first layer is a layer that has relatively high ratios of Si component and C component, that is, a Si-rich or C-rich layer.

Furthermore, when forming the layer containing Si, N and C as the first layer, chlorine (Cl) contained in the silicon-containing layer containing Cl and hydrogen (H) contained in the TEA gas generate, for example, gaseous substances such as chlorine (Cl₂) gas, hydrogen (H₂) gas, and hydrogen chloride (HCl) gas during a process of modification reaction of the silicon-containing layer containing Cl by the TEA gas, which are discharged from the process chamber 201 via the gas exhaust pipe 231. That is, impurities such as Cl in the initial layer are separated from the initial layer by being pulled out and detached from the initial layer. Thereby, the first layer has fewer impurities such as Cl than the initial layer.

Residual Gas Removal

After the first layer is formed, the valve 243b of the first gas supply pipe 232b is closed to stop the supply of the TEA gas. At this time, the APC valve 244 of the gas exhaust pipe 231 is kept open to vacuum-exhaust an interior of the process chamber 201 using the vacuum pump 246 so that an unreacted gas remaining in the process chamber 201 or the TEA gas after contributing to formation of the first layer, or a reaction byproduct is eliminated from the process chamber 201. Furthermore, at this time, the valves 243g, 243f and 243h may also be kept open to maintain the supply of the N₂ gas as the inert gas into the process chamber 201. The N₂ gas acts as a purge gas. Therefore, it is possible to improve an effect of eliminating an unreacted gas remaining in the process chamber 201 or the TEA gas after contributing to formation of the first layer, or the reaction byproduct from the process chamber 201.

Furthermore, at this time, the gas remaining in the process chamber 201 may not be completely eliminated, and the interior of the process chamber 201 may not be completely purged. If a very small amount of gas remains in the process chamber 201, no adverse affect occurs in Step 3 performed thereafter. At this time, there is also no need to set a flow rate of the N₂ gas supplied into the process chamber 201 to a great flow rate. For example, it is possible to perform purging to such a level that no adverse affect occurs in Step 3 by supplying the same amount of the volume of the reaction tube 203 or the process chamber 201. In this manner, it is possible to shorten the purge time to improve throughput by not completely purging the interior of the process chamber 201. Furthermore, it is also possible to suppress the consumption of the N₂ gas to a minimum level.

As the amine-based source gas, it is possible to preferably use an ethylamine-based gas in which diethylamine ((C₂H₅)₂NH abbreviation: DEA), monoethylamine (C₂H₅NH₂ abbreviation: MEA) or the like is vaporized, in addition to triethylamine ((CH₅)₃N abbreviation: TEA), a methylamine-based gas in which trimethylamine ((CH₃)₃N abbreviation: TMA), dimethylamine ((CH₃)₂NH abbreviation: DMA), monomethylamine (CH₃NH₂ abbreviation: MMA) or the like is vaporized, a propylamine-based gas in which tripropylamine ((C₃H₇)₃N abbreviation: TPA), dipropylamine ((C$_3$H$_7$)$_2$NH abbreviation: DPA), monopropylamine (C$_3$H$_7$NH$_2$ abbreviation: MPA) or the like is vaporized, an isopropylamine-based gas in which triisopropylamine ([(CH$_3$)$_2$CH]$_3$N abbreviation: TIPA), diisopropylamine ([(CH$_3$)$_2$CH]$_2$ abbreviation: DIPA), monoisopropylamine ((CH$_3$)$_2$CHNH$_2$ abbreviation: MIPA) or the like is vaporized, a butylamine-based gas in which tributylamine ((C$_4$H$_9$)$_3$N abbreviation: TBA), dibutylamine ((C$_4$H$_9$)$_2$NH abbreviation: DBA), monobutylamine (C$_4$H$_9$NH$_2$ abbreviation: MBA) or the like is vaporized, or an isobutylamine-based gas in which triisobutylamine ([(CH$_3$)$_2$CHCH$_2$]$_3$N abbreviation: diisobutylamine ([(CH$_3$)$_2$CHCH$_2$]$_2$NH abbreviation: DIBA), monoisobutylamine ((CH$_3$)$_2$CHCH$_2$NH$_2$ abbreviation: MIBA) or the like is vaporized. That is, as the amine-based gas, it is possible to preferably use at least one kind of gas of (C$_2$H$_5$)$_x$NH$_{3-x}$, (CH$_3$)$_x$NH$_{3-x}$, (C$_3$H$_7$)$_x$NH$_{3-x}$, [(CH$_3$)$_2$CH]$_x$NH$_{3-x}$, (C$_4$H$_9$)$_x$NH$_{3-x}$, and [(CH$_3$)$_2$CHCH$_2$]$_x$NH$_{3-x}$ (x is an integer from 1 to 3).

Furthermore, as the amine-based gas, it is preferable to use a gas that contains the three elements including carbon, nitrogen and hydrogen and has a composition wherein the number of carbon atoms is greater than that of nitrogen atoms in one molecule. That is, as an amine-based gas, it is preferable to use the gas containing at least one amine that is selected from the group consisting of TEA, DEA, MEA, TMA, DMA, TPA, DPA, MPA, TIPA, DIPA, MIPA, TBA, DBA, MBA, TIBA, DIBA and MIBA.

When using a chlorosilane-based source gas that contains a predetermined element (silicon) and a halogen element (chlorine) such as HCDS gas as the source gas, it is possible to improve the carbon concentration in the first layer formed in Step 2, that is, the carbon concentration in the finally formed SiOCN film or SiOC film by performing a process to be described later a predetermined number of times using an amine-based gas that contains the three elements including carbon, nitrogen and hydrogen and has a composition wherein the number of carbon atoms is greater than that of nitrogen atoms in one molecule such as TEA gas or DEA gas as a first reactive gas.

On the other hand, when using a chlorosilane-based source gas that contains a predetermined element (silicon) and a halogen element (chlorine) such as HCDS gas as the source gas, if a gas that contains the three elements including carbon, nitrogen and hydrogen and has a composition wherein the number of the carbon atoms is not greater than that of nitrogen atoms in one molecule such as an amine-based gas, for example, MMA gas or an organic hydrazine-based gas, for example, MMH gas or DMH gas (to be described later) is used as a first reactive gas, it is difficult to increase the carbon concentration in the first layer, that is, the carbon layer in the SiOCN film or the SiOC film, to the same degree as when the amine-based gas that contains the three elements including carbon, nitrogen and hydrogen and has a composition wherein the number of carbon atoms is greater than that of nitrogen atoms in one molecule such as TEA gas or DEA gas is used as a first reactive gas, and thus it is difficult to realize a suitable carbon concentration.

Furthermore, as the amine-based gas, it is preferable to use a gas that contains a plurality of ligands containing a carbon (C) atom in one molecule, that is, a gas that contains a plurality of hydrocarbon groups such as alkyl groups in one molecule. Specifically, as the amine-based gas, it is preferable to use a gas containing three or two ligands (hydrocarbon groups such as alkyl groups) containing carbon (C) atom in one molecule, and it is preferable to use a gas that contains at least one amine selected from the group consisting of TEA, DEA, TMA, DMA, TPA, DPA, TIPA, DIPA, TBA, DBA, TIBA and DIBA.

When using a chlorosilane-based source gas that contains a predetermined element (silicon) and a halogen element (chlorine) such as HCDS gas as the source gas, it is possible to improve the carbon concentration in the first layer, that is, the carbon concentration in the finally formed SiOCN film or SiOC film using an amine-based gas that contains the three elements including carbon, nitrogen and hydrogen and has a plurality of ligands containing a carbon atom in one molecule such as TEA gas or DEA gas, that is, an amine-based gas which contains a plurality of hydrocarbon groups such as alkyl groups in one molecule, as a first reactive gas.

Meanwhile, when using a chlorosilane-based source gas that contains a predetermined element (silicon) and a halogen element (chlorine) such as HCDS gas as the source gas, if a gas which does not contain a plurality of ligands containing a carbon atom in one molecule such as an amine-based gas, for example, MMA gas or an organic hydrazine-based gas, for example, MMH gas (to be described later) is used as a first reactive gas, it is difficult to increase the carbon concentration in the first layer, that is, the carbon layer in the SiOCN film or the SiOC film, to the same degree as when an amine-based gas that contains a plurality of ligands containing a carbon atom in one molecule is used as a first reactive gas, and thus it is difficult to realize a suitable carbon concentration.

Furthermore, it is possible to improve a cycle rate (thickness of a SiOCN layer or SiOC layer formed per unit cycle) by using an amine-based gas containing two ligands (hydrocarbon groups such as alkyl groups) containing a carbon atom in one molecule such as DEA gas as the first reactive gas, compared to when an amine-based gas including three ligands (hydrocarbon group such as alkyl group) containing a carbon atom in one molecule such as TEA gas is used. Furthermore, it is possible to increase the ratio (a ratio of the nitrogen concentration/carbon concentration) of the nitrogen concentration to the carbon concentration in the first layer, that is, the ratio (a ratio of the nitrogen concentration/carbon concentration) of the nitrogen concentration to the carbon concentration in the SiOCN film or the SiOC film.

On the other hand, it is possible to increase the ratio (a ratio of carbon concentration/nitrogen concentration) of the carbon concentration to the nitrogen concentration in the first layer, that is, the ratio (a ratio of carbon concentration/nitrogen concentration) of the carbon concentration to the nitrogen concentration in the SiOCN film or the SiOC film, by using the amine-based gas containing three ligands (hydrocarbon groups such as alkyl groups) containing a carbon atom in one molecule such as TEA gas as the first reactive gas compared to when an amine-based gas containing two ligands (hydrocarbon groups such as alkyl groups) containing a carbon atom in one molecule such as the DEA gas is used.

That is, it is possible to minutely adjust the cycle rate and the nitrogen concentration and the carbon concentration in the SiOCN film or the SiOC film by the number of ligands (the hydrocarbon such as the alkyl group) containing a carbon atom contained in the first reactive gas, that is, by suitably changing the kind of the first reactive gas.

As stated above, it is possible to increase the carbon concentration in the SiOCN film or the SiOC film by suitably changing the kind (composition) of the amine-based gas as the first reactive gas. In order to further increase the carbon concentration, for example, it is preferable to increase the inner pressure of the process chamber 201 when supplying the amine-based gas (the TEA gas) to the wafer 200, compared to the inner pressure of the process chamber 201 when supplying the chlorosilane-based source gas (the HCDS gas) to the wafer 200 in Step 1, and compared to the inner pressure of the process chamber 201 when supplying the oxygen-containing gas ($O_2$ gas) to the wafer 200 in Step 3 as will be described later. Furthermore, in this case, the inner pressure of the process chamber 201 when supplying the $O_2$ gas to the wafer 200 in Step 3 is preferably higher than the inner pressure of the process chamber 201 when supplying the HCDS gas to the wafer 200 in Step 1. That is, when setting the inner pressure of the process chamber 201 when supplying the HCDS gas to the wafer 200 to $P_1$ [Pa], setting the inner pressure of the process chamber 201 when supplying the TEA gas to the wafer 200 to $P_2$ [Pa], and setting the inner pressure of the process chamber 201 when supplying the $O_2$ gas to the wafer 200 to $P_3$ [Pa], the pressures $P_1$, $P_2$ and $P_3$ may be set so as to satisfy the relationship $P_2 > P_1, P_3$, and, more preferably, may be set so as to satisfy the relationship $P_2 > P_3 > P_1$. That is, it is preferable to set the inner pressure of the process chamber 201 when supplying the TEA gas to the wafer 200 in Steps 1 to 3 to the highest level.

On the other hand, in order to suitably suppress an increase in the carbon concentration in the SiOCN film or the SiOC film, it is preferable to set the inner pressure of the process chamber 201 when supplying the amine-based gas (TEA gas) to the wafer 200 to be equal to or less than the inner pressure of the process chamber 201 when supplying an oxygen-containing gas ($O_2$ gas) to the wafer 200 in Step 3 as will be described later, or to be equal to or less than the inner pressure of the process chamber 201 when supplying the chlorosilane-based source gas (HCDS gas) to the wafer 200. That is, the above-mentioned pressures $P_1$, $P_2$ and $P_3$ may be preferably set so as to satisfy the relationship $P_3 \geq P_2$ or $P_1 \geq P_2$ and, more preferably, may be set so as to satisfy the relationship $P_3, P_1 \geq P_2$.

That is, it is possible to minutely adjust the carbon concentration in the SiOCN film or the SiOC film to be formed by suitably controlling the inner pressure of the process chamber 201 when supplying the amine-based gas.

In addition to the $N_2$ gas, a rare gas such as Ar gas, He gas, Ne gas, or Xe gas may be used as the inert gas.

Step 3

$O_2$ Gas Supply

After Step 2 is finished and the residual gas in the process chamber 201 is removed, the valve 243c of the third gas supply pipe 232c is opened to allow $O_2$ gas to flow through the third gas supply pipe 232c. A flow rate of the $O_2$ gas flowing through the third gas supply pipe 232c is adjusted by means of the mass flow controller 241c. The $O_2$ gas whose flow rate is adjusted is supplied into the process chamber 201 through the gas supply holes 250c of the third nozzle 249c. The $O_2$ gas supplied into the process chamber 201 is activated (excited) by heat and is exhausted through the gas exhaust pipe 231. At this time, $O_2$ gas activated by heat is supplied to the wafer 200. At this time, the valve 243h is simultaneously opened to allow $N_2$ gas to flow through the third inert gas supply pipe 232h. The $N_2$ gas is supplied into the process chamber 201 together with the $O_2$ gas, and is exhausted through the gas exhaust pipe 231. Furthermore, at this time, in order to prevent the $O_2$ gas from entering the first nozzle 249a and the second nozzle 249b, the valves 243f and 243g are opened to allow the $N_2$ gas to flow through the first inert gas supply pipe 232f and the second inert gas supply pipe 232g. The $N_2$ gas is supplied into the process chamber 201 via the first gas supply pipe 232a and the first nozzle 249a or via the second gas supply pipe 232b and the second nozzle 249b, and is exhausted through the gas exhaust pipe 231.

At this time, the APC valve 244 is properly adjusted so that an inner pressure of the process chamber 201 reaches a pressure in a range of, for example, 1 to 3,000 Pa. It is possible to thermally activate the $O_2$ gas by non-plasma by setting the inner pressure of the process chamber 201 to the relatively high pressure zone in this manner. Furthermore, soft reaction can be generated by activating and supplying the $O_2$ gas by heat, and thus oxidation as will be described later can be softly performed. For example, a supply flow rate of the $O_2$ gas controlled by the mass flow controller 241c is set to a flow rate of 100 to 10,000 sccm. For example, a supply flow rate of the $N_2$ gas controlled by the mass flow controllers 241h, 241f and 241g is set to a flow rate of 100 to 10,000 sccm. At this time, a partial pressure of the $O_2$ gas in the process chamber 201 is set to the pressure in the range of 0.01 to 2,970 Pa. For example, a time required to supply $O_2$ gas activated by heat to the wafer 200, that is, the gas supply time (the emission time), is set to a time of a range of 1 to 120 seconds, and preferably 1 to 60 seconds. In this case, a temperature of the heater 207 is set so that a temperature of the wafer 200 reaches a temperature of 250 to 700° C., preferably, 300 to 650° C., and more preferably, 350 to 600° C. as in the above-mentioned Step 1.

At this time, the gas flowing through the process chamber 201 is the $O_2$ gas that is thermally activated by increasing the inner pressure of the process chamber 201, and neither HCDS gas nor the TEA gas flows through the process chamber 201. Thus, $O_2$ gas does not cause the gas phase reaction, and the activated $O_2$ gas reacts with at least a part of the first layer that contains Si, N and C formed on the wafer 200 in Step 2. Thereby, the first layer is oxidized and is modified to a second layer containing silicon, oxygen, carbon and nitrogen, that is, a silicon oxycarbonitride layer (SiOCN layer), or a layer containing silicon, oxygen and carbon, that is, a silicon oxycarbide layer (SiOC layer).

Furthermore, the first layer can be thermally oxidized to be modified (changed) to the SiOCN layer or the SiOC layer by activating the $O_2$ gas by heat to flow through the process chamber 201. At this time, the first layer is modified to the SiOCN layer or the SiOC layer while adding the O component to the first layer. Furthermore, at this time, the Si—O bonds in the first layer increase by thermal oxidation action due to the $O_2$ gas, the Si—N bonds, the Si—C bonds and the Si—Si bonds decrease, and the ratio of the N component, the ratio of the C component and the ratio of the Si component in the first layer decrease. Moreover, at this time, most of the N component can be detached to reduce the N component to an impurity level by extending a thermal oxidation time or increasing an oxidation force in thermal oxidation, or the N component can be substantially consumed. That is, it is possible to modify the first layer to the SiOCN layer or the SiOC layer while changing the composition ratio to increase the oxygen concentration and reduce the nitrogen concentration, the carbon concentration and the silicon concentration. Furthermore, at this time, it is possible to minutely adjust the ratio of the O component in the SiOCN layer or the SiOC layer, that is, the oxygen concentration, by controlling the processing conditions such as the inner pressure of the process chamber 201 and the gas supply time, and thus it is possible to more closely control the composition ratio of the SiOCN layer or the SiOC layer.

Furthermore, it is determined that the C component in the first layer formed in Steps 1 and 2 is rich compared to the N component. For example, in some cases, in a certain test, the carbon concentration was twice the nitrogen concentration or more. That is, the C component and the N component remain in the first layer and the first layer is modified to the SiOCN layer by stopping the oxidation before the N component in the first layer is completely detached by thermal oxidation action due to the $O_2$ gas, that is, while the N component still remains. Furthermore, the C component remains in the first layer even in the step in which the detachment of most of the N component is finished in the first layer by thermal oxidation due to the $O_2$ gas, and the first layer is modified to the SiOC layer by stopping the oxidation in this state. That is, the ratio of the C component, that is, the carbon concentration, can be controlled by controlling the gas supply time (the oxidation processing time) and the oxidation force, and any one layer of the SiOCN layer or the SiOC layer can be formed while adjusting the composition ratio. Furthermore, at this time, it is possible to minutely adjust the ratio of the 0 component on the SiOCN layer or the SiOC layer, that is, the oxygen concentration, by controlling the processing conditions such as the pressure and the gas supply time in the process chamber 201, and thus it is possible to more closely control the composition ratio of the SiOCN layer or the SiOC layer.

Furthermore, at this time, it is preferable to prevent the oxidation reaction of the first layer from being saturated. For example, when forming the first layer of the thickness from less than one atomic layer to several atomic layers in Steps 1 and 2, it is preferable to oxidize a part of the first layer. In this case, the oxidation is performed under the condition that the oxidation of the first layer is not saturated so as not to oxidize the whole first layer of the thickness from less than one atomic layer to several atomic layers.

Furthermore, in order to prevent the oxidation reaction of the first layer from being saturated, although the processing conditions in Step 3 may be the above-mentioned processing conditions, it is easy to prevent the oxidation reaction of the first layer from being saturated by setting the processing conditions in Step 3 to the following processing conditions.

Wafer temperature: 500 to 650° C.
Pressure in process chamber: 133 to 2,666 Pa
$O_2$ gas partial pressure: 33 to 2,515 Pa
$O_2$ gas supply flow rate: 1,000 to 5,000 sccm
$N_2$ gas supply flow rate: 300 to 3,000 sccm
$O_2$ gas supply time: 6 to 60 seconds Residual Gas Removal After the second layer is formed, the valve 243c of the third gas supply pipe 232c is closed to stop the supply of the $O_2$ gas. At this time, the APC valve 244 of the gas exhaust pipe 231 is kept open to vacuum-exhaust an interior of the process chamber 201 using the vacuum pump 246 so that an unreacted gas remaining in the process chamber 201. $O_2$ gas that has contributed to formation of the first layer, or a reaction byproduct is eliminated from the process chamber 201. Furthermore, at this time, the valves 243h, 243f and 243g may also be kept open to maintain the supply of the $N_2$ gas as the inert gas into the process chamber 201. The $N_2$ gas acts as a purge gas. Therefore, it is possible to improve an effect of eliminating an unreacted gas remaining in the process chamber 201, $O_2$ gas that has contributed to formation of the second layer, or the reaction byproduct from the process chamber 201.

Furthermore, at this time, the gas remaining in the process chamber 201 may not be completely eliminated, and the interior of the process chamber 201 may not be completely purged. If a very small amount of gas is remained in the process chamber 201, no adverse affect occurs in Step 4 performed thereafter. At this time, there is also no need to set flow rate of the $N_2$ gas supplied into the process chamber 201 to a great flow rate. For example, it is possible to perform purging to such a level that no adverse affect occurs in Step 4 by supplying the same amount of the volume of the reaction tube 203 or the process chamber 201. In this manner, it is possible to shorten the purge time to improve throughput by not completely purging the interior of the process chamber 201. Furthermore, it is also possible to suppress the consumption of the $N_2$ gas to a minimum level.

As the oxygen-containing gas, in addition to the $O_2$ gas, nitrous oxide ($N_2O$) gas, nitric oxide (NO) gas, nitrogen dioxide ($NO_2$) gas, ozone ($O_3$) gas, hydrogen ($H_2$) gas+oxygen ($O_2$) gas, $H_2$ gas+$O_3$ gas, vapor ($H_2O$) gas, carbon monoxide (CO) gas, carbon dioxide ($CO_2$) gas or the like may be used. In addition to the $N_2$ gas, a rare gas such as Ar gas, He gas, Ne gas, or Xe gas may be used as the inert gas.

Step 4

$H_2$ Gas Supply

After Step 3 is finished and the residual gas in the process chamber 201 is removed, the valve 243e of the fifth gas supply pipe 232e is opened to allow $H_2$ gas to flow through the fifth gas supply pipe 232e. A flow rate of the $H_2$ gas flowing through the fifth gas supply pipe 232e is adjusted by means of the mass flow controller 241e. The $H_2$ gas whose flow rate is adjusted is supplied into the process chamber 201 through the gas supply holes 250c of the third nozzle 249c. The $H_2$ gas supplied into the process chamber 201 is activated (excited) by heat and is exhausted through the gas exhaust pipe 231. At this time, $H_2$ gas activated by heat is supplied to the wafer 200. At this time, the valve 243h is simultaneously opened to allow $N_2$ gas to flow through the third inert gas supply pipe 232h. The $N_2$ gas is supplied into the process chamber 201 together with the $H_2$ gas, and is exhausted through the gas exhaust pipe 231. Furthermore, at this time, in order to prevent the $H_2$ gas from entering the first nozzle 249a and the second nozzle 249b, the valves 243f and 243g are opened to allow the $N_2$ gas to flow through the first inert gas supply pipe 232f and the second inert gas supply pipe 232g. The $N_2$ gas is supplied into the process chamber 201 via the first gas supply pipe 232a and the first nozzle 249a or via the second gas supply pipe 232b and the second nozzle 249b, and is exhausted through the gas exhaust pipe 231.

At this time, the APC valve 244 is properly adjusted so that an inner pressure of the process chamber 201 reaches a pressure in a range of, for example, 1 to 3,000 Pa. It is possible to thermally activate the $H_2$ gas by non-plasma by setting the inner pressure of the process chamber 201 to the relatively high pressure zone in this manner. Furthermore, soft reaction can be generated by activating and supplying the $H_2$ gas by heat, and thus oxidation as will be described later can be softly performed. For example, a supply flow rate of the $H_2$ gas controlled by the mass flow controller 241e is set to a flow rate of 100 to 10,000 sccm. The supply flow rate of the $N_2$ gas controlled by the mass flow controllers 241h, 241f and 241g is within the range of, for example, 100 to 10,000 sccm. At this time, a partial pressure of the $H_2$ gas in the process chamber 201 is set to the pressure in the range of 0.01 to 2,970 Pa. For example, a time required to supply $H_2$ gas activated by heat to the wafer 200, that is, the gas supply time (the emission time), is set to a time of a range of 1 to 120 seconds, and preferably 1 to 60 seconds. In this case, a temperature of the heater 207 is set so that a temperature of the wafer 200 reaches a temperature of 250 to 700° C., preferably, 300 to 650° C., and more preferably, 350 to 600° C. as in the above-mentioned Steps 1 to 3.

At this time, the gas flowing through the process chamber 201 is the $H_2$ gas that is thermally activated by increasing the inner pressure of the process chamber 201, and neither the HCDS gas, the TEA gas nor the $O_2$ gas flows through the process chamber 201. Thus, $H_2$ gas does not cause the gas phase reaction, and the activated $H_2$ gas reacts with a part of the second layer formed on the wafer 200 in Step 3. Thereby, the surface of the second layer is modified to the surface that contains many OH groups (adsorption sites). It is possible to promote the formation of the silicon-containing layer containing Cl on the second layer when performing Step 1 in the next cycle again, that is, the deposition of Si on the second layer or the adsorption of the HCDS gas, by modifying the surface of the second layer in this manner. Moreover, thereby, it is possible to improve the film formation rate of the SiOCN film and the SiOC film.

Residual Gas Removal

After the surface of the second layer is modified, the valve 243e of the fifth gas supply pipe 232e is closed to stop the supply of the $H_2$ gas. At this time, the APC valve 244 of the gas exhaust pipe 231 is kept open to vacuum-exhaust an interior of the process chamber 201 using the vacuum pump 246 so that an unreacted gas remaining in the process chamber 201, $H_2$ gas that has contributed to formation of the first layer, or a reaction byproduct is eliminated from the process chamber 201. Furthermore, at this time, the valves 243h, 243f and 243g may also be kept open to maintain the supply of the $N_2$ gas as the inert gas into the process chamber 201. The $N_2$ gas acts as a purge gas. Therefore, it is possible to improve an effect of eliminating an unreacted gas remaining in the process chamber 201, $H_2$ gas that has contributed to formation of the second layer, or the reaction byproduct from the process chamber 201.

Furthermore, at this time, the gas remaining in the process chamber 201 may not be completely eliminated, and the interior of the process chamber 201 may not be completely purged. If a very small amount of gas remains in the process chamber 201, no adverse affect occurs in Step 1 performed thereafter. At this time, there is also no need to set a flow rate of the $N_2$ gas supplied into the process chamber 201 to a great flow rate. For example, it is possible to perform purging to such a level that no adverse affect occurs in Step 1 by supplying the same amount of the volume of the reaction tube 203 or the process chamber 201. In this manner, it is possible to shorten the purge time to improve throughput by not completely purging the interior of the process chamber 201. Furthermore, it is also possible to suppress the consumption of the $N_2$ gas to a minimum level.

As the hydrogen-containing gas, in addition to the $H_2$ gas, ammonia ($NH_3$) gas or the like may be used. In addition to the $N_2$ gas, a rare gas such as Ar gas, He gas, Ne gas, or Xe gas may be used as the inert gas.

Performing Predetermined Number of Times

It is possible to form a film containing silicon, oxygen, carbon and nitrogen of a predetermined composition and a predetermined film thickness, that is, a silicon oxycarbonitride layer (SiOCN layer), or a layer containing silicon, oxygen and carbon, that is, silicon oxycarbide layer (SiOC layer) on the wafer 200 by setting the above-mentioned Steps 1 to 4 as one cycle and performing the cycle once or more (a predetermined number of times). Furthermore, it is possible to repeat the above-mentioned cycle multiple times. That is, it is preferable to set the thickness of the SiOCN layer and the SiOC layer formed per one cycle to be smaller than a desired film thickness, and repeat the above-mentioned cycle multiple times until a desired film thickness is obtained.

Furthermore, when performing the cycle multiple times, the expression describing "supplying a predetermined gas to the wafer 200" in each Step after at least a second cycle refers to "supplying a predetermined gas to the layer formed on the wafer 200, that is, to the outermost surface of the wafer 200 as the stacked body," and the expression "forming a predetermined layer on the wafer 200" refers to "forming a predetermined layer on the layer formed on the wafer 200, that is, on the outermost layer of the wafer 200 as the stacked body." Other points are the same as mentioned above. Furthermore, other points are also the same as in the respective modified examples and other embodiments that will be described later.

Purge and Return to Atmospheric Pressure

When a film formation treatment of forming the SiOCN film and the SiOC film having a predetermined film thickness is performed, the valves 243f, 243g and 243h are opened to supply $N_2$ as an inert gas into the process chamber 201 through the first inert gas supply pipe 232f, the second inert gas supply pipe 232g and the third inert gas supply pipe 232h, and the $N_2$ gas is exhausted through the gas exhaust pipe 231. The $N_2$ gas acts as the purge gas, and thereby an interior of the process chamber 201 is purged with the inert gas, and the gas and the reaction byproduct remaining in the process chamber 201 are removed from the process chamber 201 (purging). Thereafter, an atmosphere in the process chamber 201 is replaced with the inert gas (inert gas replacement) so that an inner pressure of the process chamber 201 returns to normal pressure (returning to atmospheric pressure).

Boat Unloading and Wafer Discharge

Next, the seal cap 219 is lowered by means of the boat elevator 115, a lower end of the reaction tube 203 is opened, and the processed wafer 200 is then unloaded from the lower end of the reaction tube 203 out of the reaction tube 203 in a state in which the processed wafer 200 is supported by the boat 217 (boat unloading). Thereafter, the processed wafer 200 is discharged from the boat 217 (wafer discharging).

(3) Effects of Present Embodiment

According to the present embodiment, one or more of the following effects are provided.

(a) According to the present embodiment, by performing Step 4 of supplying $H_2$ gas serving as the hydrogen-containing gas and modifying the surface of the second layer to the surface containing many OH groups (adsorption sites) after forming the second layer by performing Steps 1 to 3, it is possible to promote the formation of the silicon-containing layer containing Cl on the second layer when performing Step 1 again in the next cycle, that is, the deposition of Si on the second layer and the adsorption of the HCDS gas. As a result, it is possible to improve film information rate of the SiOCN film and the SiOC film and improve productivity during the film formation.

(b) According to the present embodiment, it is possible to adjust the composition ratio of oxygen, carbon and nitrogen in the SiOCN film and the SiOC film, by performing Step 3 of supplying $O_2$ gas serving as the oxygen-containing gas as the second reactive gas, and oxidizing and modifying the first layer to the SiOCN layer and the SiOC layer as the second layer, after the first layer containing Si, N and C by alternately performing Steps 1 and 2 once. Furthermore, at this time, by activating and supplying the $O_2$ gas by heat, the Si—O bonds in the SiOCN film and the SiOC film are increased, and the Si—C bonds, the Si—N bonds and the Si—Si bonds can be reduced. That is, it is possible to change the composition ratio such that the oxygen concentration is increased and the nitrogen concentration, the carbon concentration and the silicon concentration are reduced. Furthermore, at this time, it is possible to change the composition ratio such that the oxygen concentration is further increased by extending the thermal oxidation time or increasing the oxidation force in thermal oxidation, and such that the nitrogen concentration, the carbon concentration and the silicon concentration are further reduced. Furthermore, at this time, it is possible to minutely adjust the ratio of the O component in the SiOCN film or the SiOC film, that is, the oxygen concentration, by controlling the processing conditions such as the inner pressure of the process chamber 201 and the gas supply time, and thus it is possible to more closely control the composition ratio of the SiOCN film or the SiOC film. Thereby, it is possible to adjust the dielectric constant of the SiOCN film and the SiOC film formed, improve etching tolerance, or improve the leak tolerance.

(c) According to the present embodiment, it is possible to increase the oxygen concentration in the SiOCN film and the SiOC film using the amine-based gas that contains the three elements including carbon, nitrogen and hydrogen, and has the composition wherein the number of carbon atoms is greater than that of nitrogen atoms in one molecule, as the first reactive gas.

Particularly, it is possible to raise the carbon concentration in the SiOCN film and the SiOC film by using an amine-based gas that contains a plurality of ligands containing a carbon (C) atom in one molecule, that is, an amine-based gas that contains a plurality of hydrocarbon groups such as alkyl groups in one molecule, as the first reactive gas. Specifically, it is possible to raise the carbon concentration in the SiOCN film and the SiOC film using TEA gas, TPA gas, TIPA gas, TBA gas, and TIBA gas containing three ligands (hydrocarbon groups such as alkyl groups) containing a carbon (C) atom in one molecule, and DEA gas, DMA gas, DPA gas, DIPA gas, DBA gas, DIMA gas containing two ligands (hydrocarbon groups such as alkyl groups) containing a carbon (C) atom in one molecule, as the first reactive gas.

(d) For example, according to the present embodiment, it is possible to minutely adjust the cycle rate (the thickness of the SiOCN layer and the SiOC layer formed an unit cycle) and the nitrogen concentration and the carbon concentration in the SiOCN film and the SiOC film, by the number (the number of hydrocarbon groups such as alkyl groups) of carbon atoms contained in the first reactive gas, that is, by suitably changing the kind of the first reactive gas.

For example, it is possible to improve a cycle rate by using the amine-based gas containing two ligands (hydrocarbon groups such as alkyl groups) containing a carbon atom in one molecule, such as the DEA gas, as the first reactive gas, compared to a case of using the amine-based gas containing three ligands (hydrocarbon groups such as alkyl groups) containing a carbon atom in one molecule such as the TEA gas. Furthermore, it is possible to increase the ratio (a ratio of the nitrogen concentration/carbon concentration) of the nitrogen concentration to the carbon concentration in the first layer (a ratio of the nitrogen concentration/carbon concentration in the SiOCN film or the SiOC film).

Furthermore, for example, it is possible to improve the ratio (a ratio of the carbon concentration/nitrogen concentration) of the carbon concentration to the nitrogen concentration in the first layer (a ratio of the nitrogen concentration/carbon concentration in the SiOCN film or the SiOC film by using the amine-based gas containing three ligands (hydrocarbon group such as an alkyl group) containing the carbon atom in one molecule such as the TEA gas, as the first reactive gas, compared to a case of using the amine-based gas containing two ligands (hydrocarbon groups such as alkyl groups) containing the carbon atom in one molecule such as the DEA gas.

(e) According to the present embodiment, it is possible to minutely adjust the carbon concentration in the SiOCN film and the SiOC film by controlling the inner pressure of the process chamber 201 when supplying the first reactive gas.

For example, it is possible to further raise the carbon concentration in the SiOCN film and the SiOC film by setting the pressure of the process chamber 201 when supplying the TEA gas to the wafer 200 in Step 2 to be higher than the pressure of the process chamber 201 when supplying the HCDS gas to the wafer 200 in Step 1. Furthermore, it is possible to further raise the carbon concentration in the SiOCN film and the SiOC film by setting the pressure of the process chamber 201 when supplying the TEA gas to the wafer 200 to be higher than the pressure of the process chamber 201 when supplying the $O_2$ gas to the wafer 200 in Step 3.

Furthermore, for example, it is possible to suitably suppress an amount of increase of the carbon concentration in the SiOCN film and the SiOC film by setting the pressure of the process chamber 201 when supplying the TEA gas to the wafer 200 in Step 2 to be equal to or less than the pressure of the process chamber 201 when supplying the $O_2$ gas to the wafer 200 in Step 3, or by setting the pressure of the process chamber 201 when supplying the TEA gas to the wafer 200 in Step 2 to be equal to or less than the pressure of the process chamber 201 when supplying the HCDS gas to the wafer 200 in Step 1.

(f) According to the present embodiment, it is possible to improve reaction control characteristics, particularly, composition control characteristics, when forming the SiOCN film and the SiOC film by using TEA gas that contains the three elements including carbon, nitrogen and hydrogen as the first reactive gas and is a silicon-free and metal-free amine-based gas. That is, in the film formation sequence of the present embodiment, it is possible to improve reaction control characteristics, particularly, composition control characteristics, when reacting the first reactive gas with the silicon-containing layer containing Cl to form the first layer, using the TEA gas as the first reactive gas, for example, compared to a film formation sequence using tetrakisethylmethylaminohafnium ($Hf[N(C_2H_5)(CH_3)]_4$ abbreviation: TEMAH) gas including the four elements hafnium, carbon, nitrogen and hydrogen as the first reactive gas.

(g) According to the present embodiment, it is possible to reduce the impurity concentration in the formed SiOCN film and SiOC film by using TEA gas that contains the three elements including carbon, nitrogen and hydrogen and is a silicon-free and metal-free amine-based gas as the first reactive gas. That is, in the film formation sequence of the present embodiment using the TEA gas as the first reactive gas, it is possible to reduce a mixture ratio of the impurity elements into the first layer formed by the reaction of the reactive gas and the silicon-containing layer containing Cl, and it is possible to reduce the impurity concentration in formed SiOCN film and the SiOC film, compared to the film formation sequence, for example, using TEMAH gas or the like including the four elements hafnium, carbon, nitrogen and hydrogen as the first reactive gas.

(h) According to the present embodiment, it is possible to improve film thickness regularity of the in-wafer 200 surface and inter-wafer 200 surface of the formed SiOCN film and the SiOC film by using TEA gas that contains the three elements including carbon, nitrogen and hydrogen and is a silicon-free and metal-free amine-based gas as the first reactive gas. That is, since the TEA gas containing the three elements including carbon, nitrogen and hydrogen has high reaction reactivity with respect to the silicon-containing layer containing Cl, for example, compared to the TEMAH gas including the four elements hafnium, carbon, nitrogen and hydrogen, the film formation sequence of the present invention using the TEA gas as the first reactive gas is able to reliably and regularly perform the reaction of the first reactive gas and the silicon-containing layer containing Cl throughout the in-wafer 200 surface and the inter-wafer 200 surface. As a result, it is possible to improve regularity of film thickness of the in-wafer 200 surface and the inter-wafer 200 surface of the SiOCN film and the SiOC film.

(4) Modified Example

Although an example of setting Steps 1 to 4 to one cycle and repeating the cycle has been described in the above-mentioned film formation sequence illustrated in FIGS. 4 and 5, the film formation sequence according to the present embodiment may be changed as below, without being limited thereto.

Figure 6A:
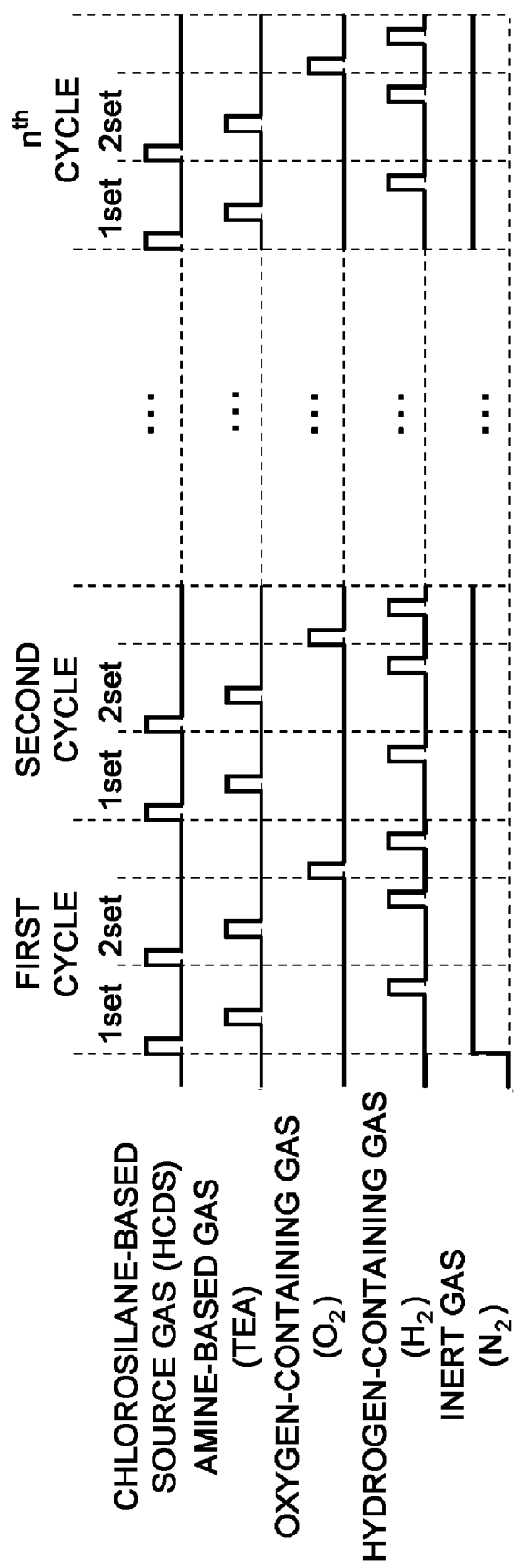

For example, as in modified example 1 illustrated in FIG. 6A, Steps 1, 2 and 4 may be set to one set and the set performed a predetermined number of times (m times), and Steps 3 and 4 may be performed, all of which may be set to one cycle and the cycle may be performed a predetermined number of times (n times). FIG. 6A illustrates an example in which the set of Steps 1, 2 and 4 is performed twice in each cycle, that is, an example in which the process of performing the set of Steps 1, 2 and 4 twice, and a process of performing Steps 3 and 4 is set to one cycle and the cycle is performed a predetermined number of times (n times). The present modified example is different from the film formation sequence illustrated in FIGS. 4 and 5 only in that the set of Steps 1, 2 and 4 is performed a predetermined number of times (m times), then the set of Steps 3 and 4 is performed and this set is set to the one cycle, and everything else other than the difference described above the same as is the above-mentioned film formation sequence. Furthermore, Step 4 may be omitted from the set, Steps 1 and 2 may be set to one set, and the set may be performed a predetermined number of times (m times). Then, the steps 3 and 4 may be performed, all of which is set to one cycle, the cycle may be performed a predetermined number of times (n times). That is, Step 4 may be performed at the end of the cycle only once.

Furthermore, for example, as in modified example 2 illustrated in FIG. 6B, Steps 1, 2, 4, 1, 3 and 4 may be sequentially performed and set to one cycle, and the cycle may be performed a predetermined number of times (n times). Furthermore, the present modified example is different from the above-mentioned film formation sequence illustrated in FIGS. 4 and 5 only in that Steps 1, 2, 4, 1, 3 and 4 are set to one cycle, and everything else other than the difference described above is the same as in the above-mentioned film formation sequence. Furthermore, the first Step 4 may be omitted from the cycle, Steps 1, 2, 1, 3 and 4 may be set to one cycle, and this cycle may be performed a predetermined number of times (n times). That is, Step 4 may be performed at the end of the cycle only once.

Figure 6C:
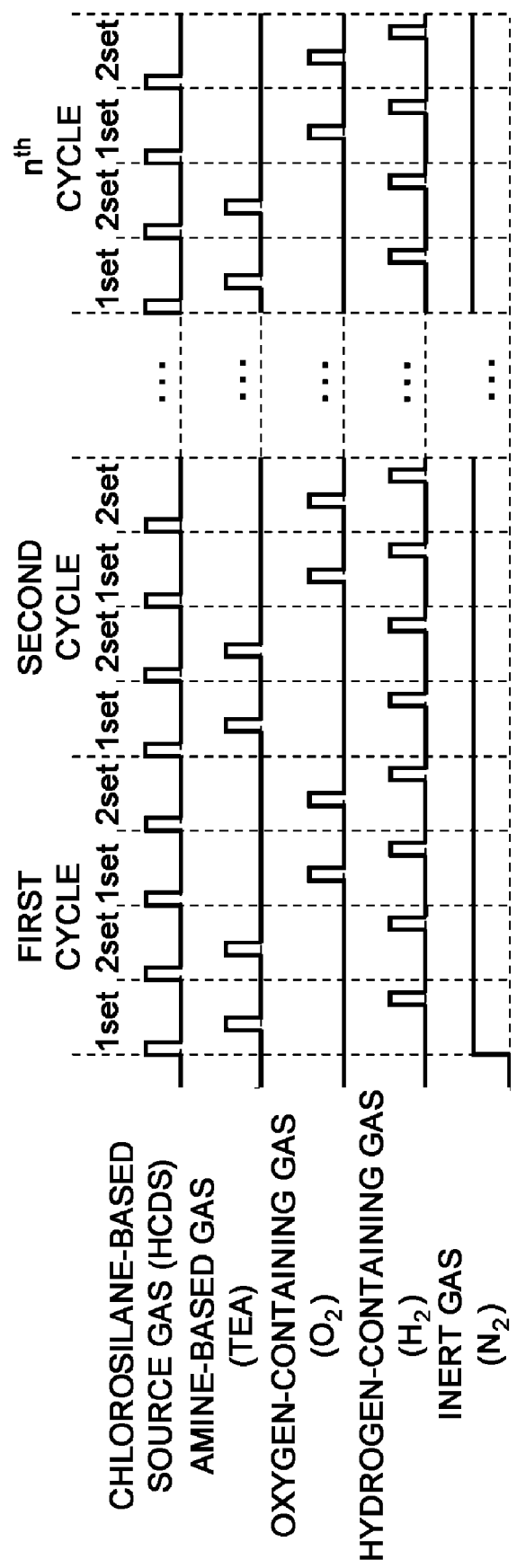

Furthermore, for example, as in modified example 3 illustrated in FIG. 6C, Steps 1, 2 and 4 may be set to one set and this set may be performed a predetermined number of times (m times), then Steps 1, 3 and 4 is set to one set and this set is performed a predetermined number of times (m' times), and the combinations thereof may be set to one cycle and the cycle may be performed a predetermined number of times (n times). FIG. 6C illustrates an example in which the set of Steps 1, 2 and 4 and the set of Steps 1, 3 and 4 are performed twice in each cycle, that is, an example in which a process of performing the set of Steps 1, 2 and 4 twice, and a process of performing the set of Steps 1, 3 and 4 twice is set to one cycle and the cycle is performed a predetermined number of times (n times). The present modified example is different from the above-mentioned film formation sequence illustrated in FIGS. 4 and 5 only in that the set of Steps 1, 2 and 4 is performed a predetermined number of times (m times), then the set of Steps 1, 3 and 4 is performed a predetermined number of times (m' times), and this set is set to one cycle, and everything else other than the difference described above is the same as in the above-mentioned film formation sequence. Furthermore, in the present modified example, a case in which the number (m) of times the set of Steps 1, 2 and 4 is performed is set to one, and the number (m') of times the set of Steps 1, 3 and 4 is performed is set to one time corresponds to the film formation sequence of modified example 2 illustrated in FIG. 6B. Furthermore, Step 4 may be omitted from each set, Steps 1 and 2 may be set to one set and this set may be performed a predetermined number of times (m times), Steps 1 and 3 may be set to one set and this set may be performed a predetermined number of times (m' times), and then Step 4 may be performed, and all of this may be set to one cycle, and this cycle may be performed a predetermined number of times (n times). That is, Step 4 may be performed at the end of the cycle only once.

In the modified example, the same effects as the above-mentioned film formation sequence illustrated in FIGS. 4 and 5 can be obtained. Furthermore, according to the modified example, it is possible to further closely control the ratio of the silicon component, the nitrogen component, the carbon component and the oxygen component in the SiOCN film or the SiOC film, and it is possible to control characteristics of the composition ratio of the SiOCN film or the SiOC film.

For example, it is possible to increase an absolute amount of the silicon component, the nitrogen component, and the carbon component of the first layer by increasing the number (m) of sets including Steps 1, 2 and 4 in the modified example 1. In this manner, it is possible to perform the control so that the ratio of the silicon component, the nitrogen component, and the carbon component relative to the oxygen component of the finally formed SiOCN film or SiOC film becomes higher, by oxidizing the first layer in which the absolute amounts of each component are increased in Step 3. It is possible to perform the control so that the ratio of the silicon component, the nitrogen component, and the carbon component relative to the oxygen component of the finally formed SiOCN film or SiOC film becomes higher.

Furthermore, for example, it is possible to reduce an absolute amount of the silicon component, the nitrogen component, and the carbon component of the first layer by decreasing the number (m) of sets including Steps 1, 2 and 4 in the modified example 1. In this manner, it is possible to perform the control so that the ratio of the silicon component, the nitrogen component, and the carbon component relative to the oxygen component of the finally formed SiOCN film or SiOC film becomes lower, by oxidizing the first layer in which the absolute amounts of each component are decreased in Step 3. It is possible to perform the control so that the ratio of the silicon component, the nitrogen component, and the carbon component relative to the oxygen component of the finally formed SiOCN film or SiOC film becomes lower.

In the modified examples 2 and 3, it is also possible to further closely control the ratio of the silicon component, the nitrogen component, the carbon component and the oxygen component in the SiOCN film or the SiOC film by the same principle.

Furthermore, according to the modified example, it is possible to increase the thickness of the layer formed for each cycle, and thus the cycle rate (the thickness of the SiOCN film or the SiOC film formed for a unit cycle) can be improved. Moreover, the film formation rate can thereby be improved.

For example, in the modified examples 1 and 3, it is possible to increase the layer number of the first layer formed in each cycle, that is, the thickness of the first layer formed in each cycle by the set number (m), by increasing the number (m) of sets including Steps 1, 2 and 4, and thus the cycle rate can be improved. Furthermore, in the modified example 3, it is possible to increase the layer number of the SiO layer as the second layer formed in each cycle, that is, the thickness of the second layer formed in each cycle by the set number (m'), by increasing the number (m') of sets including Steps 1, 3 and 4, and thus the cycle rate can be improved. Furthermore, since Step 1 in each cycle is performed twice in the modified example 2, it is also possible to improve the cycle rate in the modified example 2. Moreover, it is also thereby possible to improve the film formation rate.

Furthermore, in the modified examples 2 and 3, the sequence of the process of forming the first layer including Si, N and C and the process of forming the SiO layer as the second layer may be changed, the process of forming the first layer may be performed after performing the process of forming the second layer (SiO), and this may be set to one cycle. Furthermore, the modified examples may be arbitrarily modified and used.

Second Embodiment of Present Invention

Next, a second embodiment of the present invention will be described.

Although an example of forming a silicon oxycarbonitride film or a silicon oxycarbide film of a predetermined composition and a predetermined film thickness on the wafer 200 using an oxygen-containing gas ($O_2$ gas) as the second reactive gas has been described in the above-mentioned first embodiment, in the present embodiment, an example of forming silicon carbonitride film of a predetermined composition and a predetermined film thickness on the wafer 200 using a nitrogen-containing gas ($NH_3$ gas) as the second reactive gas will be described.

That is, in the present embodiment, an example will be described in which a silicon oxycarbide film (a SiOC film) of a predetermined composition and a predetermined film thickness is formed on the wafer 200 by repeating a cycle, the cycle including: forming a first layer containing silicon, nitrogen and carbon on the wafer 200 by alternately performing supplying HCDS gas serving as a chlorosilane-based source gas as a source gas to the wafer 200 in the process chamber 201, and supplying TEA gas serving as an amine-based gas containing a plurality (three) of ligands (ethyl group) containing a carbon atom in one molecule, as a first reactive gas containing the three elements including carbon, nitrogen and hydrogen and having a composition wherein the number of carbon atoms is greater than that of nitrogen atoms in one molecule to the wafer 200 in the process chamber 201 once; forming a silicon oxycarbide film (a SiOC film) as second layer by supplying $NH_3$ gas serving as a nitrogen-containing gas (a nitriding gas) as a second reactive gas different from the source gas and the first reactive gas to the wafer 200 in the process chamber 201 to modify the first layer; and modifying the surface of the second layer by supplying $H_2$ gas as a hydrogen-containing gas (a reducing gas) to the wafer 200 in the process chamber 201.

Figure 7:
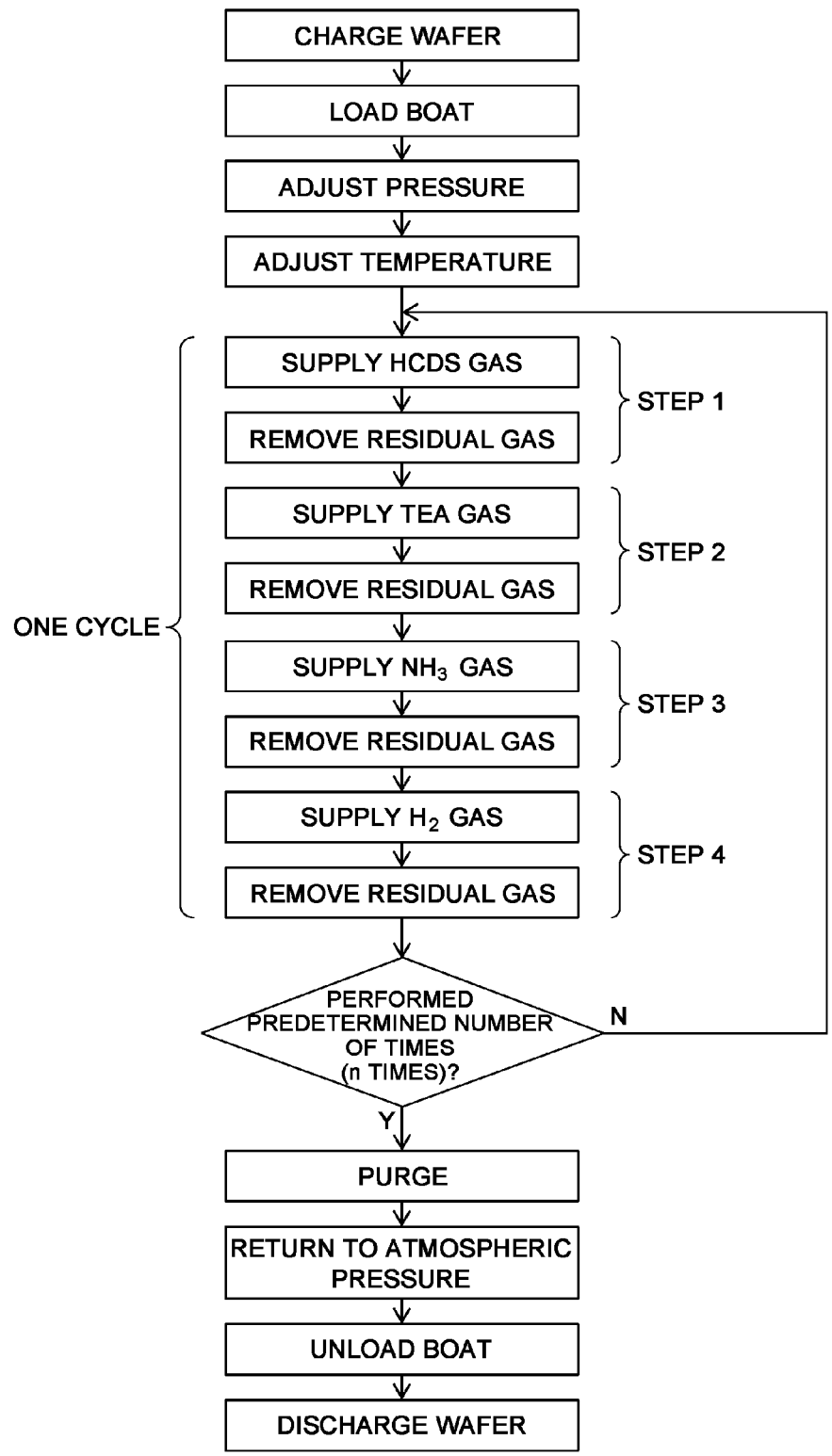
FIG. 7 is a diagram illustrating a film formation flow in a second embodiment of the present invention.

FIG. 7 is a diagram illustrating a film formation flow in the present embodiment. FIG. 8 is a diagram illustrating timing of the gas supply in the film formations sequence of the present embodiment. Furthermore, the present embodiment is different from the first embodiment only in that the $NH_3$ gas activated by heat is used as the second gas in Step 3, and everything else other than the difference described above is the same as is the first embodiment. Hereinafter, Step 3 of the present embodiment will be described.

Step 3

$NH_3$ Gas Supply

After Step 2 is finished and the residual gas in the process chamber 201 is removed, the valve 243d of the fourth gas supply pipe 232d is opened to allow $NH_3$ gas to flow through the fourth gas supply pipe 232d. A flow rate of the $NH_3$ gas flowing through the fourth gas supply pipe 232d is adjusted by means of the mass flow controller 241d. The $NH_3$ gas whose flow rate is adjusted is supplied into the process chamber 201 through the gas supply holes 250c of the third nozzle 249c. The $NH_3$ gas supplied into the process chamber 201 is activated (excited) by heat and is exhausted through the gas exhaust pipe 231. At this time, $NH_3$ gas activated by heat is supplied to the wafer 200. At this time, the valve 243h is simultaneously opened to allow $N_2$ gas to flow through the third inert gas supply pipe 232h. The $N_2$ gas is supplied into the process chamber 201 together with the $NH_3$ gas, and is exhausted through the gas exhaust pipe 231. Furthermore, at this time, in order to prevent the $NH_3$ gas from entering the first nozzle 249a and the second nozzle 249b, the valves 243f and 243g are opened to allow the $N_2$ gas to flow through the first inert gas supply pipe 232f and the second inert gas supply pipe 232g. The $N_2$ gas is supplied into the process chamber 201 via the first gas supply pipe 232a and the first nozzle 249a or via the second gas supply pipe 232b and the second nozzle 249b, and is exhausted through the gas exhaust pipe 231.

At this time, the APC valve 244 is properly adjusted so that an inner pressure of the process chamber 201 reaches a pressure in a range of, for example, 1 to 3,000 Pa. It is possible to thermally activate the $NH_3$ gas by non-plasma by setting the inner pressure of the process chamber 201 to the relatively high pressure zone in this manner. Furthermore, soft reaction can be generated by activating and supplying the $NH_3$ gas by heat, and thus oxidation as will be described later can be softly performed. For example, a supply flow rate of the $NH_3$ gas controlled by the mass flow controller 241d is set to a flow rate in the range of 100 to 10,000 sccm. For example, a supply flow rate of the $N_2$ gas controlled by the mass flow controllers 241h, 241f and 241g is set to a flow rate in the range of 100 to 10,000 sccm. At this time, a partial pressure of the $NH_3$ gas in the process chamber 201 is set to the pressure in the range of 0.01 to 2,970 Pa. For example, a time required to supply $NH_3$ gas activated by heat to the wafer 200, that is, the gas supply time (the emission time), is set to a time of a range of 1 to 120 seconds, and preferably 1 to 60 seconds. In this case, a temperature of the heater 207 is set so that a temperature of the wafer 200 reaches a temperature of 250 to 700° C., preferably, 300 to 650° C., and more preferably, 350 to 600° C. as in the above-mentioned Steps 1 and 2.

At this time, the gas flowing through the process chamber 201 is the $NH_3$ gas that is thermally activated by increasing the inner pressure of the process chamber 201, and neither the HCDS gas nor the TEA gas flows through the process chamber 201. Thus, the $NH_3$ gas does not cause the gas phase reaction, and the activated $NH_3$ gas reacts with at least a part of the first layer that contains Si, N and C formed on the wafer 200 in Step 2. Thereby, the first layer is nitrided and is modified to a layer containing silicon, oxygen, carbon and nitrogen as the second layer, that is, a silicon carbonitride layer (SiCN layer).

Furthermore, the first layer can be thermally nitrided to be modified (changed) to the SiCN layer by activating the $NH_3$ gas by heat to flow through the process chamber 201. At this time, the first layer is modified to the SiCN layer while increasing the ratio of the N component in the first layer. Meanwhile, at this time, the Si—N bonds in the first layer increase by thermal nitridation action due to the $NH_3$ gas, the Si—C bonds and the Si—Si bonds decrease, and the ratio of the C component and the ratio of the Si component in the first layer decrease. That is, it is possible to modify the first layer to the SiCN layer while changing the composition ratio such that the nitrogen concentration is increased and the carbon concentration and the silicon concentration are reduced. Furthermore, at this time, it is possible to minutely adjust the ratio of the N component in the SiOCN layer or the SiCN layer, that is, the nitrogen concentration, by controlling the processing conditions such as the inner pressure of the process chamber 201 and the gas supply time, and thus it is possible to more closely control the composition ratio of the SiCN layer.

Furthermore, at this time, it is preferable to prevent the nitridation reaction of the first layer from being saturated. For example, when forming the first layer of less than one molecular layer to several atomic layers in thickness in Steps 1 and 2, it is preferable to nitride a part of the first layer. In this case, the nitridation is performed under conditions in which the nitridation reaction of the first layer is not saturated so as not to nitride the whole first layer of less than one atomic layer to several atomic layers in thickness.

Furthermore, in order to prevent the nitridation reaction of the first layer from being saturated, although the processing conditions in Step 3 may be the above-mentioned processing conditions, it is easy to prevent the nitridation reaction of the first layer from being saturated by setting the processing conditions in Step 3 to the following processing conditions.

Wafer temperature: 500 to 650° C.
Pressure in process chamber: 133 to 2,666 Pa
$NH_3$ gas partial pressure: 33 to 2,515 Pa
$NH_3$ gas supply flow rate: 1,000 to 5,000 sccm
$N_2$ gas supply flow rate: 300 to 3,000 sccm
$NH_3$ gas supply time: 6 to 60 seconds Residual Gas Removal After the second layer is formed, the valve 243d of the fourth gas supply pipe 232d is closed to stop the supply of the $NH_3$ gas. At this time, the APC valve 244 of the gas exhaust pipe 231 is kept open to vacuum-exhaust an interior of the process chamber 201 using the vacuum pump 246 so that an unreacted gas remaining in the process chamber 201, $NH_3$ gas that has contributed to formation of the first layer, or a reaction byproduct is eliminated from the process chamber 201. Furthermore, at this time, the valves 243h, 243f and 243g may also be kept open to maintain the supply of the $N_2$ gas into the process chamber 201. The $N_2$ gas acts as a purge gas. Therefore, it is possible to improve an effect of eliminating an unreacted gas remaining in the process chamber 201, $NH_3$ gas that has contributed to formation of the second layer, or the reaction byproduct from the process chamber 201.

Furthermore, at this time, the gas remaining in the process chamber 201 may not be completely eliminated, and the interior of the process chamber 201 may not be completely purged. If a very small amount of gas remains in the process chamber 201, no adverse affect occurs in Step 4 performed thereafter. At this time, there is also no need to set a flow rate of the $N_2$ gas supplied into the process chamber 201 to a great flow rate. For example, it is possible to perform purging to such a level that no adverse affect occurs in Step 4 by supplying the same amount of the volume of the reaction tube 203 or the process chamber 201. In this manner, it is possible to shorten the purge time to improve throughput by not completely purging the interior of the process chamber 201. Furthermore, it is also possible to suppress the consumption of the $N_2$ gas to a minimum level.

As the nitrogen-containing gas, in addition to the $NH_3$ gas, diazene ($N_2H_2$) gas, hydrazine ($N_2H_4$) gas, $N_3H_8$ gas, a gas containing a combination thereof or the like may be used. In addition to the $N_2$ gas, a rare gas such as Ar gas, He gas, Ne gas, or Xe gas may be used as the inert gas.

Performing Predetermined Number of Times

It is possible to form a film containing silicon, carbon and nitrogen of a predetermined composition and a predetermined film thickness, that is, a silicon carbonitride layer (SiCN layer), on the wafer 200 by setting the above-mentioned Steps 1 to 4 to one cycle and performing the cycle once or more (a predetermined number of times). Furthermore, it is possible to repeat the above-mentioned cycle multiple times. That is, it is preferable to set the thickness of the SiCN layer formed per one cycle to be smaller than a desired film thickness, and repeat the above-mentioned cycle multiple times until a desired film thickness is obtained.

According to the present embodiment, by performing Step 4 of supplying the $H_2$ gas serving as the hydrogen-containing gas and modifying the surface of the second layer to the surface containing many OH groups (adsorption sites) after forming the second layer by performing Steps 1 to 3, it is possible to promote the formation of the silicon-containing layer containing Cl on the second layer when performing Step 1 again in the next cycle, that is, the deposition of Si on the second layer and the adsorption of the HCDS gas. As a result, it is possible to improve the film information rate of the SiCN film and improve productivity during the film formation.

Furthermore, according to the present embodiment, it is possible to adjust the composition ratio of oxygen, carbon and nitrogen in the SiCN film, by performing Step 3 of supplying the $NH_3$ gas serving as the nitrogen-containing gas as the second reactive gas, and nitriding and modifying the first layer to the SiCN layer as the second layer, after the first layer containing Si, N and C by alternately performing Steps 1 and 2 once. Furthermore, at this time, by activating and supplying the $NH_3$ gas by heat, the Si—O bonds in the SiCN film are increased by the thermal nitridation action, and the Si—C bonds and the Si—Si bonds can be reduced. That is, it is possible to change the composition ratio such that the nitrogen concentration is increased and the carbon concentration and the silicon concentration are reduced. Furthermore, at this time, it is possible to change the composition ratio such that the nitrogen concentration is further increased and such that the carbon concentration and the silicon concentration are further reduced by extending the thermal nitridation time or increasing the nitridation force in thermal nitridation. Furthermore, at this time, it is possible to minutely adjust the ratio of the N component in the SiCN film, that is, the nitrogen concentration, by controlling the processing conditions such as the inner pressure of the process chamber 201 and the gas supply time, and thus it is possible to more closely control the composition ratio of the SiCN film. Thereby, it is possible to adjust a dielectric constant of formed the SiCN film, improve etching tolerance, or improve the leak tolerance.

Additionally, according to the present embodiment, the same effects as those of the above-mentioned first embodiment are obtained. That is, it is possible to increase the carbon concentration in the SiCN film, improve reaction control characteristics when forming the SiCN film, particularly, composition control characteristics, reduce the impurity concentration in the film, and improve film thickness uniformity of the in-wafer 200 surface and the inter-wafer 200 surface when using the TEA gas serving as the silicon-free and metal-free amine-based gas containing the three elements including carbon, nitrogen and hydrogen, and having the composition wherein the number of carbon atoms is greater than that of nitrogen atoms in one molecule, as the first reactive gas.

MODIFIED EXAMPLE

Although an example of setting Steps 1 to 4 to one cycle and repeating the cycle has been described in the above-mentioned film formation sequence illustrated in FIGS. 7 and 8, the film formation sequence according to the present embodiment may be changed as below, without being limited thereto.

Figure 9A:
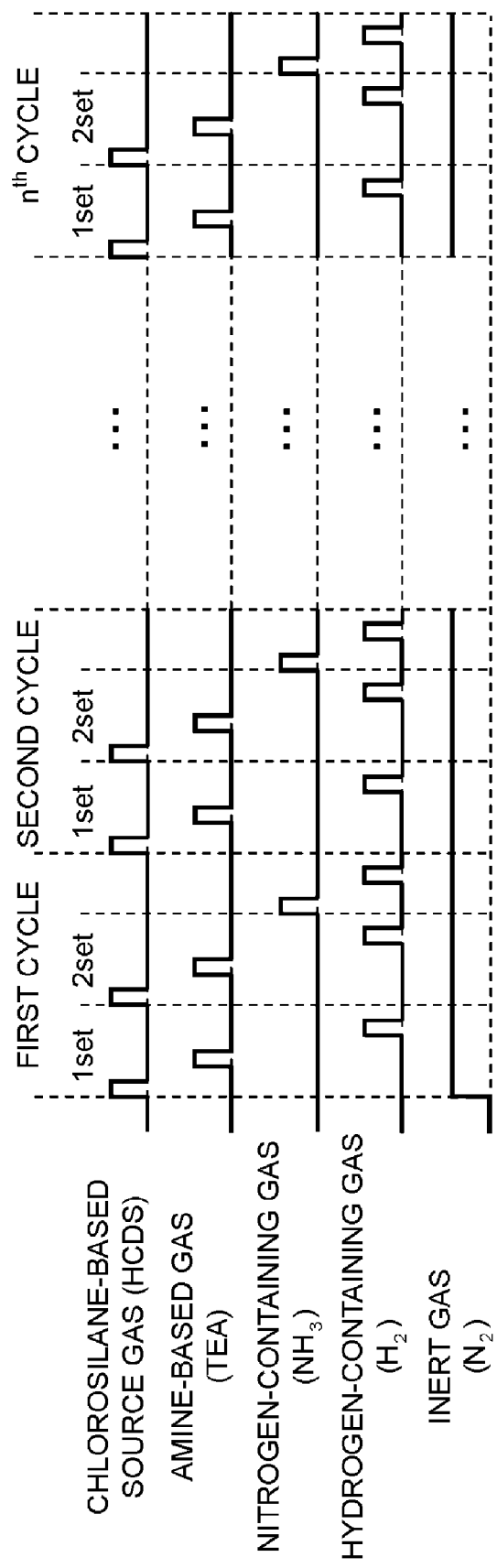

For example, as in modified example 1 illustrated in FIG. 9A, Steps 1, 2 and 4 may be set to one set and the set performed a predetermined number of times (m times), and Steps 3 and 4 may be performed, all of which may be set to one cycle and the cycle may be performed a predetermined number of times (n times). FIG. 9A illustrates an example in which the set of Steps 1, 2 and 4 is performed twice in each cycle, that is, an example in which the process of performing the set of Steps 1, 2 and 4 twice, and a process of performing Steps 3 and 4 is set to one cycle and the cycle is performed a predetermined number of times (n times). The present modified example is different from the film formation sequence illustrated in FIGS. 7 and 8 only in that the set of Steps 1, 2 and 4 is performed a predetermined number of times (m times), and then Steps 3 and 4 are performed, all of which is set to one cycle, and everything else other than the difference described above is the same as in the above-mentioned film formation sequence. Furthermore, Step 4 may be omitted from the set, Steps 1 and 2 may be set to one set, the set may be performed a predetermined number of times (m times), and Steps 3 and 4 may be performed, all of which may be set to one cycle, and the cycle may be performed a predetermined number of times (n times). That is, Step 4 may be performed at the end of the cycle only once.

Figure 9B:
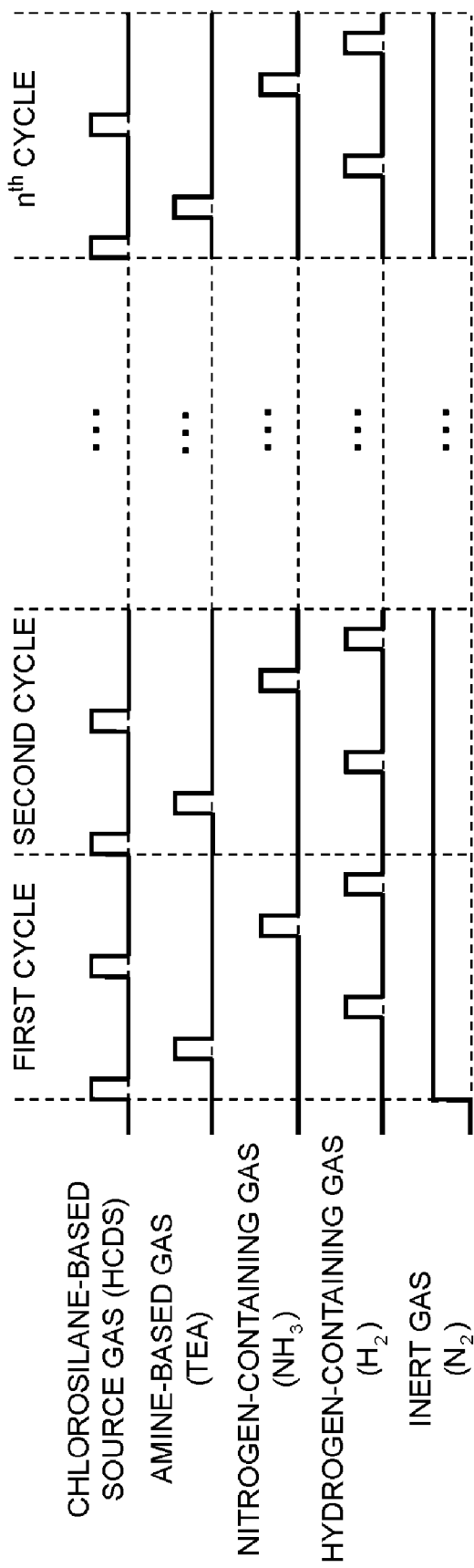

Furthermore, for example, as in modified example 2 illustrated in FIG. 9B, Steps 1, 2, 4, 1, 3 and 4 may be sequentially performed as one cycle, and the cycle may be performed a predetermined number of times (n times). Furthermore, the present modified example is different from the above-mentioned film formation sequence illustrated in FIGS. 7 and 8 only in that Steps 1, 2, 4, 1, 3 and 4 are set to one cycle, and everything else other than the difference described above is the same as is the above-mentioned film formation sequence. Furthermore, the first Step 4 may be omitted from the cycle, Steps 1, 2, 1, 3 and 4 may be set to one cycle, and this cycle may be performed a predetermined number of times (n times). That is, Step 4 may be performed at the end of the cycle only once.

Furthermore, for example, as in modified example 3 illustrated in FIG. 9C, Steps 1, 2 and 4 may be set to one set and this set may be performed a predetermined number of times (m times), Steps 1, 3 and 4 may set to one set and this set may be performed a predetermined number of times (m' times), and the combination thereof may be set to one cycle and the cycle may be performed a predetermined number of times (n times). FIG. 9C illustrates an example in which the set of Steps 1, 2 and 4 and the set of Steps 1, 3 and 4 are performed twice in each cycle, that is, an example in which a process of performing the set of Steps 1, 2 and 4 twice, and a process of performing the set of Steps 1, 3 and 4 twice is set to one cycle and the cycle is performed a predetermined number of times (n times). The present modified example is different from the above-mentioned film formation sequence illustrated in FIGS. 7 and 8 only in that the set of Steps 1, 2 and 4 is performed a predetermined number of times (m times), the set of Steps 1, 3 and 4 is performed a predetermined number of times (m' times), and this set is set to one cycle, and everything else other than the difference described above is the same as in the above-mentioned film formation sequence. Furthermore, in the present modified example, a case in which the number (m) of times the set of Steps 1, 2 and 4 is performed is set to one, and the number (m') of times the set of Steps 1, 3 and 4 is performed is set to one corresponds to the film formation sequence of modified example 2 illustrated in FIG. 9B. Furthermore, Step 4 may be omitted from each set, Steps 1 and 2 may be set to one set and this set may be performed a predetermined number of times (m times), Steps 1 and 3 may be set to one set and this set may be performed a predetermined number of times (m' times), and Step 4 may be performed, all of which may be set to one cycle, and this cycle may be performed a predetermined number of times (n times). That is, Step 4 may be performed at the end of the cycle only once.

Even in the modified example, the same effects as the above-mentioned film formation sequence illustrated in FIGS. 7 and 8 can be obtained. Furthermore, according to the modified example, it is possible to further closely control the ratio of the silicon component, the nitrogen component, the carbon component and the oxygen component in the SiCN film, and it is possible to control characteristics of the composition ratio of the SiCN film.

For example, it is possible to increase an absolute amount of the silicon component, the nitrogen component, and the carbon component of the first layer by increasing the number (m) of sets including Steps 1, 2 and 4 in the modified example 1. In this manner, it is possible to perform the control so that the ratio of the silicon component and the carbon component relative to the nitrogen component of the formed SiCN film or the SiOC film becomes higher, by nitriding the first layer in which the absolute amounts of each component are increased in Step 3. It is possible to perform the control so that the ratio of the silicon component and the carbon component relative to the oxygen component of the finally formed SiCN film becomes higher.

Furthermore, for example, it is possible to reduce an absolute amount of the silicon component, the nitrogen component, and the carbon component of the first layer by decreasing the number (m) of sets including Steps 1, 2 and 4 in the modified example 1. In this manner, it is possible to perform the control so that the ratio of the silicon component and the carbon component relative to the nitrogen component of the SiCN film becomes lower, by nitriding the first layer in which the absolute amounts of each component are decreased in Step 3. It is possible to perform the control so that the ratio of the silicon component and the carbon component relative to the nitrogen component of the finally formed SiCN becomes lower.

Even in the modified examples 2 and 3, it is possible to further closely control the ratio of the silicon component, the nitrogen component, and the carbon component in the SiCN film by the same principle.

Furthermore, according to the modified example, it is possible to increase the thickness of the layer formed for each cycle, and thus the cycle rate (the thickness of the SiCN film formed for a unit cycle) can be improved. Moreover, the film formation rate can thereby be improved.

For example, in the modified examples 1 and 3, it is possible to increase the layer number of the first layer formed in each cycle, that is, the thickness of the first layer formed in each cycle by the set number (m), by increasing the number (m) of sets including Steps 1, 2 and 4, and thus the cycle rate can be improved. Furthermore, in the modified example 3, it is possible to increase the layer number of the SiN layer as the second layer formed in each cycle, that is, the thickness of the second layer formed in each cycle by the set number (m'), by increasing the number (m') of sets including Steps 1, 3 and 4, and thus the cycle rate can also be improved. Furthermore, since Step 1 is performed twice in each cycle in the modified example 2, it is also possible to improve the cycle rate in the modified example 2. Moreover, it is also thereby possible to improve the film formation rate.

Furthermore, in the modified examples 2 and 3, the sequence of the process of forming the first layer including Si, N and C and the process of forming the SiN layer as the second layer may be changed, and the process of forming the first layer may be performed after performing the process of forming the second layer (SiN layer), all of which may be set to one cycle. Furthermore, the modified examples may be arbitrarily modified and used.

Third Embodiment of Present Invention

Next, a third embodiment of the present invention will be described.

Although an example of forming a silicon oxycarbonitride film or a silicon oxycarbide film of a predetermined composition and a predetermined film thickness on the wafer 200 using an oxygen-containing gas ($O_2$ gas) as the second reactive gas has been described in the above-mentioned first embodiment, in the present embodiment, an example of forming a silicon oxycarbonitride film of a predetermined composition and a predetermined film thickness on the wafer 200 using a nitrogen-containing gas ($NH_3$ gas) and a oxygen-containing gas ($O_2$ gas) as the second reactive gas will be described.

That is, in the present embodiment, an example will be described in which a silicon oxycarbonitride film (a SiOCN film) of a predetermined composition and a predetermined film thickness is formed on the wafer 200 by repeating a cycle, the cycle including: forming a first layer containing silicon, nitrogen and carbon on the wafer 200 by alternately performing supplying HCDS gas serving as a chlorosilane-based source gas as a source gas to the wafer 200 in the process chamber 201, and supplying TEA gas serving as an amine-based gas containing a plurality (three) of ligands (ethyl group) containing a carbon atom in one molecule, as a first reactive gas containing the three elements including carbon, nitrogen and hydrogen and having a composition wherein the number of carbon atoms is greater than that of nitrogen atoms in one molecule to the wafer 200 in the process chamber 201 once; forming a silicon oxycarbonitride film (a SiOCN film) as second layer by supplying the $NH_3$ gas serving as an nitrogen-containing gas (a nitriding gas) and the $O_2$ gas serving as the oxygen-containing gas (the oxidation gas) as a second reactive gas different from the source gas and the first reactive gas to the wafer 200 in the process chamber 201 to modify the first layer; and modifying the surface of the second layer by supplying $H_2$ gas as a hydrogen-containing gas (a reducing gas) to the wafer 200 in the process chamber 201.

Figure 10:
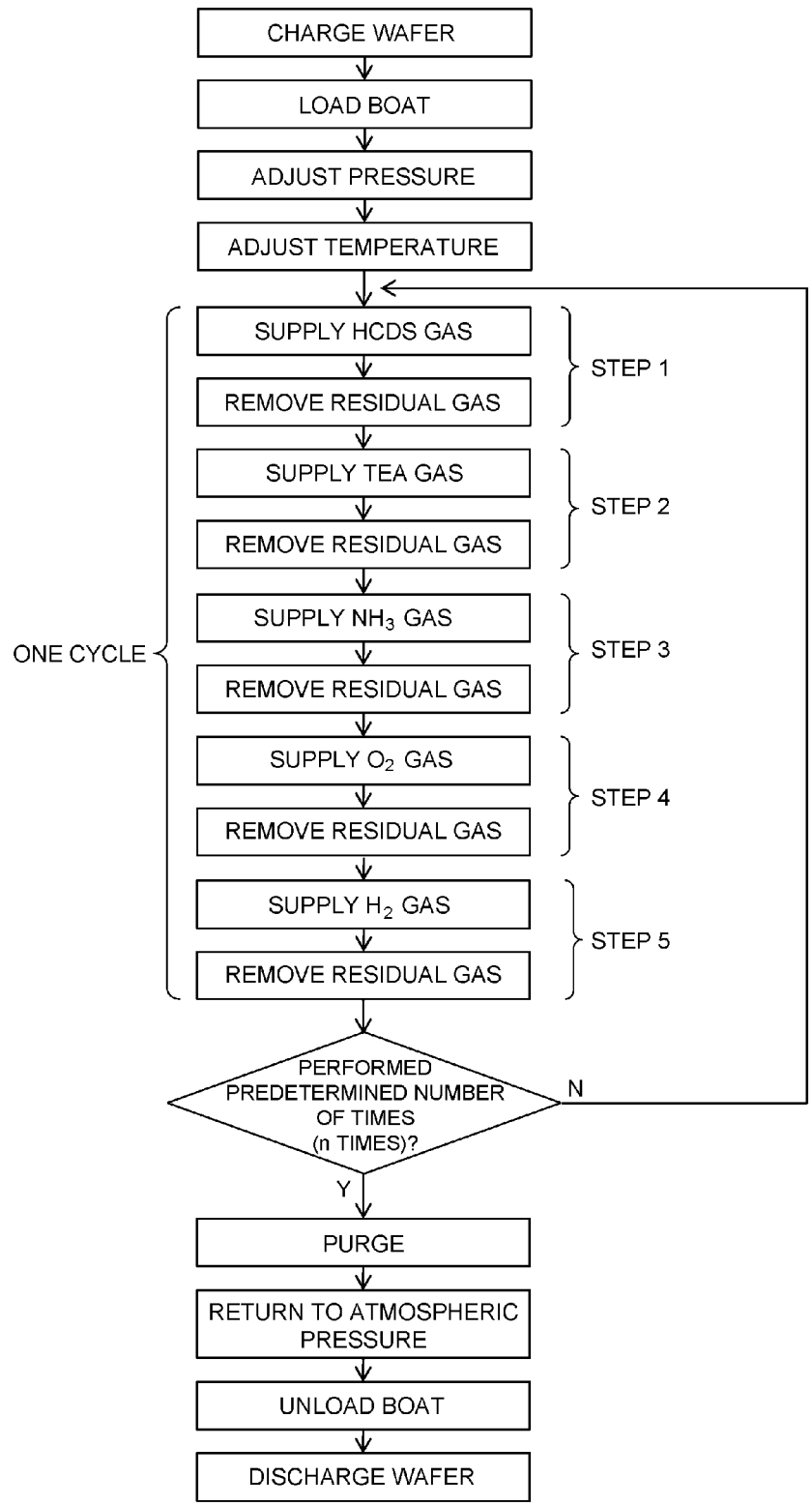
FIG. 10 is a diagram illustrating a film formation flow of a third embodiment of the present invention.

FIG. 10 is a diagram illustrating a film formation flow in the present embodiment. FIG. 11 is a diagram illustrating timing of the gas supply in the film formation sequence of the present embodiment. Furthermore, the present embodiment is different from the first embodiment only in that Step 3 of supplying the $NH_3$ gas serving as the nitrogen-containing gas as the second reactive gas to nitride the first layer after forming the first layer by performing Steps 1 and 2, Step 4 of supplying the $O_2$ gas serving as the oxygen-containing gas as the second reactive gas and oxidizing the first layer after the nitridation to modify the first layer to the SiOCN layer as the second layer; and Step 5 of modifying the surface of the second layer by supplying the $H_2$ gas as the hydrogen-containing gas to the wafer 200 in the process chamber 201 to modify the surface of the second layer are performed, Steps 1 to 5 are set to one cycle, and this cycle is repeated, and everything else other than the difference described above is the same as is the first embodiment. Furthermore, the sequence and the process conditions of Step 3 of the present embodiment and the reaction generated thereby are the same as the sequence and the process conditions of Step 3 of the second embodiment and the reaction generated thereby. Furthermore, the sequence and the process conditions of Step 4 of the present embodiment and the reaction generated thereby are the same as the sequence and the process conditions of Step 3 of the first embodiment and the reaction generated thereby. Furthermore, the sequence and the process conditions of Step 5 of the present embodiment and the reaction generated thereby are the same as the sequence and the process conditions of Step 4 of the first and second embodiments and the reaction generated thereby.

According to the present embodiment, by performing Step 5 of supplying the $H_2$ gas serving as the hydrogen-containing gas and modifying the surface of the second layer to the surface containing many OH groups (adsorption sites) after forming the second layer by performing Steps 1 to 4, it is possible to promote the formation of the silicon-containing layer containing Cl on the second layer when performing Step 1 again in the next cycle, that is, the deposition of Si on the second layer and the adsorption of the HCDS gas. As a result, it is possible to improve the film formation rate of the SiOCN film and improve productivity during the film formation.

Furthermore, according to the present embodiment, it is possible to adjust the composition ratio of oxygen, carbon and nitrogen in the formed SiOCN film by performing Step 3 of supplying the $NH_3$ gas serving as the nitrogen-containing gas as the second reactive gas, and nitriding and modifying the first layer to the SiCN layer as the second layer after the first layer containing Si, N and C by alternately performing Steps 1 and 2 once, and Step 4 of supplying the $O_2$ gas serving as the oxygen-containing gas as the second reactive gas, and oxidizing the first layer (the SiCN layer) after the nitridation to modify the first layer to the SiOCN layer as the second layer. Thereby, it is possible to adjust a dielectric constant of the formed SiOCN film, improve the etching tolerance, and improve the leak tolerance.

In addition, according to the present embodiment, the same effects as those of the above-mentioned first and second embodiment are obtained. That is, it is possible to increase the carbon concentration in the SiOCN film, improve reaction control characteristics when forming the SiCN film, particularly, composition control characteristics, reduce the impurity concentration in the film, and improve film thickness uniformity of the in-wafer 200 surface and the inter-wafer 200 surface when using the TEA gas serving as the silicon-free and metal-free amine-based gas containing the three elements including carbon, nitrogen and hydrogen, and having the composition wherein the number of carbon atoms is greater than that of nitrogen atoms in one molecule as the first reactive gas. Furthermore, it is possible to suitably adjust the composition ratio of the SiOCN film by activating (exciting) and supplying the $NH_3$ gas and the $O_2$ gas as the second reactive gas by heat.

Furthermore, it is possible to improve the film formation rate by modifying the surface of the second layer using the $H_2$ gas, and improve productivity during film formation.

MODIFIED EXAMPLE

Although an example of setting Steps 1 to 5 to one cycle and repeating the cycle has been described in the above-mentioned film formation sequence illustrated in FIGS. 10 and 11, the film formation sequence according to the present embodiment may be changed as below, without being limited thereto.

For example, as in modified example 1 illustrated in FIG. 12A, Steps 1, 2 and 5 may be set to one set and this set may be performed a predetermined number of times (m times), and Steps 3, 4 and 5 may be sequentially performed, all of which may be set to one cycle and the cycle may be performed a predetermined number of times (n times). FIG. 12A illustrates an example in which the set of Steps 1, 2 and 5 is performed twice in each cycle, that is, an example in which the process of performing the set of Steps 1, 2 and 5 twice, and a process of performing Steps 3, 4 and 5 is set to one cycle and the cycle is performed a predetermined number of times (n times). The present modified example is different from the film formation sequence illustrated in FIGS. 10 and 11 only in that the set of Steps 1, 2 and 5 is performed a predetermined number of times (m times) and then Steps 3, 4 and 5 are sequentially performed, all of which is set to one cycle, and everything else other than the difference described above is the same as is the above-mentioned film formation sequence. Furthermore, Step 5 may be omitted from the set, Steps 1 and 2 may be set to one set, the set may be performed a predetermined number of times (m times), and Steps 3, 4 and 5 may be performed, all of which may be set to one cycle and the cycle may be performed a predetermined number of times (n times). That is, Step 5 may be performed at the end of the cycle only once.

Figure 12B:
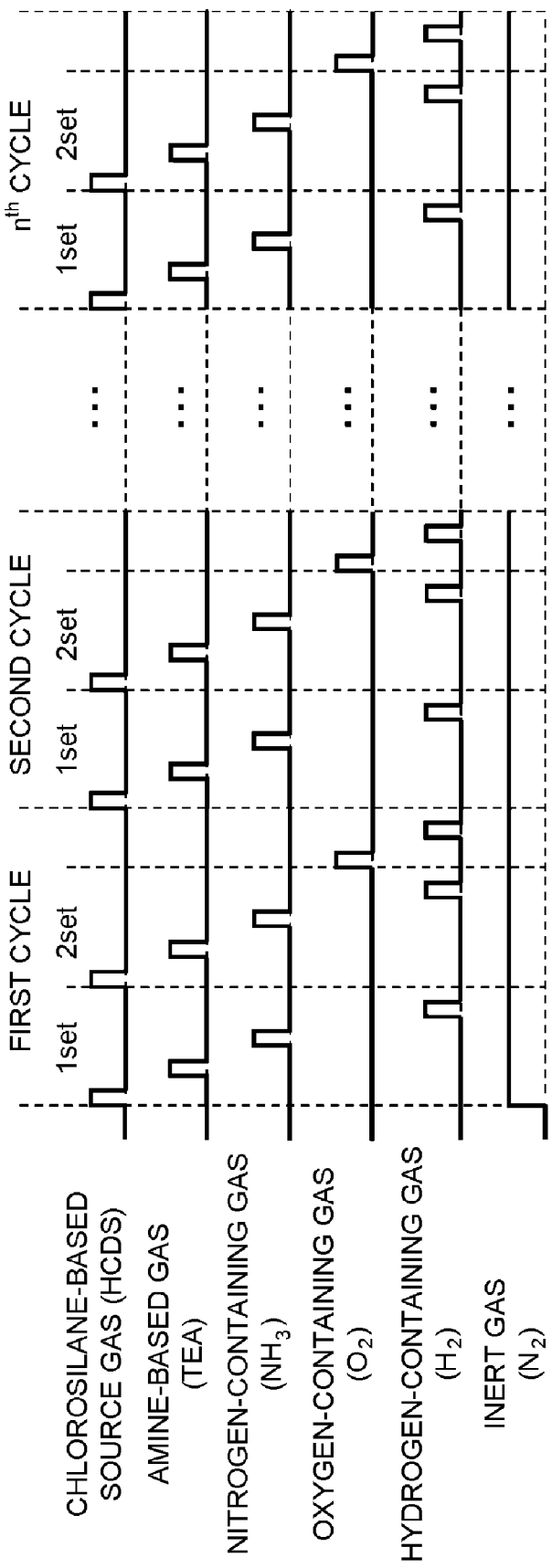

Furthermore, for example, as in modified example 2 illustrated in FIG. 12B, Steps 1 to 3 and 5 may be set to one set and this set may be performed a predetermined number of times (m times), and Steps 4 and 5 may be performed, all of which may be set to one cycle, and the cycle may be performed a predetermined number of times (n times). FIG. 12B illustrates an example in which the set of Steps 1 to 3 and 5 is performed twice in each cycle, that is, an example in which the process of performing the set of Steps 1 to 3 and 5 twice, and a process of performing Steps 4 and 5 is set to one cycle and the cycle is performed a predetermined number of times (n times). The present modified example is different from the film formation sequence illustrated in FIGS. 10 and 11 only in that the set of Steps 1 to 3 and 5 is performed a predetermined number of times (m times), and then Steps 4 and 5 are performed, all of which is set to one cycle, and everything else other than the difference described above is the same as is the above-mentioned film formation sequence. Furthermore, Step 5 may be omitted from the set, Steps 1 to 3 may be set to one set and this set may be performed a predetermined number of times (m times), and Steps 4 and 5 may be performed, all of which may be one cycle, and the cycle may be performed a predetermined number of times (n times). That is, Step 5 may be performed at the end of the cycle only once.

Figure 12C:
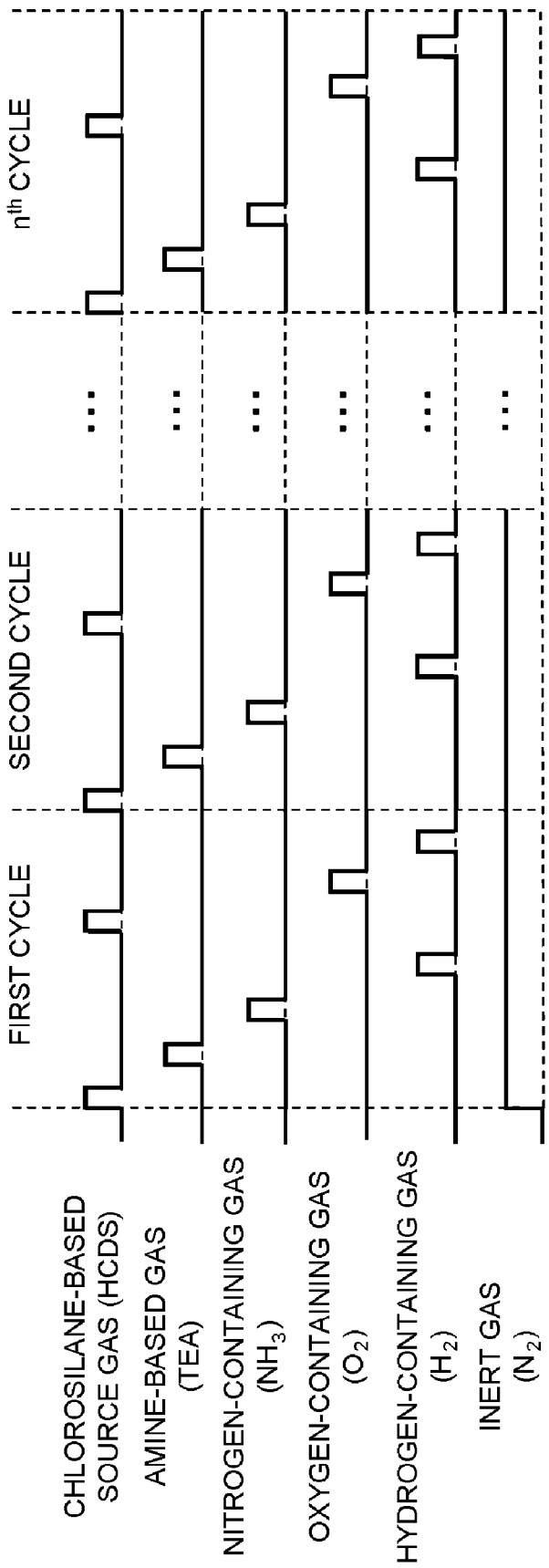

Furthermore, for example, as in modified example 3 illustrated in FIG. 12C, Steps 1, 2, 3, 5, 1, 4, and 5 may be sequentially performed as one cycle, and this cycle may be performed a predetermined number of times (n times). Furthermore, the present modified example is different from the above-mentioned film formation sequence illustrated in FIGS. 10 and 11 only in that Steps 1, 2, 3, 5, 1, 4, and 5 are set to one cycle, and everything else other than the difference described above is the same as in the above-mentioned film formation sequence. Furthermore, the first Step 5 may be omitted from the cycle, Steps 1, 2, 3, 5, 1, 4, and 5 may be set to one cycle, and this cycle may be performed a predetermined number of times (n times). That is, Step 5 may be performed at the end of the cycle only once.

Figure 13A:
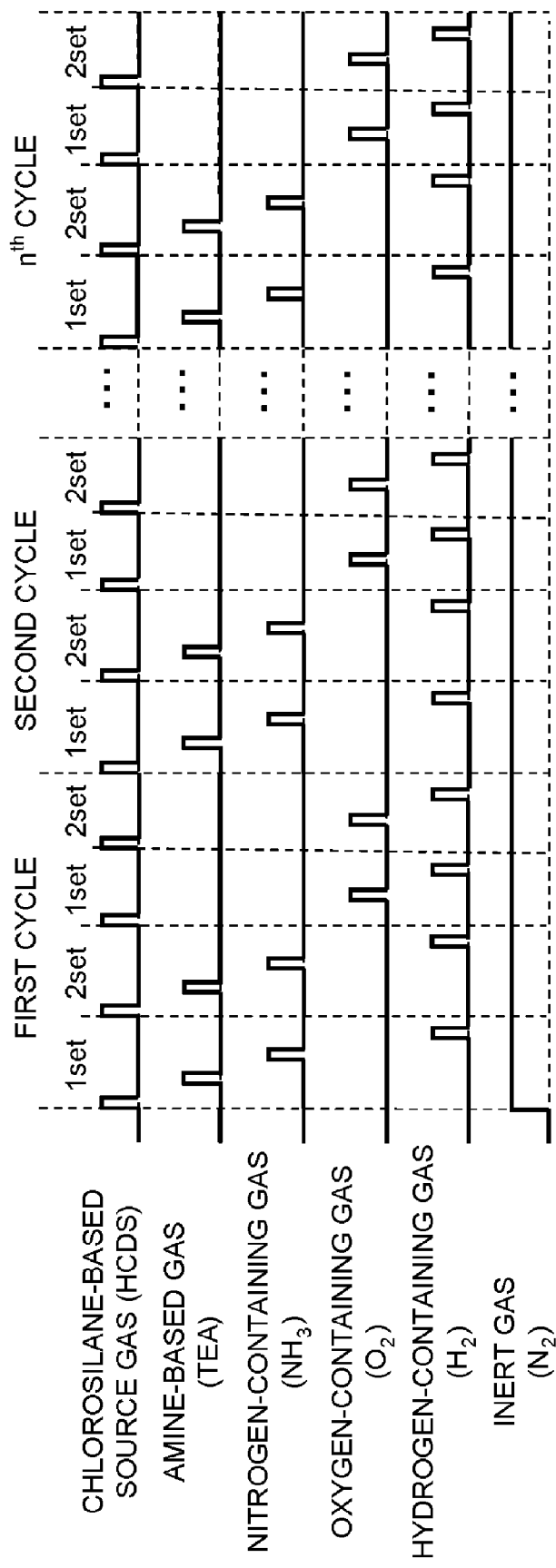

Furthermore, for example, as in modified example 4 illustrated in FIG. 13A, Steps 1 to 3 and 5 may be set to one set and this set may be performed a predetermined number of times (m times), Steps 1, 4 and 5 may be set to one set and this set may be performed a predetermined number of times (m' times), and the combination thereof may be set to one cycle and the cycle may be performed a predetermined number of times (n times). FIG. 13A illustrates an example in which the set of Steps 1 to 3 and 5 and the set of Steps 1, 4 and 5 are each performed twice in each cycle, that is, an example in which a process of performing the set of Steps 1 to 3 and 5 twice, and a process of performing the set of Steps 1, 4 and 5 twice is set to one cycle and the cycle is performed a predetermined number of times (n times). The present modified example is different from the above-mentioned film formation sequence illustrated in FIGS. 10 and 11 only in that the set of Steps 1 to 3 and 5 is performed a predetermined number of times (m times), the set of Steps 1, 4 and 5 is performed a predetermined number of times (m' times), and this is set to one cycle, and everything else other than the difference described above is the same as in the above-mentioned film formation sequence. Furthermore, in the present modified example, a case in which the number (m) of times the set of Steps 1 to 3 and 5 is performed is set to one, and the number (m') of times the set of Steps 1, 4 and 5 is performed is set to one corresponds to the film formation sequence of modified example 3 illustrated in FIG. 12C. Furthermore, Step 5 may be omitted from each set, Steps 1 to 3 may be set to one set and this set may be performed a predetermined number of times (m times), Steps 1 and 4 may be set to one set and this set may be performed a predetermined number of times (m' times), and then Step 5 may be performed, all of which may be set to one cycle, and this cycle may be performed a predetermined number of times (n times). That is, Step 5 may be performed at the end of the cycle only once.

Furthermore, for example, as in modified example 5 illustrated in FIG. 13B, Steps 1, 2, 5, 1, 3, 4 and 5 may be sequentially performed as one cycle, and this cycle may be performed a predetermined number of times. Furthermore, the present modified example is different from the above-mentioned film formation sequence illustrated in FIGS. 10 and 11 only in that Steps 1, 2, 5, 1, 3, 4 and 5 are set to one cycle, and everything else other than the difference described above is the same as in the above-mentioned film formation sequence. Furthermore, the first Step 5 may be omitted from the cycle, Steps 1, 2, 1, 3, 4 and 5 may be set to one cycle, and this cycle may be performed a predetermined number of times (n times). That is, Step 5 may be performed at the end of the cycle only once.

Furthermore, for example, as in modified example 6 illustrated in FIG. 13C, Steps 1, 2 and 5 may be set to one set and this set may be performed a predetermined number of times (m times), Steps 1, 3, 4 and 5 may be set to one set and this set may be performed a predetermined number of times (m' times), and the combination thereof may be set to one cycle and this cycle may be performed a predetermined number of times (n times). The present modified example is different from the above-mentioned film formation sequence illustrated in FIGS. 10 and 11 only in that the set of Steps 1, 2 and 5 is performed a predetermined number of times (m times), the set of Steps 1, 3, 4 and 5 is performed a predetermined number of times (m' times), and this is set to the one cycle, and everything else other than the difference described above is the same as is the above-mentioned film formation sequence. Furthermore, after Step 5 may be omitted from each set, Steps 1 and 2 may be set to one set and this set may be performed a predetermined number of times (m times), Steps 1, 3 and 4 may be set to one set and this set may be performed a predetermined number of times (m' times), and then Step 5 may be performed, all of which may be set to one cycle, and this cycle may be performed a predetermined number of times (n times). That is, Step 5 may be performed at the end of the cycle only once.

In the modified examples, the same effects as the above-mentioned film formation sequence illustrated in FIGS. 10 and 11 can also be obtained. Furthermore, according to the modified example, it is possible to further closely control the ratio of the silicon component, the nitrogen component, the carbon component and the oxygen component in the SiOCN film, and it is possible to control characteristics of the composition ratio of the SiOCN film. Furthermore, according to the modified example, it is possible to increase the thickness of the layer formed for each cycle, and thus the cycle rate (the thickness of the SiCN film formed for a unit cycle) can be improved. Moreover, the film formation rate can thereby be improved.

For example, in the modified examples 3 and 4, the sequence of the process of forming SiCN as the first layer and the process of forming the SiN layer as the second layer may be changed, and the process of forming the SiCN layer may be performed after performing the process of forming the SiO, which may be set to one cycle. Furthermore, the modified examples may be arbitrarily modified and used. Furthermore, in the modified examples 5 and 6, the sequence of the process of forming the first layer including Si, N and C and the process of forming the SiON layer as the second layer may be changed, and the process of forming the first layer may be performed after performing the process of forming the SiON layer, which may be set to one cycle. Furthermore, the modified examples may be arbitrarily combined and used.

Other Embodiments of Present Invention

Although embodiments of the present invention have been specifically described above, the present invention is not limited thereto but may be variously modified within the scope that does not depart from the gist thereof.

For example, although an example of supplying the chlorosilane-based source gas to the wafer 200 in the process chamber 201 and then supplying the amine-based gas when forming the first layer containing Si, N and C has been described in the above-mentioned embodiments, the supply sequence of the gases may be reversed. That is, the amine-based gas may be supplied and then the chlorosilane-based gas may be supplied. That is, one of the chlorosilane-based and the amine-based gas may be supplied, and then the other thereof may be supplied. In this manner, it is also possible to change the film quality and the composition ratio of the thin film formed by changing the supply sequence of the gas.

Furthermore, for example, although an example of using the chlorosilane-based source gas as the source gas when forming the initial layer containing a predetermined element (silicon) and a halogen element (chloride) in Step 1 has been described in the above-mentioned embodiments, a silane-based source gas having a halogen-based ligand other than the chloro group may be used instead of the chlorosilane-based source gas. For example, a fluorosilane-based source gas may be used instead of the chlorosilane-based source gas. Herein, the fluorosilane-based source gas refers to a fluorosilane-based source in a gas state, for example, a gas obtained by vaporizing a fluorosilane-based source that is in a liquid state under normal temperature and normal pressure, a fluorosilane-based source that is in a gas state under normal temperature and normal pressure or the like. Furthermore, the fluorosilane-based source is a silane-based source containing the fluoro group as the halogen group, and is a source that contains at least silicon (Si) and fluorine (F). That is, the fluorosilane-based source mentioned herein may also be referred to as a type of halide. As a fluorosilane-based source gas, for example, it is possible to use tetrafluorosilane, that is, a fluoride silicon gas such as silicon tetrafluoride ($SiF_4$) gas, or hexafluorodisilane ($Si_2F_6$). In this case, when forming the initial layer containing a predetermined element and a halogen element, the fluorosilane-based source gas is supplied to the wafer 200 in the process chamber 201. In this case, the initial layer is a layer containing Si and F, that is, a silicon-containing layer containing F.

Furthermore, for example, although an example of using the amine-based gas as the first reactive gas when changing (modifying) the silicon-containing layer containing Cl as the initial layer to the first layer containing Si, N and C has been described in the above-mentioned embodiment, as the first reactive gas, for example, a gas containing an organic hydrazine compound, that is, an organic hydrazine-based gas, may be used instead of the amine-based gas. Furthermore, the gas containing the organic hydrazine-based compound can also be simply referred to as an organic hydrazine compound gas or an organic hydrazine gas. Herein, the organic hydrazine-based gas is an organic hydrazine in a gas state, for example, a gas obtained by vaporizing an organic hydrazine in a liquid state under normal temperature and normal pressure, or a gas containing a hydrazine group such as an organic hydrazine in a gas state under normal temperature and normal pressure. The organic hydrazine-based gas is a silicon-free gas containing the three elements including carbon (C), nitrogen (N) and hydrogen (H), and a silicon-free and metal-free gas. As the organic hydrazine-based gas, for example, it is possible to preferably use a methylhydrazine-based gas in which monomethylhydrazine [$(CH_3)NH_2H_2$ abbreviation: MMH], dimethylhydrazine [$(CH_3)_2H_2H_2$ abbreviation: DMH], trimethylhydrazine [$(CH_3)_2H_2H_2$ abbreviation: TMH] or the like is vaporized, or an ethylhydrazine-based gas in which ethylhydrazine [$(C_2H_5)NH_2H_2$ abbreviation: EH] or the like is vaporized. In this case, when changing (modifying) the silicon-containing layer containing Cl as the initial layer to the first layer containing Si, N and C, the organic hydrazine-based gas is supplied to the wafer 200 in the process chamber 201. Furthermore, as the organic hydrazine-based gas, it is preferable to use a gas that contains the three elements including carbon, nitrogen and hydrogen and has a composition wherein the number of carbon atoms is greater than that of nitrogen atoms in one molecule. Furthermore, as the organic hydrazine-based gas, it is preferable to use a gas containing a plurality of ligands containing a carbon (C) atom in one molecule, that is, a gas containing a plurality of hydrocarbon groups such as alkyl groups in one molecule. Specifically, as the organic hydrazine-based gas, it is preferable to use a gas containing three or two ligands (hydrocarbon groups such as alkyl groups) containing a carbon (C) atom in one molecule.

Figure 14A:
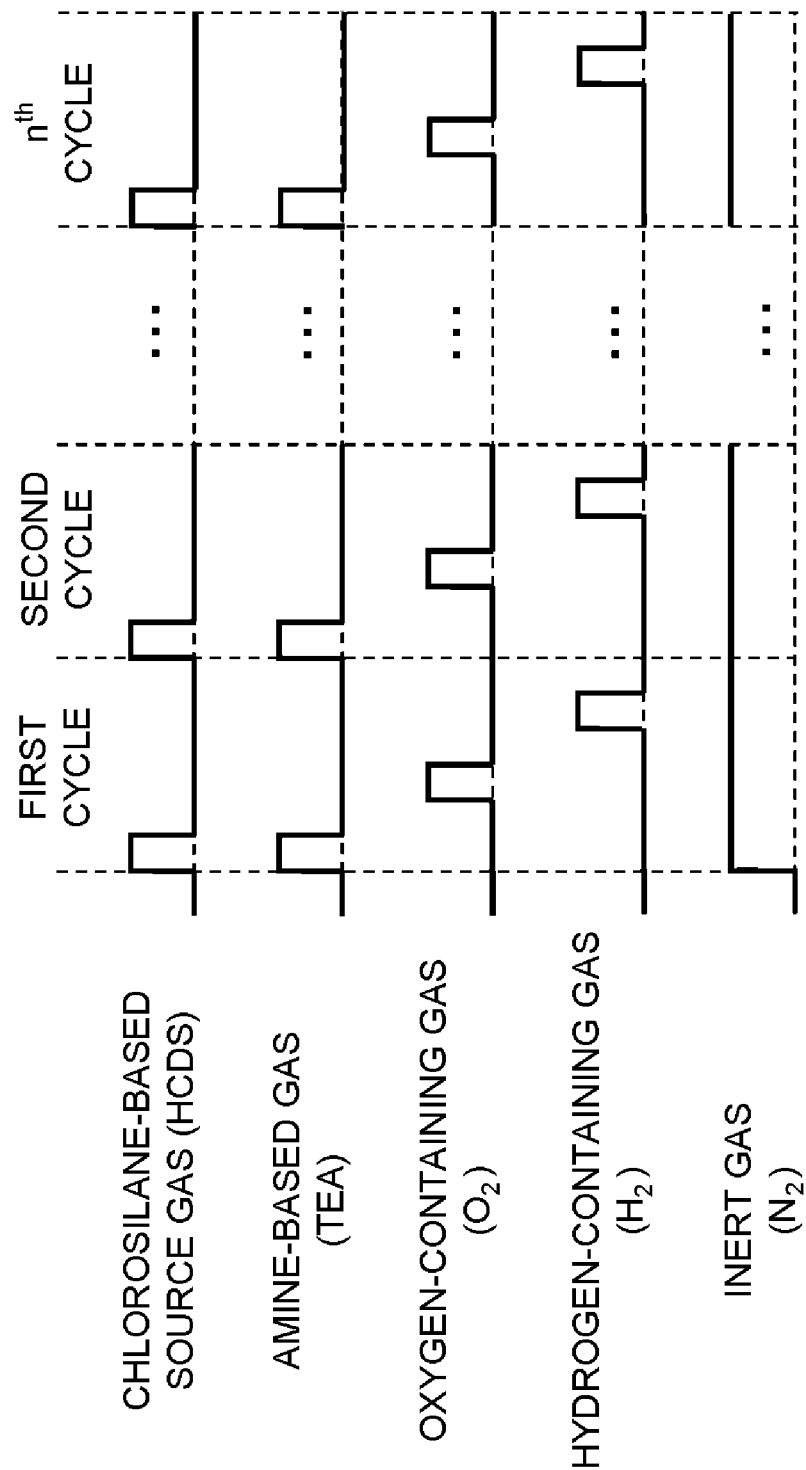

Furthermore, for example, although an example of supplying the fluorosilane-based source gas to the wafer 200 in the process chamber 201 and then supplying the amine-based gas when forming the first layer containing Si, N and C has been described in the above-mentioned embodiment, as in FIG. 14A, the fluorosilane-based source gas and the amine-based gas may be concurrently supplied to the wafer 200 in the process chamber 201 to generate a CVD reaction.

The sequences of FIGS. 14A and 14B are an example of forming a SiOCN film or a SiOC film of a predetermined composition and a predetermined film thickness by repeating a cycle, the cycle including: forming a first layer containing silicon, nitrogen and carbon on the wafer 200 by concurrently supplying a chlorosilane-based source gas (HCDS gas) and an amine-based gas (TEA gas) containing the three elements including carbon, nitrogen and hydrogen and having a composition wherein the number of carbon atoms is greater than that of nitrogen atoms in one molecule to the wafer 200 in the process chamber 201; modifying the first layer by supplying an oxygen-containing gas ($O_2$ gas) as the second reactive gas to the wafer 200 in the process chamber 201 to form a SiOCN layer or SiOC layer as the second layer; and modifying the surface of the second layer by supplying $H_2$ gas as a hydrogen-containing gas to the wafer 200 in the process chamber 201. Furthermore, FIG. 14A illustrates a case in which the HCDS gas and the TEA gas are concurrently supplied once in each cycle, and FIG. 14B illustrates a case in which the HCDS gas and the TEA gas are concurrently supplied a plurality of times (twice). Furthermore, the processing conditions of such a case may be the same as those of the above-mentioned embodiments.

In this manner, even when the chlorosilane-based source gas and the amine-based gas are concurrently supplied to the wafer 200 in the process chamber 201 rather than being sequentially supplied, the same effects as those of the above-mentioned embodiments can be obtained. However, as in the above-mentioned embodiments, when the chlorosilane-based source gas and the amine-based gas are alternately supplied and purging is performed in the process chamber 201 therebetween, it is possible to allow the chlorosilane-based source gas and the amine-based gas to suitably react with each other under conditions in which the surface reaction is dominant, and control characteristics of the film thickness can be improved.

Furthermore, although an example of supplying the chlorosilane-based source gas and the amine-based gas to the wafer 200 in the process chamber 201 when forming the first layer has been described in the above-mentioned embodiments, the first layer may be formed without supplying the amine-based gas as in FIGS. 15A to 15D.

Furthermore, the sequence of FIG. 15A is an example of forming a SiN film of a predetermined composition and a predetermined film thickness by alternately performing: forming a first layer containing silicon, nitrogen and carbon on the wafer 200 by alternately performing supplying a chlorosilane-based source gas (HCDS gas) to the wafer 200 in the process chamber 201, and supplying a nitrogen-containing gas ($NH_3$ gas) to the wafer 200 in the process chamber 201a predetermined number of times; and modifying the surface of the first layer by supplying $H_2$ gas as a hydrogen-containing gas to the wafer 200 in the process chamber 201. Furthermore, FIG. 15A illustrates a case of alternately supplying the HCDS gas and the $NH_3$ gas once in forming the first layer.

Figure 15B:
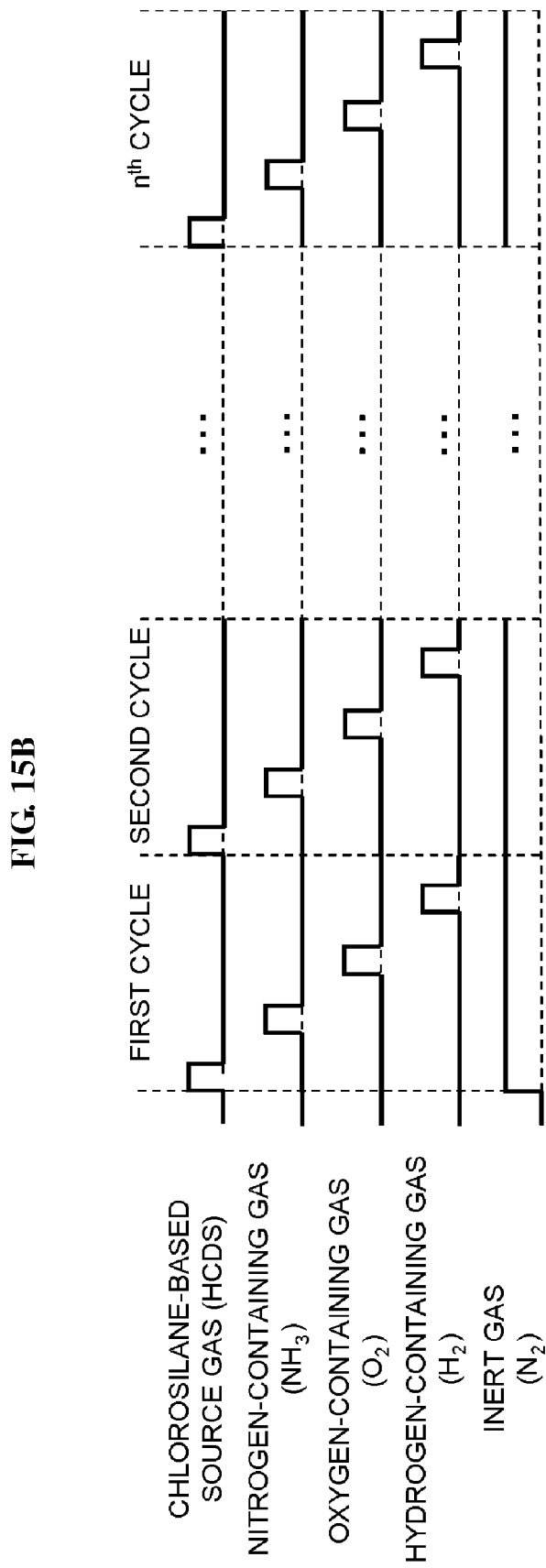

Furthermore, the sequence of FIG. 15B is an example of forming a SiON film of a predetermined composition and a predetermined film thickness by alternately performing: forming a first layer containing silicon, nitrogen and carbon on the wafer 200 by alternately performing supplying a chlorosilane-based source gas (HCDS gas) to the wafer 200 in the process chamber 201, and supplying a nitrogen-containing gas ($NH_3$ gas) to the wafer 200 in the process chamber 201a predetermined number of times; modifying the first layer by supplying the oxygen-containing gas ($O_2$ gas) to the wafer 200 in the process chamber 201 to form the SiON layer as the second layer; and modifying the surface of the second layer by supplying $H_2$ gas as the hydrogen-containing gas to the wafer 200 in the process chamber 201. Furthermore, FIG. 15B illustrates a case of alternately supplying the HCDS gas and the $NH_3$ gas once in forming the first layer.

Furthermore, the sequence of FIG. 15C is an example of forming a SiON film of a predetermined composition and a predetermined thickness formed of an alternating stack of a first layer and a second layer formed by alternately stacking the first layer and the second layer, by alternately performing forming the first layer containing silicon and oxygen on the wafer 200 by alternately performing supplying a chlorosilane-based source gas (the HCDS gas) to the wafer 200 in the process chamber 201, supplying an oxygen-containing gas ($O_2$ gas) to the wafer 200 in the process chamber 201 and supplying a hydrogen-containing gas ($H_2$ gas) to the wafer 200 in the process chamber 201a predetermined number of times; and forming a SiN layer as the second layer on the first layer by alternately performing supplying the chlorosilane-based source gas (the HCDS gas) to the wafer 200 in the process chamber 201, supplying a nitrogen-containing gas ($NH_3$ gas) to the wafer 200 in the process chamber 201 and supplying the hydrogen-containing gas ($H_2$ gas) to the wafer 200 in the process chamber 201a predetermined number of times. Furthermore, FIG. 15C illustrates a case of alternately supplying the HCDS gas, the $O_2$ gas and $H_2$ gas in forming the first layer, and supplying the HCDS gas, the $NH_3$ gas and $H_2$ gas once in forming the second layer.

Furthermore, the sequence of FIG. 15D is an example of forming a SiOCN film of a predetermined composition and a predetermined thickness formed by alternately performing forming the first layer containing silicon, carbon and oxygen on the wafer 200 by alternately performing supplying a chlorosilane-based source gas (the HCDS gas) to the wafer 200 in the process chamber 201, supplying a carbon-containing gas [propylene ($C_3H_6$) gas] to the wafer 200 in the process chamber 201 and supplying a nitrogen-containing gas ($NH_3$ gas) to the wafer 200 in the process chamber 201 a predetermined number of times; and forming a SiN layer as the second layer on the first layer by alternately modifying the first layer by supplying an oxygen-containing gas ($O_2$ gas) to the wafer 200 in the process chamber 201 to form the SiOCN layer as the second layer; and supplying $H_2$ gas as a hydrogen-containing gas to the wafer 200 in the process chamber 201 to modify the surface of the second layer a predetermined number of times. Furthermore, FIG. 15D illustrates a case of alternately supplying the HCDS gas, the $C_3H_6$ gas and the $NH_3$ gas once in forming the first layer.

It is possible to provide a forming technique of a device having a low leak current and excellent workability, using the silicon insulating film formed by the above-mentioned respective embodiment and respective modified examples as a sidewall spacer.

Furthermore, it is possible to provide a forming technique of a device having excellent workability, using the silicon insulating film formed by the above-mentioned respective embodiment and respective modified examples as a sidewall spacer.

According to the above-mentioned respective embodiments and respective modified examples, it is possible to form the silicon insulating film depending on an ideal stoichiometric ratio even in a low temperature area without using plasma. Furthermore, since the silicon insulating film can be formed without using plasma, for example, the present invention is able to be applied to a process such as an SADP film of DPT in which plasma damage is a concern.

Furthermore, although an example of forming the silicon-based insulating film (SiOCN film, the SiOC film, and SiCN film) containing silicon serving as a semiconductor element as an oxycarbonitride film, an oxycarbide film, and a carbonitride film has been described in the above-mentioned embodiments, for example, the present invention is able to be applied to a case of forming a metal-based thin film containing metal elements such as titanium (Ti), zirconium (Zr), hafnium (Hf), tantalum (Ta), aluminum (Al), and molybdenum (Mo).

That is, the present invention is also able to be preferably applied to a case of forming a metal oxycarbonitride film such as a titanium oxycarbonitride film (TiOCN film), a zirconium oxycarbonitride film (ZrOCN film), a hafnium oxycarbonitride film (HfOCN film), a tantalum oxycarbonitride film (TaOCN film), an aluminum oxycarbonitride film (AlOCN film), and a molybdenum oxycarbonitride film (MoOCN film).

Furthermore, for example, the present invention is also able to be preferably applied to a case of forming a metal oxycarbide film such as a titanium oxycarbide film (TiOC film), a zirconium oxycarbide film (ZrOC film), a hafnium oxycarbide film (HfOC film), a tantalum oxycarbide film (TaOC film), an aluminum oxycarbide film (AlOC film), and a molybdenum oxycarbide film (MoOC film).

Furthermore, for example, the present invention is also able to be preferably applied to a case of forming a metal carbonitride film such as a titanium carbonitride film (TiCN film), a zirconium carbonitride film (ZrCN film), a hafnium carbonitride film (HfCN film), a tantalum carbonitride film (TaCN film), an aluminum carbonitride film (AlCN film), and a molybdenum carbonitride film (MoCN film).

In this case, the film formation can be performed by the same sequence as the above-mentioned embodiments using the source gas containing the metal element and the halogen element instead of the chlorosilane-based source gas in the above-mentioned embodiments. That is, it is possible to form a metal-based thin film (a metal oxycarbonitride film, a metal oxycarbide film, and a metal carbonitride film) of a predetermined composition and a predetermined film thickness on the wafer 200 by repeating a cycle, the cycle including: forming a first layer containing a metal, nitrogen and carbon on the wafer 200 by alternately performing supplying a source gas containing metal atoms and halogen atoms to the wafer 200 in the process chamber 201, and supplying a first reactive gas containing the three elements including carbon, nitrogen and hydrogen and having a composition wherein the number of carbon atoms is greater than that of nitrogen atoms in one molecule to the wafer 200 in the process chamber 201 a predetermined number of times; and forming a second layer by modifying the first layer by supplying the source gas and the second reactive gas different from the first reactive gas to the wafer 200 to the wafer 200 in the process chamber 201 to modify the first layer.

For example, when forming the metal-based thin film (the TiOCN film, the TiOC film and the TiCN film) containing Ti, as the source gas, it is possible to use a gas containing Ti and a chloro group such as titanium tetrachloride ($TiCl_4$), and a gas containing Ti and a fluoro group such as titanium tetrafluororide ($TiF_4$). The same gases as those of the above-mentioned embodiments can be used as the first reactive gas, the second reactive gas, and the hydrogen-containing gas. Furthermore, the processing conditions may be the same as those of the above-mentioned embodiments.

Furthermore, for example, when forming the metal-based thin film (the ZrOCN film, the ZrOC film and the ZrCN film) containing Zr, as the source gas, it is possible to use a gas containing zirconium and a chloro group such as zirconium tetrachloride ($ZrCl_4$), and a gas containing Zr and a fluoro group such as zirconium tetrafluororide ($ZrF_4$). The same gases as those of the above-mentioned embodiments can be used as the first reactive gas, the second reactive gas, and the hydrogen-containing gas. Furthermore, the processing conditions may be the same as those of the above-mentioned embodiments.

Furthermore, for example, when forming the metal-based thin film (the HfOCN film, the HfOC film and the HfCN film) containing Hf, as the source gas, it is possible to use a gas containing Hf and a chloro group such as hafnium tetrachloride ($HfCl_4$), and a gas containing Hf and a fluoro group such as hafnium tetrafluororide ($HfF_4$). The same gases as those of the above-mentioned embodiments can be used as the first reactive gas, the second reactive gas, and the hydrogen-containing gas. Furthermore, the processing conditions may be the same as those of the above-mentioned embodiments.

Furthermore, for example, when forming the metal-based thin film (the TaOCN film, the TaOC film and the TaCN film) containing Ta, as the source gas, it is possible to use a gas containing Ta and a chloro group such as tantalum pentachloride ($TaCl_5$), and a gas containing Ta and a fluoro group such as tantalum pentafluoride ($TaF_5$). The same gases as those of the above-mentioned embodiments can be used as the first reactive gas, the second reactive gas, and the hydrogen-containing gas. Furthermore, the processing conditions may be the same as those of the above-mentioned embodiments.

Furthermore, for example, when forming the metal-based thin film (the AlOCN film, the AlOC film and the AlCN film) containing Al, as the source gas, it is possible to use a gas containing Al and a chloro group such as aluminum trichloride ($AlCl_3$), and a gas containing Al and a fluoro group such as aluminum trifluoride ($AlF_3$). The same gases as those of the above-mentioned embodiments can be used as the first reactive gas, the second reactive gas, and the hydrogen-containing gas. Furthermore, the processing conditions may be the same as those of the above-mentioned embodiments.

Furthermore, for example, when forming the metal-based thin film (the MoOCN film, the MoOC film and the MoCN film) containing Mo, as the source gas, it is possible to use a gas containing Mo and a chloro group such as molybdenum pentachloride ($MoCl_5$), and a gas containing Mo and a fluoro group such as molybdenum pentafluoride ($MoF_5$). The same gases as those of the above-mentioned embodiments can be used as the first reactive gas, the second reactive gas, and the hydrogen-containing gas. Furthermore, the processing conditions may be the same as those of the above-mentioned embodiments.

That is, the present invention is able to be preferably used when forming the thin film containing predetermined elements such as a semiconductor element and a metal element.

Furthermore, although an example of forming the thin film using a batch-type substrate processing apparatus processing a plurality of substrates at a time has been described in the above-mentioned embodiments, the present invention is not limited thereto but can also be preferably applied when forming the thin film using a single wafer processing type substrate processing apparatus processing one or a plurality of thin films at a time. Furthermore, although an example of forming the thin film using the substrate processing apparatus including a hot wall type processing furnace has been described in the above-mentioned embodiments, the present invention is not limited thereto but can also be preferably used when forming the thin film using the substrate processing apparatus including a cold wall type processing furnace.

Furthermore, the above-mentioned embodiments, modified examples, application examples or the like can be suitably combined and used.

Furthermore, for example, the present invention is realized by changing a process recipe of the conventional substrate processing apparatus. When the process recipe is changed, it is also possible to install the process recipe according to the present invention in the conventional substrate processing apparatus via a telecommunication line or a non-transitory computer-readable recording medium on which the process recipe is recorded, and change the process recipe itself into the process recipe according to the present invention by handling an input/output device of the conventional substrate processing apparatus.

Preferred Embodiments of Present Invention

Preferred embodiments of the present invention are hereinafter added.

Supplementary Note 1

According to one embodiment of the present invention, there is provided a method of manufacturing a semiconductor device, including:

forming a thin film containing a predetermined element on a substrate by repeating a cycle, the cycle including:

forming a first layer containing the predetermined element, nitrogen and carbon by alternately performing supplying a source gas containing the predetermined element and a halogen element to the substrate and supplying a first reactive gas containing three elements including the carbon, the nitrogen and hydrogen and having a composition wherein a number of carbon atoms is greater than that of nitrogen atoms to the substrate a predetermined number of times;

forming a second layer by supplying a second reactive gas different from the source gas and the first reactive gas to the substrate to modify the first layer; and modifying a surface of the second layer by supplying a hydrogen-containing gas to the substrate.

Herein, when the process of supplying one of the source gas and the first reactive gas and the process of supplying the other of the source gas and the first reactive gas are set to one set, the expression "alternately performing supplying the source gas and supplying the first reactive gas a predetermined number of times" may mean that the set is performed once or that the set is repeated several times. That is, the expression means that the set is performed one or more times (a predetermined number of times).

Furthermore, when the process of forming the first layer, the processing of forming the second layer, and the process of modifying the surface of the second layer are set to one cycle, the expression "repeating the cycle including forming the first layer, forming the second layer, and modifying the surface of the second surface" means that the cycle is repeated a predetermined number of times. That is, the expression means that the cycle is performed twice or more times (a plurality of times).

Furthermore, herein, similar expressions as described above are used with similar meanings as described above.

Supplementary Note 2

In the method of manufacturing a semiconductor device according to Supplementary Note 1, it is preferable that the first reactive gas contains a plurality of ligands containing the carbon atoms.

Supplementary Note 3

In the method of manufacturing a semiconductor device according to Supplementary Note 1 or 2, it is preferable that the first reactive gas contains three ligands containing the carbon atoms.

Supplementary Note 4

In the method of manufacturing a semiconductor device according to Supplementary Note 1 or 2, it is preferable that the first reactive gas contains two ligands containing the carbon atoms.

Supplementary Note 5

In the method of manufacturing a semiconductor device according to any one of Supplementary Notes 1 to 4, it is preferable that the first reactive gas includes at least one of amine and organic hydrazine.

Supplementary Note 6

In the method of manufacturing a semiconductor device according to any one of Supplementary Notes 1 to 4, it is preferable that the first reactive gas includes at least one amine selected from a group consisting of ethylamine, methylamine, propylamine, isopropylamine, butylamine, and isobutylamine.

Supplementary Note 7

In the method of manufacturing a semiconductor device according to Supplementary Note 1 or 2, it is preferable that the first reactive gas includes at least one amine selected from a group consisting of triethylamine, diethylamine, trimethylamine, dimethylamine, tripropylamine, dipropylamine, triisopropylamine, diisopropylamine, tributylamine, dibutylamine, triisobutylamine, and diisobutylamine.

Supplementary Note 8

In the method of manufacturing a semiconductor device according to Supplementary Note 1 or 2, it is preferable that the first reactive gas includes at least one amine selected from a group consisting of diethylamine, dimethylamine, dipropylamine, diisopropylamine, dibutylamine, and diisobutylamine.

Supplementary Note 9

In the method of manufacturing a semiconductor device according to any one of Supplementary Notes 1 to 8, it is preferable that the first reactive gas is a silicon-free gas.

Supplementary Note 10

In the method of manufacturing a semiconductor device according to any one of Supplementary Notes 1 to 8, it is preferable that the first reactive gas is a silicon-free and metal-free gas.

Supplementary Note 11

In the method of manufacturing a semiconductor device according to any one of Supplementary Notes 1 to 10, it is preferable that the predetermined element includes silicon or a metal, and the halogen element includes chlorine or fluorine.

Supplementary Note 12

In the method of manufacturing a semiconductor device according to any one of Supplementary Notes 1 to 11, it is preferable that the forming of the first layer includes forming the first layer on the substrate while discharging the halogen element contained in the source gas and the hydrogen contained in the first reactive gas as a gas.

Supplementary Note 13

In the method of manufacturing a semiconductor device according to any one of Supplementary Notes 1 to 12, it is preferable that the supplying of the source gas includes forming an initial layer containing the predetermined element and the halogen element, and the supplying of the first reactive gas includes forming the first layer by reacting the initial layer with the first reactive gas.

Supplementary Note 14

In the method of manufacturing a semiconductor device according to Supplementary Note 13, it is preferable that the supplying of the first reactive gas includes separating at least a part of a ligand or ligands contained in the first reactive gas from the first reactive gas while drawing at least a part of atoms of the halogen element contained in the initial layer from the initial layer by reacting the initial layer with the first reactive gas.

Supplementary Note 15

In the method of manufacturing a semiconductor device according to Supplementary Note 13 or 14, it is preferable that the supplying of the first reactive gas includes combining the nitrogen of the first reactive gas having at least a part of a ligand or ligands being separated therefrom with the predetermined element contained in the initial layer by separating at least the part of the ligand or the ligands contained in the first reactive gas from the first reactive gas while drawing at least a part of atoms of the halogen element contained in the initial layer from the initial layer by reacting the initial layer with the first reactive gas.

Supplementary Note 16

In the method of manufacturing a semiconductor device according to any one of Supplementary Notes 13 to 15, it is preferable that the supplying of the first reactive gas includes: combining the nitrogen of the first reactive gas having at least a part of a ligand or ligands being separated therefrom with the predetermined element contained in the initial layer; and combining the carbon contained in the ligand or the ligands with the predetermined element contained in the initial layer by separating at least a part of the ligand or the ligands contained in the first reactive gas from the first reactive gas while drawing at least a part of atoms of the halogen element contained in the initial layer from the initial layer by reacting the initial layer with the first reactive gas.

Supplementary Note 17

In the method of manufacturing a semiconductor device according to any one of Supplementary Notes 1 to 16, it is preferable that the forming of the thin film is performed with the substrate being accommodated in a process chamber, and an inner pressure of the process chamber when the first reactive gas is supplied is set to be higher than that of the process chamber when the second reactive gas is supplied, and an inner pressure of the process chamber when the second reactive gas is supplied is set to be higher than that of the process chamber when the source gas is supplied.

Supplementary Note 18

In the method of manufacturing a semiconductor device according to any one of Supplementary Notes 1 to 17, it is preferable that the forming of the second layer includes forming a layer containing the predetermined element, oxygen, carbon and nitrogen (an oxycarbonitride layer containing the predetermined element), or a layer containing the predetermined element, oxygen and carbon (an oxycarbide layer containing the predetermined element) as the second layer by supplying an oxygen-containing gas as the second reactive gas to the substrate, and the forming of the thin film includes forming a film containing the predetermined element, oxygen, carbon and nitrogen (an oxycarbonitride film containing the predetermined element), or a film containing the predetermined element, the oxygen and the carbon (an oxycarbide film containing the predetermined element) as the thin film.

Supplementary Note 19

In the method of manufacturing a semiconductor device according to any one of Supplementary Notes 1 to 17, it is preferable that the forming of the second layer includes forming a layer containing the predetermined element, carbon and nitrogen (a carbonitride layer containing the predetermined element) as the second layer by supplying a nitrogen-containing gas as the second reactive gas to the substrate, and the forming of the thin film includes forming a film containing the predetermined element, carbon and nitrogen (a carbonitride film containing the predetermined element) as the thin film.

Supplementary Note 20

In the method of manufacturing a semiconductor device according to any one of Supplementary Notes 1 to 17, it is preferable that the forming of the second layer includes a layer containing the predetermined element, oxygen, carbon and nitrogen (an oxycarbonitride layer containing the predetermined element) as the second layer by supplying a nitrogen-containing gas and an oxygen-containing gas as the second reactive gas to the substrate, and the forming of the thin film includes forming a film (an oxycarbonitride film containing the predetermined element) containing the predetermined element, the oxygen, the carbon and the nitrogen as the thin film.

Supplementary Note 21

In the method of manufacturing a semiconductor device according to any one of Supplementary Notes 1 to 17, it is preferable that the forming of the second layer includes forming a layer containing the predetermined element, oxygen, carbon and nitrogen (an oxycarbonitride layer containing the predetermined element) as the second layer by supplying a nitrogen-containing gas as the second reactive gas to the substrate and then supplying an oxygen-containing gas as the second reactive gas to the substrate, and the forming of the thin film includes forming a film containing the predetermined element, the oxygen, the carbon and the nitrogen (an oxycarbonitride film containing the predetermined element) as the thin film.

Supplementary Note 22

According to another embodiment of the present invention, there is provided a method of manufacturing a semiconductor device including:

forming a film containing a predetermined element, nitrogen and carbon on a substrate by repeating a cycle, the cycle including:

forming a layer containing the predetermined element, nitrogen and carbon by alternately performing supplying a source gas containing the predetermined element and a halogen element to the substrate and supplying a reactive gas containing the three elements including the carbon, the nitrogen and hydrogen and having a composition wherein the number of carbon atoms is greater than that of nitrogen atoms in one molecule to the substrate a predetermined number of times; and modifying a surface of the layer by supplying a hydrogen-containing gas to the substrate.

Supplementary Note 23

According to still another embodiment of the present invention, there is provided a method of manufacturing a semiconductor device including:

forming a thin film containing a predetermined element on a substrate by repeating a cycle, the cycle including:

forming a first layer containing the predetermined element, nitrogen and carbon by supplying a source gas containing the predetermined element and a halogen element, and a first reactive gas containing the three elements including the carbon, the nitrogen and hydrogen and having a composition wherein the number of carbon atoms is greater than that of nitrogen atoms in one molecule to the substrate;

forming a second layer by supplying a second reactive gas different from the source gas and the first reactive gas to the substrate to modify the first layer; and modifying a surface of the second layer by supplying a hydrogen-containing gas to the substrate.

Supplementary Note 24

According to yet another embodiment of the present invention, there is provided a method of processing a substrate, including:

forming a thin film containing a predetermined element on a substrate by repeating a cycle, the cycle including:

forming a first layer containing the predetermined element, nitrogen and carbon by alternately performing supplying a source gas containing the predetermined element and a halogen element to the substrate and supplying a first reactive gas containing three elements including the carbon, the nitrogen and hydrogen and having a composition wherein a number of carbon atoms is greater than that of nitrogen atoms to the substrate a predetermined number of times;

forming a second layer by supplying a second reactive gas different from the source gas and the first reactive gas to the substrate to modify the first layer; and modifying a surface of the second layer by supplying a hydrogen-containing gas to the substrate.

Supplementary Note 25

According to yet another embodiment of the present invention, there is provided a substrate processing apparatus including:

a process chamber configured to accommodate a substrate;

a source gas supply system configured to supply a source gas containing a predetermined element and a halogen element into the process chamber;

a first reactive gas supply system configured to supply a first reactive gas containing three elements including carbon, nitrogen and hydrogen and having a composition wherein a number of carbon atoms is greater than that of nitrogen atoms into the process chamber;

a second reactive gas supply system configured to supply a second reactive gas different from the source gas and the first reactive gas into the process chamber;

a hydrogen-containing gas supply system configured to supply a hydrogen-containing gas into the process chamber; and a control unit configured to control the source gas supply system, the first reactive gas supply system, the second reactive gas supply system and the hydrogen-containing gas supply system so as to form a thin film containing the predetermined element on the substrate, by repeating a cycle, the cycle including: forming a first layer containing the predetermined element, the nitrogen and the carbon by alternately performing supplying the source gas to the substrate in the process chamber and supplying the first reactive gas to the substrate in the process chamber a predetermined number of times; forming a second layer by supplying the second reactive gas to the substrate in the process chamber to modify the first layer; and modifying a surface of the second layer by supplying the hydrogen-containing gas to the substrate in the process chamber.

Supplementary Note 26

According to yet another embodiment of the present invention, there is provided a program that causes a computer to perform a process of forming a thin film containing a predetermined element on a substrate in a process chamber by repeating a cycle, the cycle including:

a process of forming a first layer containing the predetermined element, nitrogen and carbon by alternately performing supplying a source gas containing the predetermined element and a halogen element to the substrate in the process chamber and supplying a first reactive gas containing three elements including the carbon, the nitrogen and hydrogen and having a composition wherein a number of carbon atoms is greater than that of nitrogen atoms to the substrate in the process chamber a predetermined number of times;

a process of forming a second layer by supplying a second reactive gas different from the source gas and the first reactive gas to the substrate in the process chamber to modify the first layer; and a process of modifying a surface of the second layer by supplying a hydrogen-containing gas to the substrate in the process chamber.

Supplementary Note 27

According to yet another embodiment of the present invention, there is provided a non-transitory computer-readable recording medium storing a program that causes a computer to perform a process of forming a thin film containing a predetermined element on a substrate in a process chamber by repeating a cycle, the cycle including:

a process of forming a first layer containing the predetermined element, nitrogen and carbon by alternately performing supplying a source gas containing the predetermined element and a halogen element to the substrate in the process chamber and supplying a first reactive gas containing three elements including the carbon, the nitrogen and hydrogen and having a composition wherein a number of carbon atoms is greater than that of nitrogen atoms to the substrate in the process chamber a predetermined number of times;

a process of forming a second layer by supplying a second reactive gas different from the source gas and the first reactive gas to the substrate in the process chamber to modify the first layer; and a process of modifying a surface of the second layer by supplying a hydrogen-containing gas to the substrate in the process chamber.

What is claimed is:

1. A method of manufacturing a semiconductor device, comprising:
   forming a thin film containing a predetermined element on a substrate by repeating a cycle under non-plasma atmosphere in a process chamber containing the substrate, the cycle comprising:
   forming a first layer containing the predetermined element, nitrogen and carbon by alternately performing a predetermined number of times:
      supplying a source gas containing the predetermined element and a halogen element to the substrate; and
      supplying a first reactive gas containing three elements including the carbon, the nitrogen and hydrogen and having a composition wherein a number of carbon atoms is greater than that of nitrogen atoms to the substrate;
   forming a second layer by supplying a second reactive gas different from the source gas and the first reactive gas to the substrate to modify the first layer; and
   modifying a surface of the second layer by supplying a hydrogen-containing gas to the substrate,
   wherein the source gas, the first reactive gas, the second reactive gas and the hydrogen-containing gas are substantially excluded from simultaneous occupation of the process chamber.

2. The method according to claim 1, wherein the first reactive gas contains a plurality of ligands containing the carbon atoms.

3. The method according to claim 1, wherein the first reactive gas comprises at least one selected from the group consisting of amine and organic hydrazine.

4. The method according to claim 1, wherein the first reactive gas is a silicon-free and metal-free gas.

5. The method according to claim 1, wherein the predetermined element comprises silicon or a metal, and the halogen element comprises chlorine or fluorine.

6. The method according to claim 1, wherein the forming of the first layer comprises forming the first layer on the substrate while discharging the halogen element contained in the source gas and the hydrogen contained in the first reactive gas as a gas.

7. The method according to claim 1, wherein the supplying of the source gas comprises forming an initial layer containing the predetermined element and the halogen element, and
   the supplying of the first reactive gas comprises forming the first layer by reacting the initial layer with the first reactive gas.

8. The method according to claim 7, wherein the supplying of the first reactive gas comprises separating at least a part of a ligand or ligands contained in the first reactive gas from the first reactive gas while drawing at least a part of atoms of the halogen element contained in the initial layer from the initial layer by reacting the initial layer with the first reactive gas.

9. The method according to claim 7, wherein the supplying of the first reactive gas comprises combining the nitrogen of the first reactive gas having at least a part of a ligand or ligands being separated therefrom with the predetermined element contained in the initial layer by separating at least the part of the ligand or the ligands contained in the first reactive gas from the first reactive gas while drawing at least a part of atoms of the halogen element contained in the initial layer from the initial layer by reacting the initial layer with the first reactive gas.

10. The method according to claim 7, wherein the supplying of the first reactive gas comprises: combining the nitrogen of the first reactive gas having at least a part of a ligand or ligands being separated therefrom with the predetermined element contained in the initial layer; and combining the carbon contained in the ligand or the ligands with the predetermined element contained in the initial layer by separating at least a part of the ligand or the ligands contained in the first reactive gas from the first reactive gas while drawing at least a part of atoms of the halogen element contained in the initial layer from the initial layer by reacting the initial layer with the first reactive gas.

11. The method according to claim 1, wherein the forming of the thin film is performed with the substrate being accommodated in a process chamber, and
an inner pressure of the process chamber when the first reactive gas is supplied is set to be higher than that of the process chamber when the second reactive gas is supplied, and an inner pressure of the process chamber when the second reactive gas is supplied is set to be higher than that of the process chamber when the source gas is supplied.

12. The method according to claim 1, wherein the first reactive gas is thermally activated under non-plasma atmosphere and supplied to the substrate, and the second reactive gas is thermally activated under non-plasma atmosphere and supplied to the substrate.

13. The method according to claim 1, wherein forming the second layer comprises modifying the first layer under a condition where a modifying reaction of the first layer by the second reactive gas not saturated.

14. The method according to claim 1, wherein the surface of the second layer is modified to have more OH groups than before being modified.

15. The method according to claim 1, wherein the surface of the second layer is modified to have more adsorption sites than before being modified.

16. The method according to claim 1, wherein an inner pressure of the process chamber when the first reactive gas is supplied is higher than those of the process chamber when the source gas is supplied and the second reactive gas is supplied.

17. The method according to claim 1, wherein the first reactive gas comprises an organic hydrazine.

18. The method according to claim 1, wherein the second reactive gas comprises an oxygen-containing gas, and the thin film comprises SiOC film.

19. A method of processing a substrate, comprising:
forming a thin film containing a predetermined element on a substrate by repeating a cycle under non-plasma atmosphere in a process chamber containing the substrate, the cycle comprising:
forming a first layer containing the predetermined element, nitrogen and carbon by alternately performing a predetermined number of times:
supplying a source gas containing the predetermined element and a halogen element to the substrate; and
supplying a first reactive gas containing three elements including the carbon, the nitrogen and hydrogen and having a composition wherein a number of carbon atoms is greater than that of nitrogen atoms to the substrate;
forming a second layer by supplying a second reactive gas different from the source gas and the first reactive gas to the substrate to modify the first layer; and
modifying a surface of the second layer by supplying a hydrogen-containing gas to the substrate,
wherein the source gas, the first reactive gas, the second reactive gas and the hydrogen-containing gas are substantially excluded from simultaneous occupation of the process chamber.

20. A method of manufacturing a semiconductor device, comprising:
forming a thin film containing a predetermined element on a substrate by repeating a cycle under non-plasma atmosphere in a process chamber containing the substrate, the cycle comprising:
forming a first layer containing the predetermined element, nitrogen and carbon by alternately performing a predetermined number of times:
supplying a source gas containing the predetermined element and a halogen element to the substrate; and
supplying a first reactive gas including an amine or an organic hydrazine to the substrate;
forming a second layer by supplying a second reactive gas including an oxygen-containing gas to the substrate to modify the first layer; and
modifying a surface of the second layer by supplying a hydrogen-containing gas to the substrate,
wherein the source gas, the first reactive gas, the second reactive gas and the hydrogen-containing gas are substantially excluded from simultaneous occupation of the process chamber.

* * * * *